United States Patent
Kawakami et al.

(10) Patent No.: US 9,815,997 B2
(45) Date of Patent: Nov. 14, 2017

(54) ORGANIC ELECTROLUMINESCENCE DEVICE AND INK COMPOSITION

(71) Applicant: Idemitsu Kosan Co., Ltd., Chiyoda-ku, Tokyo (JP)

(72) Inventors: Hironori Kawakami, Sodegaura (JP); Shigeru Matsuo, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 284 days.

(21) Appl. No.: 14/679,589

(22) Filed: Apr. 6, 2015

(65) Prior Publication Data

US 2015/0284580 A1 Oct. 8, 2015

(30) Foreign Application Priority Data

Apr. 8, 2014 (JP) ................................. 2014-079583
Apr. 1, 2015 (JP) ................................. 2015-075350

(51) Int. Cl.

| | | |
|---|---|---|
| *C09D 11/52* | (2014.01) | |
| *H01L 51/00* | (2006.01) | |
| *C09D 11/102* | (2014.01) | |
| *C09D 171/12* | (2006.01) | |
| *C08G 65/48* | (2006.01) | |
| *H01L 51/50* | (2006.01) | |

(52) U.S. Cl.
CPC ............ *C09D 11/52* (2013.01); *C08G 65/485* (2013.01); *C09D 11/102* (2013.01); *C09D 171/12* (2013.01); *H01L 51/0035* (2013.01); *H01L 51/0067* (2013.01); *H01L 51/0072* (2013.01); *H01L 51/0003* (2013.01); *H01L 51/0005* (2013.01); *H01L 51/5012* (2013.01)

(58) Field of Classification Search
CPC .... C09D 11/52; C09D 11/102; C09D 171/12; C08G 65/485; H01L 51/0035; H01L 51/0067; H01L 51/0072; H01L 51/0003; H01L 51/0005; H01L 51/5012

See application file for complete search history.

(56) References Cited

U.S. PATENT DOCUMENTS

| | | | |
|---|---|---|---|
| 4,808,672 A | | 2/1989 | Hathaway et al. |
| 5,304,600 A | * | 4/1994 | Nelissen et al. ...... C08F 283/08 521/81 |
| 2004/0056255 A1 | | 3/2004 | Robeson et al. |
| 2005/0070037 A1 | | 3/2005 | Robeson et al. |
| 2007/0249087 A1 | * | 10/2007 | Zhu et al. ............ B82Y 10/00 438/99 |
| 2011/0180907 A1 | * | 7/2011 | McConnell ......... H01L 51/0012 257/618 |

FOREIGN PATENT DOCUMENTS

| | | |
|---|---|---|
| JP | H01-144415 A | 6/1989 |
| JP | 02-294327 A | 12/1990 |
| JP | 2004-152746 A | 5/2004 |

* cited by examiner

*Primary Examiner* — Nathan M Nutter
(74) *Attorney, Agent, or Firm* — Foley & Lardner LLP

(57) ABSTRACT

An organic electroluminescence device including: an anode and a cathode; and at least one organic thin film layer between the anode and the cathode, wherein one of the organic thin film layer(s) comprises a polymer represented by the following formula (1).

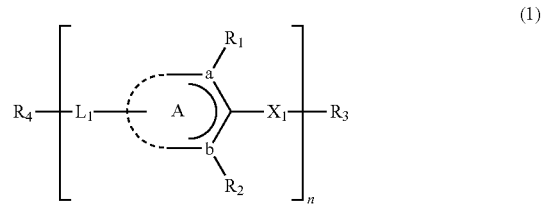

18 Claims, No Drawings

ORGANIC ELECTROLUMINESCENCE DEVICE AND INK COMPOSITION

TECHNICAL FIELD

The invention relates to an organic electroluminescence device, an apparatus using the same and an ink composition.

BACKGROUND ART

An organic electroluminescence (EL) device is a self-emitting device utilizing a principle that a fluorescent substance emits light by recombination energy of holes injected from an anode and electrons injected from a cathode by application of an electrical field.

An organic EL device has a stacked structure that comprises an anode and a cathode, and between the anode and the cathode, organic layers that include a hole-injecting layer, a hole-transporting layer, an electron-injecting layer and an electron-transporting layer, in addition to an emitting layer.

RELATED ART DOCUMENTS

Patent Documents

Patent Document 1: JP-A-2004-152746
Patent Document 2: JP-A-H01-144415
Patent Document 3: JP-A-H02-294327

SUMMARY OF THE INVENTION

An object of the invention is to provide an organic EL device that can be driven at a low voltage and has a long life.

Another object of the invention is to provide a novel ink composition.

As a result of extensive studies, the inventors have found that hydroxyl groups remain in the polyphenylene oxide disclosed in Patent Document 1 since the polyphenylene oxide is not subjected to a terminal modification, and hence the hydroxyl groups deteriorate organic EL properties. The inventors have further found device properties can be improved by conducting a terminal modification of the polyphenylene oxide. The invention has been completed based on this finding.

According to one embodiment of the invention, the following organic EL device is provided.

An organic electroluminescence device comprising:
an anode and a cathode; and
at least one organic thin film layer between the anode and the cathode,
wherein one of the organic thin film layer(s) comprises a polymer represented by the following formula (1):

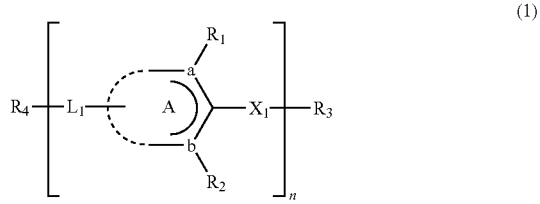
(1)

wherein in the formula (1),
a and b are independently a carbon atom, a nitrogen atom, an oxygen atom or a sulfur atom, and when a and b are independently a nitrogen atom, an oxygen atom or a sulfur atom, $R_1$ and $R_2$ are not present;

$R_1$ and $R_2$ are independently a hydrogen atom, an alkyl group including 1 to 8 carbon atoms, a cycloalkyl group including 5 to 6 carbon atoms, an alkoxy group including 1 to 8 carbon atoms, an aryl group including 6 to 10 carbon atoms that form a ring (hereinafter referred to as "ring carbon atoms"), an aryloxy group including 6 to 10 ring carbon atoms, a fluorine atom, a chlorine atom, an alkoxyalkyl group including 2 to 16 carbon atoms, a substituted or unsubstituted amino group or a substituted or unsubstituted mercapto group;

$R_1$ and $R_2$ may independently be bonded to another atom to form a ring or may be bonded to each other to form a ring;

ring A is an aromatic hydrocarbon ring or an aromatic heterocyclic ring;

$X_1$ is —O— or —S—;

$R_3$ is a substituent;

$R_4$ is a hydrogen atom or a substituent;

n is a repeating number;

$L_1$ is a single bond or a group represented by the following formula (2) or the following formula (3);

(2)

wherein in the formula (2), $L_{11}$ is an alkylene group including 1 to 8 carbon atoms; $L_{12}$ is a single bond, —O— or —S— and $L_{13}$ is a single bond or an alkylene group including 1 to 8 carbon atoms; and $L_{11}$ is bonded to $R_4$ and $L_{13}$ is bonded to the ring A;

(3)

wherein in the formula (3), $L_{14}$ is a single bond or an alkylene group including 1 to 8 carbon atoms; $L_{15}$ is a single bond, —O— or —S—, B is a substituted or unsubstituted aromatic hydrocarbon ring or a substituted or unsubstituted aromatic heterocyclic ring; $L_{16}$ is a single bond, —O— or —S—, and $L_{14}$ is bonded to $R_4$ and $L_{16}$ is bonded to the ring A.

According to another embodiment of the invention, provided is an ink composition comprising a polymer represented by the above formula (1) and an organic semiconductor material.

According to still another embodiment of the invention, provided is a method for producing an organic semiconductor device wherein at least one layer of an organic semiconductor device is produced by a wet method by using the ink composition mentioned above.

According to further embodiment of the invention, provided is a display apparatus that is provided with the organic electroluminescence device.

According to the invention, an organic EL device that can be driven at a lower voltage and has a long life can be provided.

According to the invention, a novel ink composition can be provided.

Mode for Carrying Out the Invention

The organic EL device of the invention comprise at least one organic thin film layer between an anode and a cathode, wherein one of the organic thin film layer(s) comprises a polymer represented by the following formula (1):

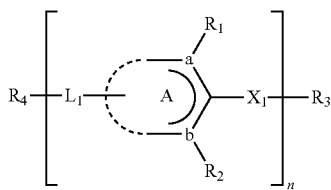

(1)

wherein in the formula (1), a and b are independently a carbon atom, a nitrogen atom, an oxygen atom or a sulfur atom, and when a and b are independently a nitrogen atom, an oxygen atom or a sulfur atom, $R_1$ and $R_2$ are not present. It is preferred that a and b be both carbon atoms.

$R_1$ and $R_2$ are independently a hydrogen atom, an alkyl group including 1 to 8 carbon atoms, a cycloalkyl group including 5 to 6 carbon atoms, an alkoxy group including 1 to 8 carbon atoms, an aryl group including 6 to 10 ring carbon atoms, an aryloxy group including 6 to 10 ring carbon atoms, a fluorine atom, a chlorine atom, an alkoxyalkyl group including 2 to 16 carbon atoms, a substituted or unsubstituted amino group or a substituted or unsubstituted mercapto group.

$R_1$ and $R_2$ may be the same or different, but it is preferred that they be the same substituents.

As the alkyl group, a methyl group, an ethyl group, a propyl group, an isopropyl group, a butyl group, a hexyl group, an octyl group or the like can be given.

As the cycloalkyl group, a cyclohexyl group, a cyclopentyl group or the like can be given.

As the alkoxy group, a methoxy group, an ethoxy group, a propoxy group or the like can be given.

As the aryl group, a phenyl group, a naphthyl group or the like can be given.

As the aryloxy group, a phenoxy group or the like can be given.

As the alkoxyaryl group, a methoxymethyl group, an ethoxymethyl group or the like can be given.

The substituted amino group or the substituted mercapto group may be either mono-substituted or di-substituted. The number of carbon atoms is 1 to 20, for example. As the substituent, an alkyl group including 1 to 8 carbon atoms, an aryl group including 6 to 10 ring carbon atoms, an alkylaryl group including 7 to 30 carbon atoms can be given.

Specific examples of the alkyl group and the aryl group are the same as mentioned above.

As the alkylaryl group, a methylphenyl group or the like can be given.

As the substituted or unsubstituted amino group, a dimethylamino group, a diethylamino group, a methylethylamino group, a diphenylamino group or the like can be given.

As the substituted or unsubstituted mercapto group, a methylmercapto group, an ethylmercapto group, a propylmercapto group or the like can be given.

It is preferred that $R_1$ and $R_2$ be independently an alkyl group including 1 to 8 carbon atoms, an alkoxy group including 1 to 8 carbon atoms or an aryl group including 6 to 10 ring carbon atoms. More preferably, $R_1$ and $R_2$ are independently a methyl group, a methoxy group or a phenyl group.

$R_1$ and $R_2$ may independently be bonded to another atom to form a ring or may be bonded to each other to form a ring.

The ring that includes at least one of $R_1$ and $R_2$ as a part of the ring is preferably a saturated or unsaturated hydrocarbon ring. The ring may be an aromatic ring.

The ring that includes at least one of $R_1$ and $R_2$ as a part thereof forms a fused ring together with the ring A. The fused ring is preferably a fused ring formed by fusion of 6-membered rings or a fused ring formed by fusion of a 6-membered ring and a 5-membered ring.

The number of carbon atoms that form the fused ring is 10 to 20, for example, and is preferably 10 to 18. The number of atoms that form the fused ring is 10 to 20, for example, and is preferably 10 to 18. As a hetero atom contained in the fused ring, one or more, preferably 1 to 3, and more preferably 1 or 2 atom(s) selected from a nitrogen atom, an oxygen atom and a sulfur atom can be given, for example.

The fused ring is naphthalene, anthracene, tetrahydronaphthlene or the like, for example.

The ring A is an aromatic hydrocarbon ring or an aromatic heterocyclic ring.

$X_1$ is —O— or —S—, with —O— being preferable.

$R_3$ is a substituent.

$R_4$ is a hydrogen atom or a substituent.

As each of $R_3$ and $R_4$, an alkyl group including 1 to 8 carbon atoms, a substituted or unsubstituted alkoxy group including 1 to 8 carbon atoms, a substituted or unsubstituted alkylcarbonyl group including 1 to 8 carbon atoms, a substituted or unsubstituted aryl group including 6 to 10 carbon atoms, a substituted or unsubstituted aryloxy group including 6 to 10 carbon atoms, a substituted or unsubstituted arylcarbonyl group including 6 to 10 carbon atoms, a substituted or unsubstituted aralkyl group including 7 to 20 carbon atoms or the like can be given. Preferably, $R_3$ and $R_4$ are independently a substituted or unsubstituted aryl group including 6 to 10 carbon atoms or a substituted or unsubstituted arylcarbonyl group including 6 to 10 carbon atoms.

Specific examples of the alkyl group, the alkoxy group, the aryl group and the aryloxy group are the same as those mentioned above.

Specific examples of the alkyl group of the alkylcarbonyl group are the same as those mentioned above, and as the alkylcarbonyl group, an acetyl group or the like can be given.

Specific examples of the aryl group of the arylcarbonyl group are the same as those mentioned above, and as the arylcarbonyl group, a benzoyl group or the like can be given.

Specific examples of the alkyl group and the aryl group of the aralkyl group are the same as those mentioned above, and as the aralkyl group, a benzyl group or the like can be given.

n is the repeating number. n is normally 10 to 3000.

$L_1$ is a single bond or a group represented by the following formula (2) or the following formula (3);

$$-L_{11}-L_{12}-L_{13}- \quad (2)$$

wherein in the formula (2), $L_{11}$ is an alkylene group including 1 to 8 carbon atoms; $L_{12}$ is a single bond, —O— or —S— and $L_{13}$ is a single bond or an alkylene group including 1 to 8 carbon atoms; and $L_{11}$ is bonded to $R_4$ and $L_{13}$ is bonded to the ring A;

$$-L_{14}-L_{13}-B-L_{16}- \quad (3)$$

wherein in the formula (3), $L_{14}$ is a single bond or an alkylene group including 1 to 8 carbon atoms; $L_{15}$ is a single bond, —O— or —S—, B is a substituted or unsubstituted aromatic hydrocarbon ring or a substituted or unsubstituted aromatic heterocyclic ring; $L_{16}$ is a single bond, —O— or —S—, and $L_{14}$ is bonded to $R_4$ and $L_{16}$ is bonded to the ring A.

The ring A or B may be either a monocyclic ring or a fused ring.

The number of ring carbon atoms that form the aromatic hydrocarbon ring of the ring A or B is 6 to 20, for example, and is preferably 6 to 18.

The number of ring atoms the aromatic heterocyclic ring is 5 to 20, for example, and is preferably 5 to 10.

As the hetero atom of the aromatic heterocyclic ring of the ring A or B, one or more, preferably 1 to 3, and more preferably 1 or 2 atoms selected from a nitrogen atom, an oxygen atom and a sulfur atom can be given, for example.

The ring A or B is preferably a 6-membered ring, a 5-membered ring or a fused ring formed by fusion of 6-membered rings or a fused ring formed by fusion of a 6-membered ring and a 5-membered ring.

As preferable examples of the ring A, a benzene ring, a naphthalene ring, an anthracene ring, a tetrahydronaphthalene ring, a pyridine ring or the like can be given.

As preferable example of the ring B, a benzene ring, a naphthalene ring, an anthracene ring, a tetrahydronaphthalene ring, a pyridine ring or the like can be given.

The polymer represented by the formula (1) may be a polymer represented by the following formula (2), (3) or (4).

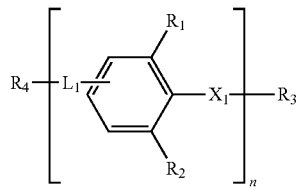
(2)

wherein in the formula (2), $R_1$ to $R_4$, $L_1$, $X_1$ and n are as defined for $R_1$ to $R_4$, $L_1$, $X_1$ and n in the formula (1).

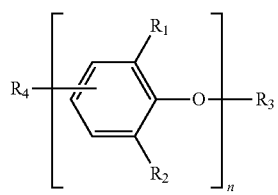
(3)

wherein in the formula (3), $R_1$ to $R_4$ and n are as defined for $R_1$ to $R_4$ and n in the formula (1).

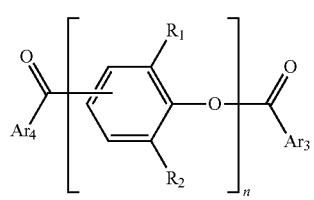
(4)

wherein in the formula (4), $R_1$, $R_2$ and n are as defined for $R_1$, $R_2$ and n in the formula (1); and $Ar_3$ and $Ar_4$ are independently an aryl group including 6 to 10 ring carbon atoms. Specific examples of the aryl group are the same as those mentioned above.

The polymer represented by the formula (1) includes a repeating structure represented by the following formula (10):

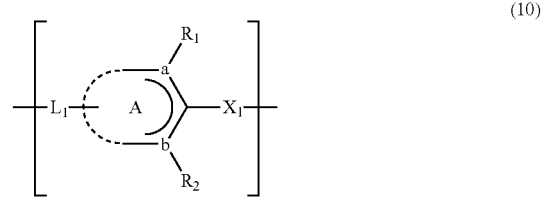
(10)

wherein in the formula, a, b, $R_1$, $R_2$, A, $X_1$ and $L_1$ are independently the same as a, b, $R_1$, $R_2$, A, $X_1$ and $L_1$ in the formula (1).

Specific examples of the repeating structure of the formula (10) in which the ring A is an aromatic hydrocarbon ring are shown below.

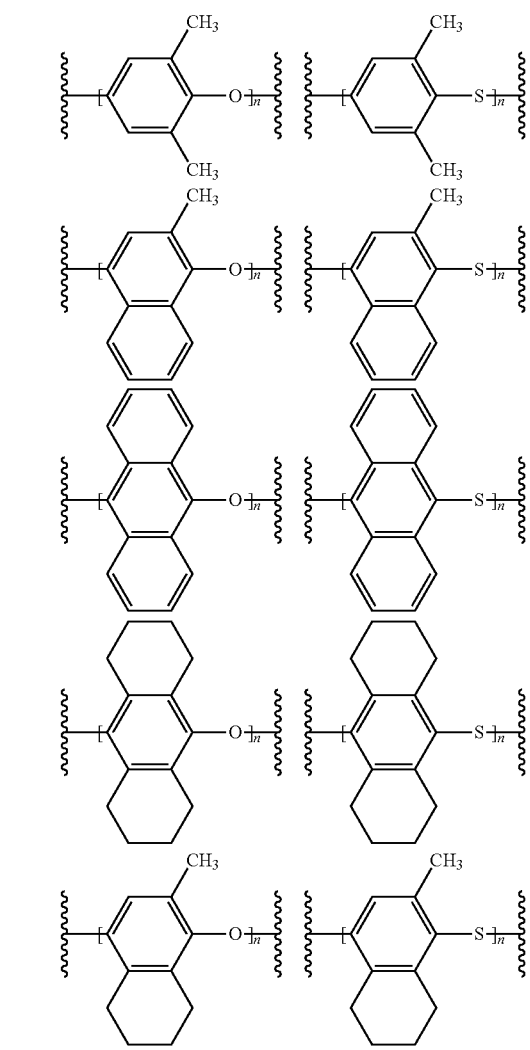

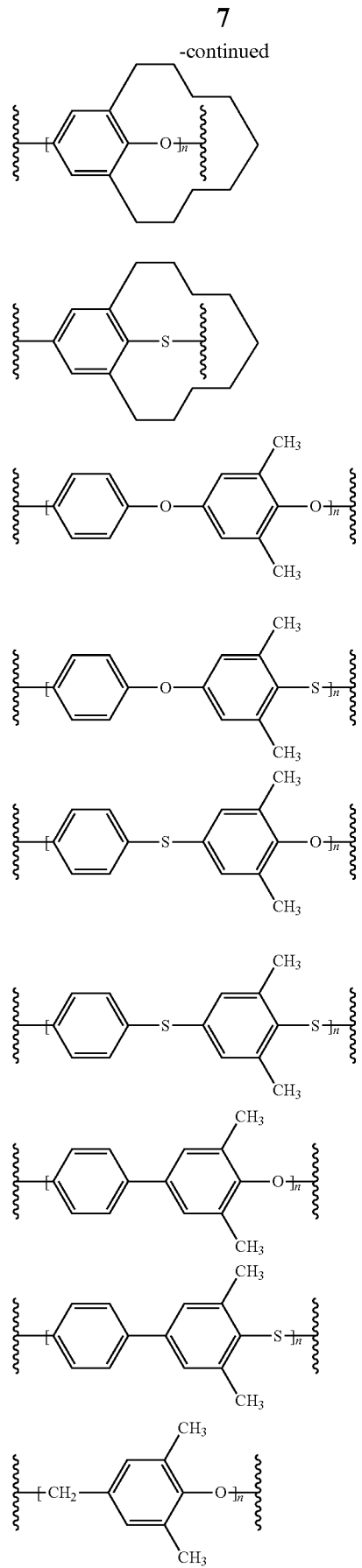
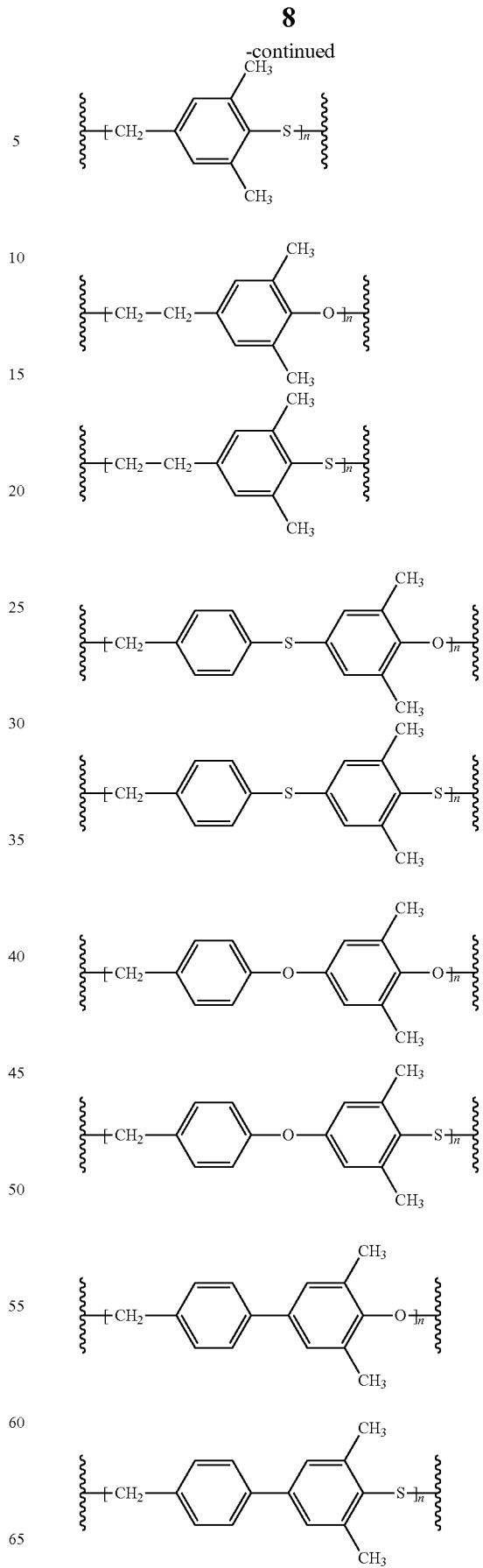

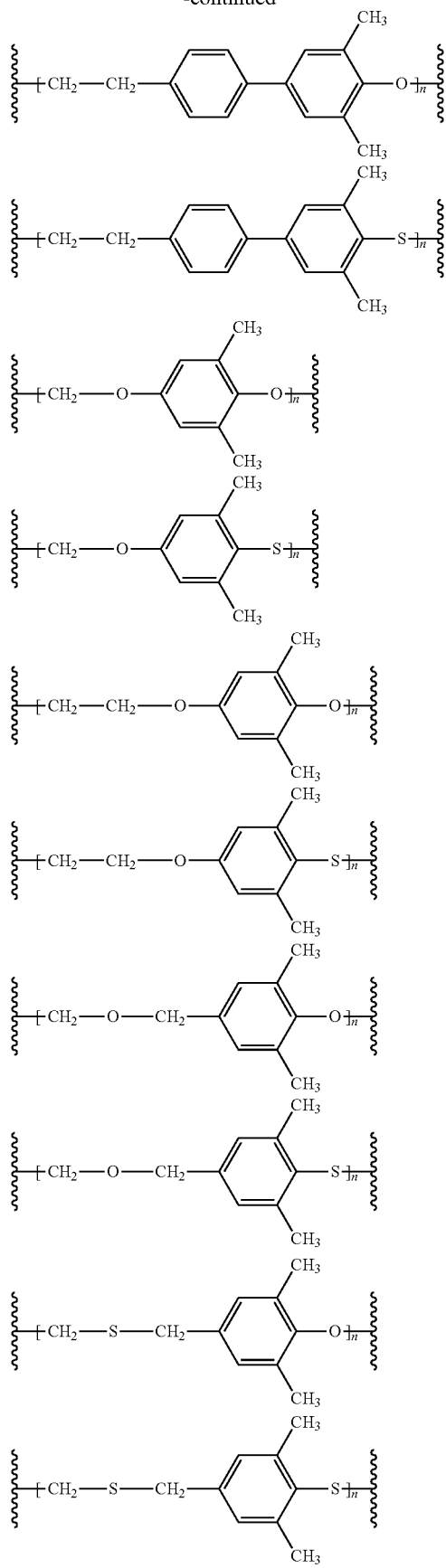
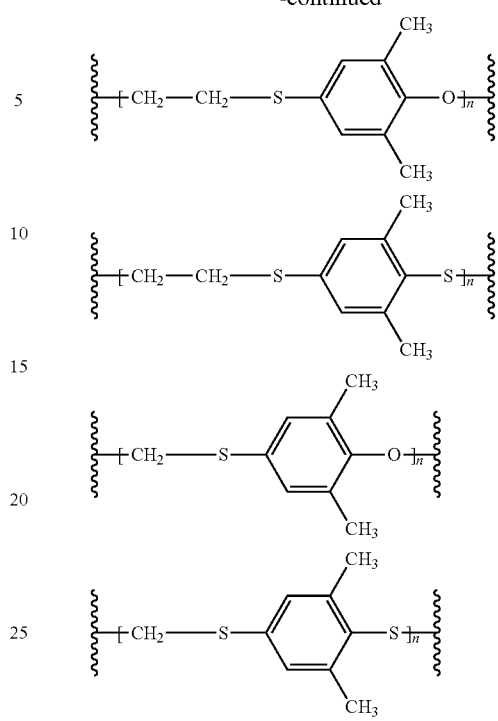
wherein n is a repeating number.
As specific examples of the repeating structure of the formula (10) in which the ring A is an aromatic heterocyclic ring, the following can be given.
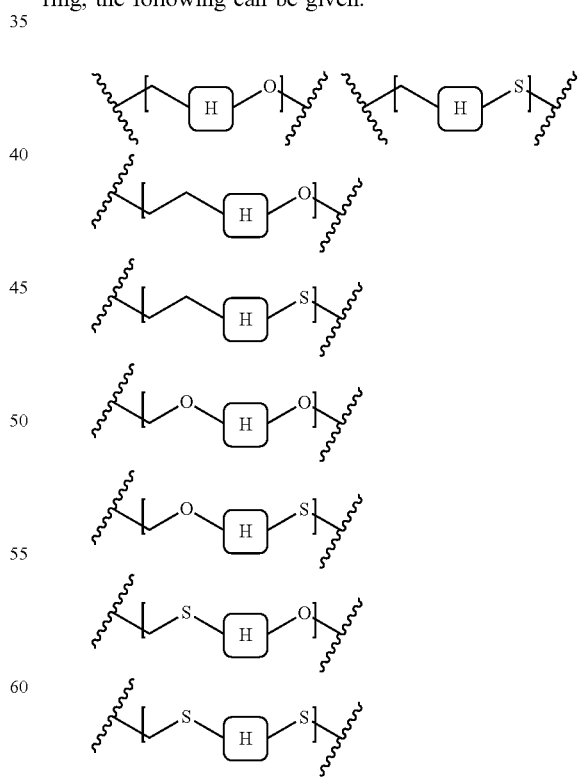
As examples of H in the above-mentioned structure, the following can be exemplified.

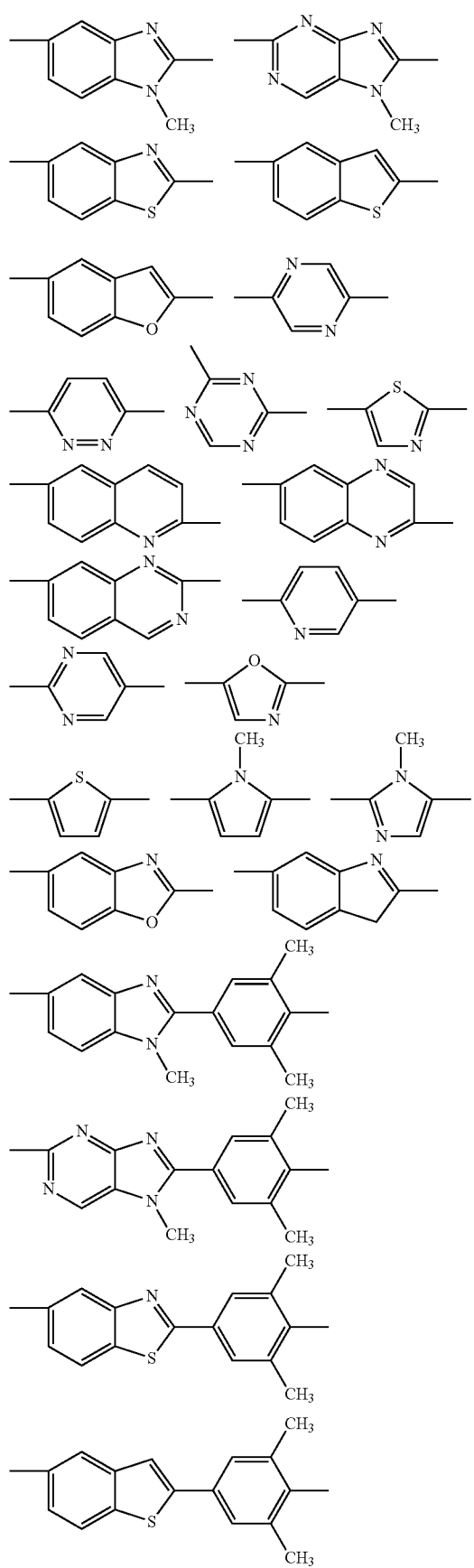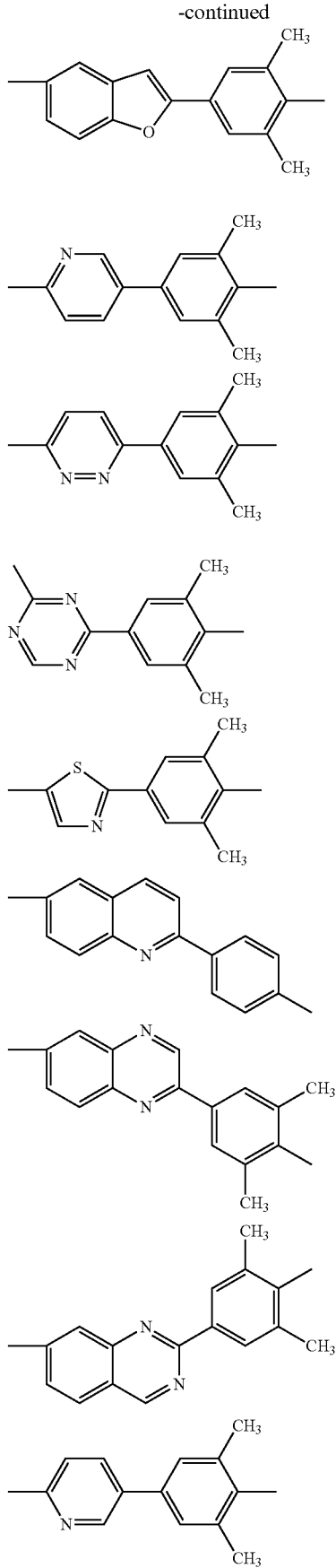

-continued

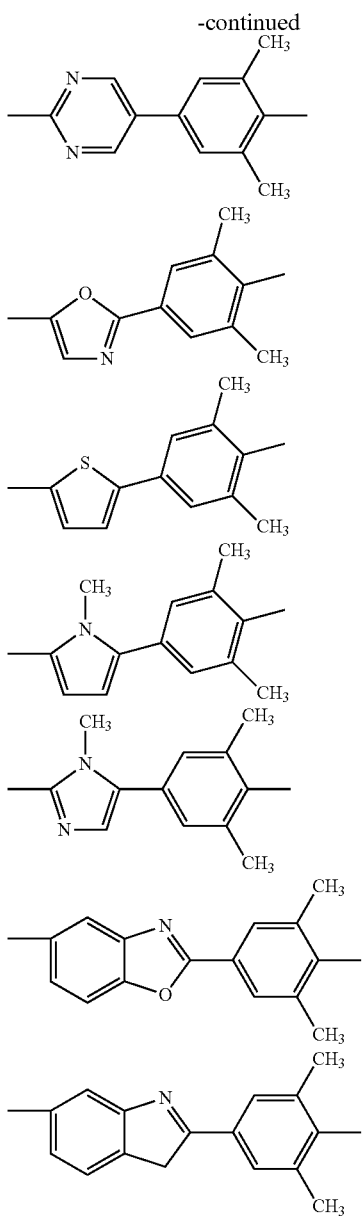

In the polymer, at least one terminal or both terminals thereof are capped. The polymer may be branched. The branched polymer can be produced by adding a branched monomer at the time of polymerization.

In the above, an arbitrary substituent in the "substituted or unsubstituted" is selected from the group consisting of an alkyl group including 1 to 8 carbon atoms; a fluoroalkyl group including 1 to 8 carbon atoms, a cycloalkyl group including 3 to 8 ring carbon atoms; an aryl group including 6 to 20 ring carbon atoms; an aralkyl group including 2 to 28 carbon atoms and having an aryl group including 6 to 20 ring carbon atoms; an amino group; a mono- or dialkylamino group having an alkyl group including 1 to 8 carbon atoms; a mono- or diarylamino group having an aryl group including 6 to 20 ring carbon atoms; an alkoxy group having an alkyl group including 1 to 8 carbon atoms; a fluoroalkoxy group having an alkyl group including 1 to 8 carbon atoms; an aryloxy group having an aryl group including 6 to 20 ring carbon atoms; a mono-, di- or tri-substituted silyl group having a group selected from an alkyl group including 1 to 8 carbon atoms and an aryl group including 6 to 20 ring carbon atoms; a heteroaryl group including 5 to 20 atoms that form a ring (hereinafter referred to as "ring atoms") and 1 to 5 (preferably 1 to 3, more preferably 1 to 2) hetero atom(s) (a nitrogen atom, an oxygen atom, a sulfur atom); a halogen atom (a fluorine atom, a chlorine atom, a bromine atom, an iodine atom); a cyano group; and a nitro group.

Specific examples of the alkyl group, the cycloalkyl group, the alkoxy group, the aryl group, the aralkyl group, the mono- or dialkylamino group, the mono- or diarylamino group and the aryloxy group are the same as those mentioned above. The alkyl group of the fluoroalkyl group, the alkoxy group of the fluoroalkoxy group and the alkyl group and the aryl group as the substituent of the substituted silyl group are the same as mentioned above.

As the heteroaryl group, a pyrrolyl group, a triazinyl group, a pyrazinyl group, a pyrimidinyl group, a pyridinyl group, an indolyl group, isoindolyl group, an imidazolyl group, a furyl group, a benzofuranyl group, an isobenzofuranyl group, a dibenzofuranyl group, a dibenzothiophenyl group, a quinolyl group, an isoquinolyl group, a quinoxalinyl group, a carbazolyl group, a phenanthridinyl group, an acridinyl group, a phenanthrolinyl group, a phenazinyl group, a phenothiazinyl group, a phenoxazinyl group, an oxazolyl group, an oxadiazolyl group, a furazanyl group, a thienyl group, a benzothiophenyl group or the like can be given, for example.

The "carbazolyl group" mentioned above includes the following structures.

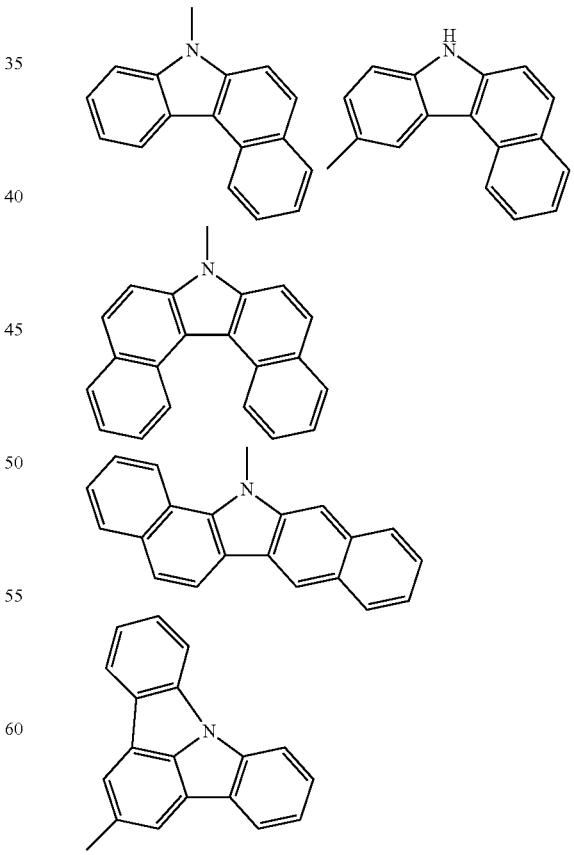

The heteroaryl group mentioned above includes the following structures.

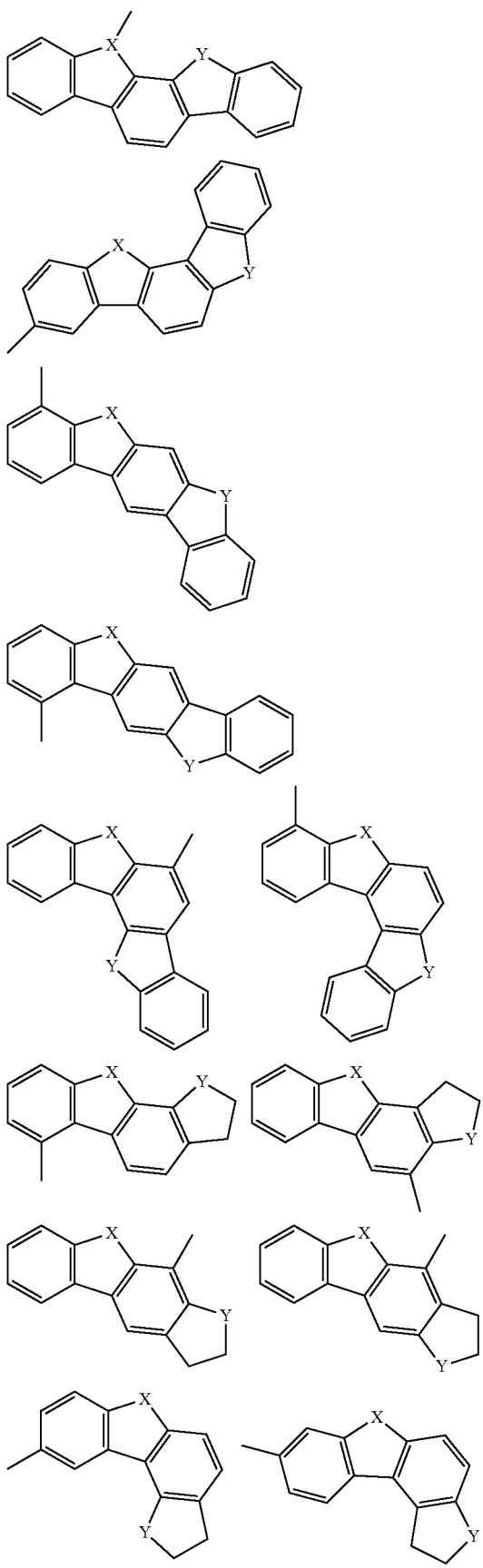
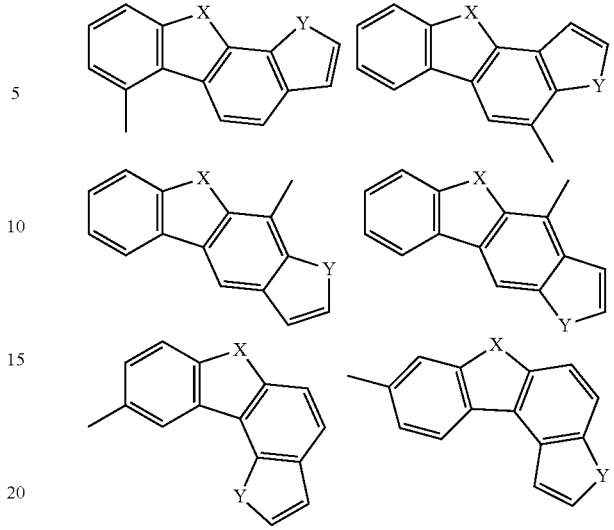

wherein in the formula, X and Y are independently an oxygen atom, a sulfur atom, a nitrogen atom or a —NH— group.

These substituents may further be substituted by the above-mentioned substituents. Further, a plurality of these substituents may be bonded to each other to form a ring.

In the present specification, the hydrogen atom includes isomers differing in number of neutrons, i.e. protium, deuterium and tritium.

In the present specification, the ring carbon atoms mean, in a compound having a structure in which atoms are bonded in a ring-like form (for example, a monocyclic compound, a fused ring compound, a cross-linking compound, a carbocyclic compound or a heterocyclic compound), the number of carbon atoms among the atoms that constitute the ring itself. When the ring is substituted by a substituent, the carbon contained in the substituent is not included in the ring carbon atoms. The same is applied to the "ring carbon atoms" mentioned below, unless otherwise indicated. For example, the benzene ring includes 6 ring carbon atoms, the naphthalene ring includes 10 ring carbon atoms, the pyridinyl group includes 5 ring carbon atoms and the furanyl group includes 4 ring carbon atoms. If the benzene ring or the naphthalene ring is substituted by an alkyl group as a substituent, for example, the number of carbon atoms of the alkyl group is not included in the ring carbon atoms. Further, if a fluorene ring is bonded to a fluorine ring as a substituent, for example (including a spirofluorene ring), the number of carbon atoms of the fluorene ring as a substituent is not included in the ring carbon atoms.

In the present specification, the ring atoms mean, in a compound (for example, a monocyclic compound, a fused ring compound, a cross-linking compound, a carbocyclic compound or a heterocyclic compound) having a structure in which atoms are bonded in a ring-like form (for example, a monocyclic ring, a fused ring or a ring assembly), the number of atoms that constitute the ring itself. Atoms that do not constitute a ring (for example, hydrogen atoms bonding atoms that constitute the ring) or atoms contained in a substituent when the ring is substituted by the substituent are not included in the ring atoms. The same is applied to the "ring atoms" mentioned below, unless otherwise indicated. For example, a pyridine ring has 6 ring atoms, a quinazoline ring has 10 ring atoms and a furan ring has 5 ring atoms.

Hydrogen atoms that are respectively bonded to the carbon atoms of the pyridine ring or the quinazoline ring or atoms that constitute the substituent are not included in ring atoms. Further, if a fluorene ring is bonded to a fluorene ring as a substituent (including a spirofluorene ring), the number of atoms of the fluorene ring as a substituent is not included in ring atoms.

In the specification, the "XX to YY carbon atoms" in the "substituted or unsubstituted ZZ group including XX to YY carbon atoms" indicates the number of carbon atoms when the ZZ group is unsubstituted, and does not include the number of carbon atoms of a substituent when the ZZ group is substituted. Here, the "YY" is larger than "XX", and the "XX" and "YY" independently mean an integer of 1 or more.

In the present specification, the "XX to YY ring atoms" in the "substituted or unsubstituted ZZ group including XX to YY ring atoms" indicates the number of atoms when the ZZ group is unsubstituted, and does not include the number of atoms of a substituent when the ZZ group is substituted. Here, the "YY" is larger than "XX", and the "XX" and "YY" independently mean an integer of 1 or more.

The "unsubstituted" in the "substituted or unsubstituted" means that a group is not substituted by the substituent mentioned above and a hydrogen atom is bonded.

The terminal modification of the polyphenylene oxide can be conducted by a normal method. For example, when the terminal is capped with benzoyl, the terminal modification can be conducted as follows:

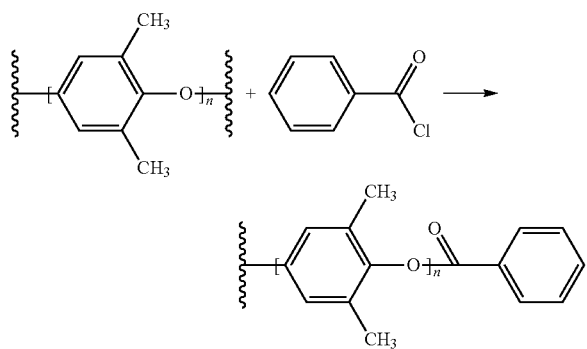

In addition to the above-mentioned reaction, a terminal modification can be conducted by a known alternative reaction or known materials that are suited to an intended product.

The organic EL device can contain known layers such as an emitting layer, a hole-transporting layer, a hole-injecting layer, an electron-transporting layer, an electron-injecting layer, a hole barrier layer and an insulating layer, as the organic thin film layers between an anode and a cathode. A preferred layer structure is, not limited to, a hole-injecting layer, a hole-transporting layer, an emitting layer, an electron-transporting layer and an electron-injecting layer being stacked from an anode to a cathode.

According to the present invention, at least one layer of the organic thin film layers can contain the polymer of the above formula (1). Preferably an emitting layer contains the polymer. The at least one layer contains generally 1 to 80 wt %, for example 3 wt % or more and less than 20 wt % (or 18 wt % or less), preferably 5 to 60 wt % of the polymer.

Low molecular weight components in the high molecular weight materials used in an emitting layer of organic EL devices are preferably eliminated. Appl. Phys. Lett., Vol. 76, No. 18 (2000) shows that if low molecular weight components contained in the materials diffuse in an emitting layer, the performance thereof change.

The same applies to the polymer used in the present invention. Low molecular weight components therein are preferably eliminated. In particular, it is preferred that low molecular weight components with a weight average molecular weight of less than 10,000 in terms of polystyrene be 10% or less of the total weight of polymer with a weight average molecular weight of 10,000 or more and less than 1,000,000.

Methods of eliminating the low molecular weight components include a washing processing with a solvent suitable for eliminating the components, and a reprecipitation processing with a suitable combination of a good solvent and a poor solvent for the polymer used in the present invention.

Solvents for the washing processing include alcohol solvents such as methanol, ethanol, propanol, butanol and cyclohexanol; aliphatic solvents such as hexane and cyclohexane; ester solvents such as ethyl acetate, butyl acetate and PGMEA; ketone solvents such as acetone, methyl ethyl ketone, methyl isobutyl ketone, diethyl ketone, cyclopentanone, cyclohexanone and methyl cyclohexanone; aromatic solvents such as benzene, toluene, diethyl benzene, xylene and anisole; amide solvents such as dimethylformamide, dimethylacetoamide, diethylformamide, diethylacetoamide, N-methylpyrolidone, N-ethylpyrolidone, N,N-dimethylmethoxypropionamide, N,N-dimethylethoxypropionamide, N,N-dimethylpropoxypropionamide and N,N-dimethylbutoxypropionamide; and halogen-containing solvents such as chlorobenzene, methylene chloride, chloroform and carbon tetrachloride.

In particular, when a polymer having a molecular weight range (for example, a weight average molecular weight of 10,000 to 1,000,000) suitable for the organic EL device properties is used as a main component among the polymers used in the present invention, a processing with acetone, methyl ethyl ketone or methyl isobutyl ketone is preferred.

Good solvents for the reprecipitation processing include benzene, toluene, diethyl benzene, xylene, anisole, dimethylformamide, dimethylacetamide, diethylformamide, diethylacetoamide, N-methylpyrolidone, N-ethylpyrolidone, N,N-dimethylmethoxypropionamide, N,N-dimethylethoxypropionamide, N,N-dimethylpropoxypropionamide, N,N-dimethylbutoxypropionamide, chlorobenzene, methylene chloride, chloroform and carbon tetrachloride.

Poor solvents include methanol, ethanol, propanol, butanol, cyclohexanol, hexane, cyclohexane, ethyl acetate, butyl acetate, PGMEA, acetone, methyl ethyl ketone, methyl isobutyl ketone, diethyl ketone, cyclopentanone, cyclohexanone and methyl cyclohexanone.

A combination of a good solvent and a poor solvent can be used by selecting a suitable good solvent and a suitable poor solvent from the above solvents. It is preferred that benzene, toluene, methylene chloride or chloroform be used as a good solvent, and methanol, acetone or methyl ethyl ketone be used as a poor solvent. Acetone or methyl ethyl ketone is preferred as a poor solvent.

Layers other than an emitting layer forming organic EL devices will be described below. It should be noted that layers and materials forming organic EL devices are not limited to those described below.

(Substrate)

A substrate is used as a supporting body of an emitting device. For example, substrates formed from glass, quarts or plastic can be used. Flexible substrates may also be used. The flexible substrates are ones that can be bent and plastic substrates formed from polycarbonate and polyvinylchloride can be given as examples thereof.

(Anode)

For an anode formed on a substrate, there can be preferably used metals, alloys, electric conductive compounds and mixtures thereof with a large work function, specifically 4.0 eV or more, for example. Specific examples thereof include indium oxide-tin oxide (ITO: Indium Tin Oxide), indium oxide-tin oxide containing silicon or silicon oxide, indium oxide-zinc oxide, tungsten oxide, indium oxide containing zinc oxide and graphene. Other examples include gold (Au), platinum (Pt), and nitrides of metallic materials such as titanium nitride.

(Hole-Injecting Layer)

A hole-injecting layer is a layer containing a substance with a high hole-injecting property. As the substance with a high hole-injecting property, molybdenum oxide, titanium oxide, vanadium oxide, rhenium oxide, ruthenium oxide, chrome oxide, zirconium oxide, hafnium oxide, tantalum oxide, silver oxide, tungsten oxide, manganese oxide, aromatic amine compounds, and high molecular weight compounds such oligomers, dendrimers and polymers can be used.

(Hole-Transporting Layer)

A hole-transporting layer is a layer containing a substance with a high hole-transporting property. Aromatic amine compounds, carbazole derivatives, anthracene derivatives and the like can be used in a hole-transporting layer. High molecular weight compounds such poly(N-vinylcarbazole) (PVK) and poly(4-vinyltriphenylamine) (PVTPA) can also be used. Other substances of which the hole-transporting property is higher than the electron-transporting property can also be used. A layer containing a substance with a high hole-transporting property may be of a mono-layer structure or a multi-layer structure of two or more layers each formed thereof.

(Host Material of Emitting Layer)

An emitting layer may be formed such that the above high luminous substance (guest material) is dispersed in another substance (host material). Various substances may be used as the substance in which a high luminous substance is dispersed and substances with a higher lowest unoccupied orbital level (LUMO level) and a lower highest occupied orbital level (HOMO level) than those of the high luminous substance are preferably used.

The substances in which a high luminous substance is dispersed (host material) include metal complexes such as aluminum complexes, beryllium complexes and zinc complexes; heterocyclic compounds such as oxadiazole derivatives, benzimidazole derivatives and phenanthroline derivatives; fused aromatic compounds such as carbazole derivatives, anthracene derivatives, phenantholene derivatives, pyrene derivatives and chrysene derivatives; and aromatic amine compounds such as triarylamine derivatives and fused multi-ring aromatic amine derivatives.

Examples of the host material are shown below.

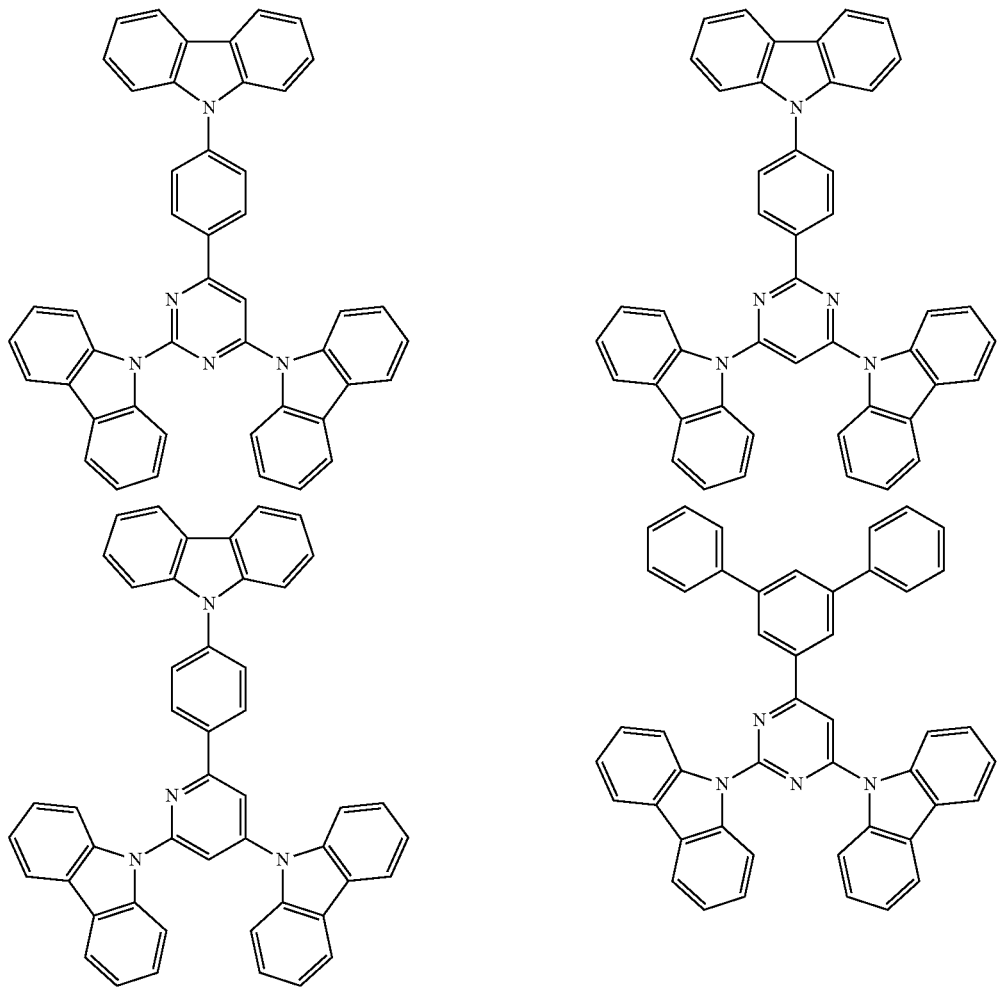

-continued
21
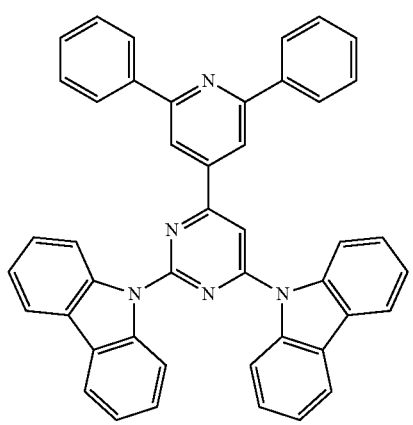
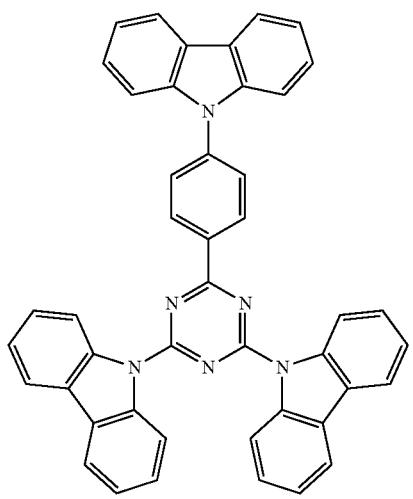
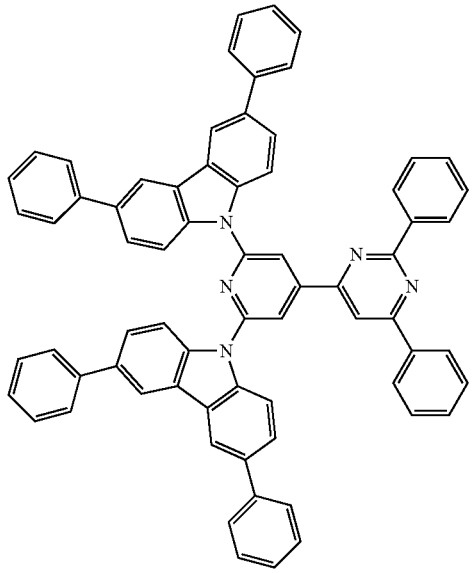
22
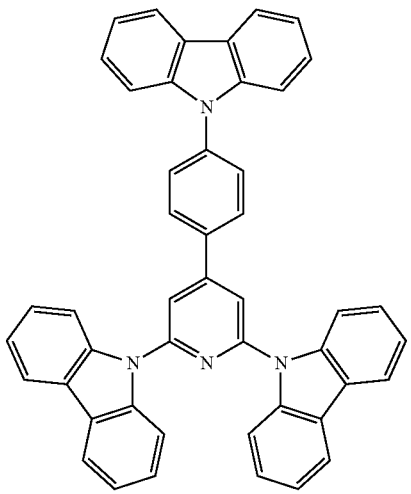
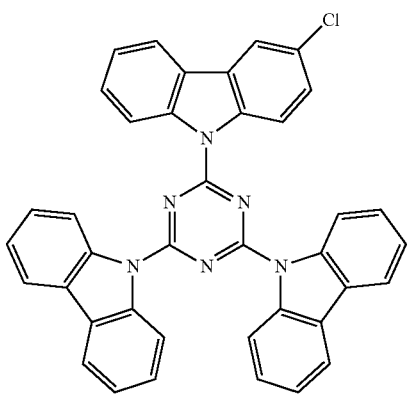
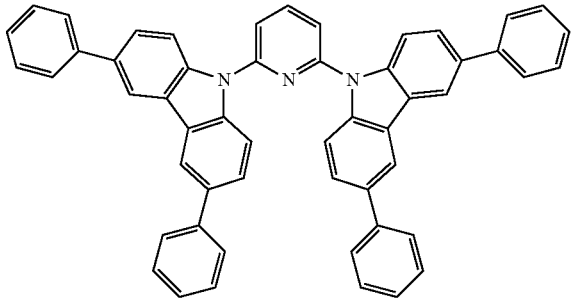

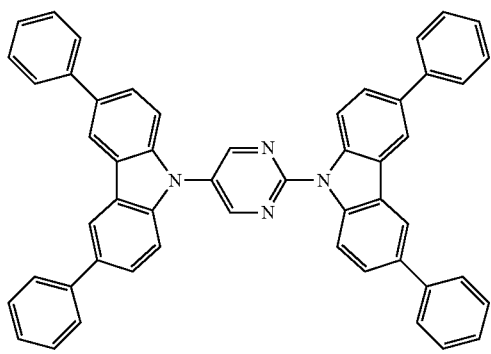
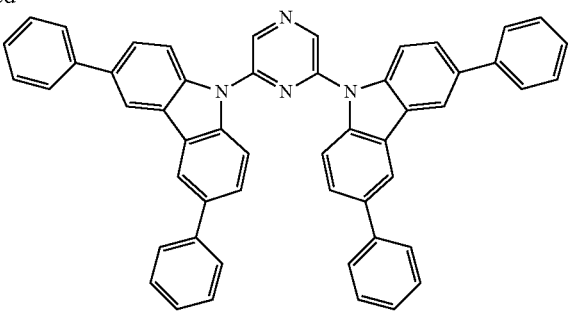
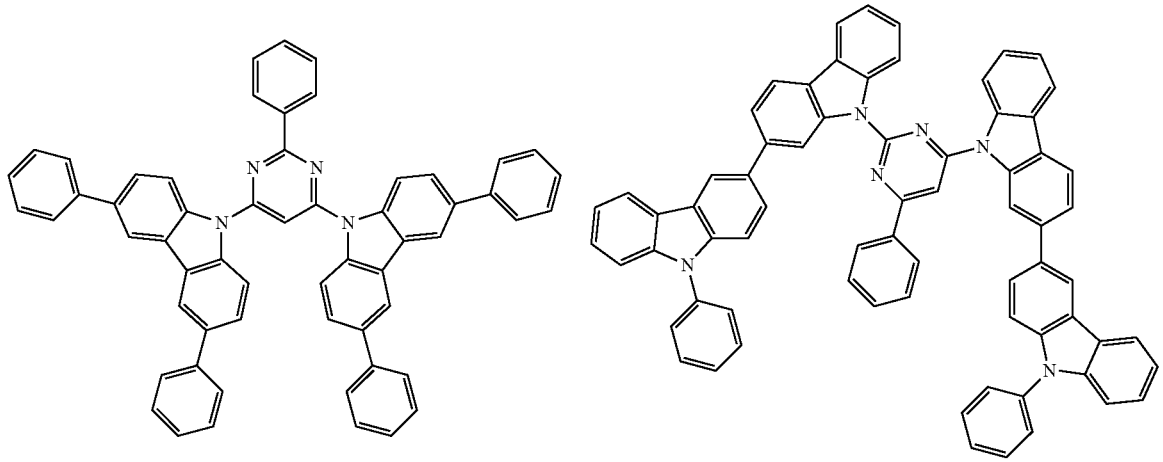
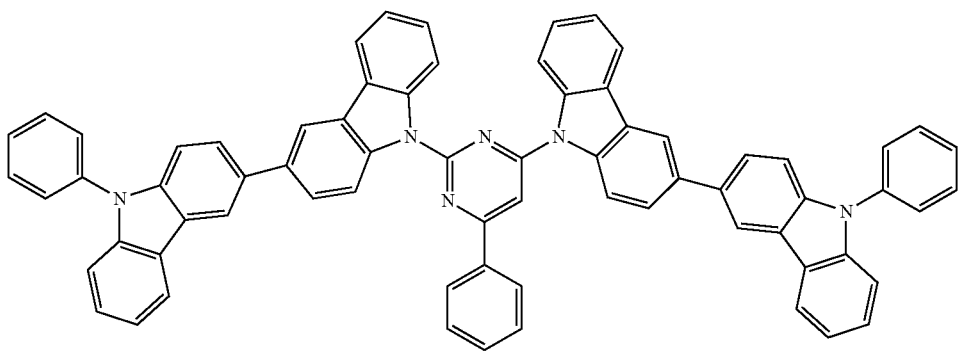
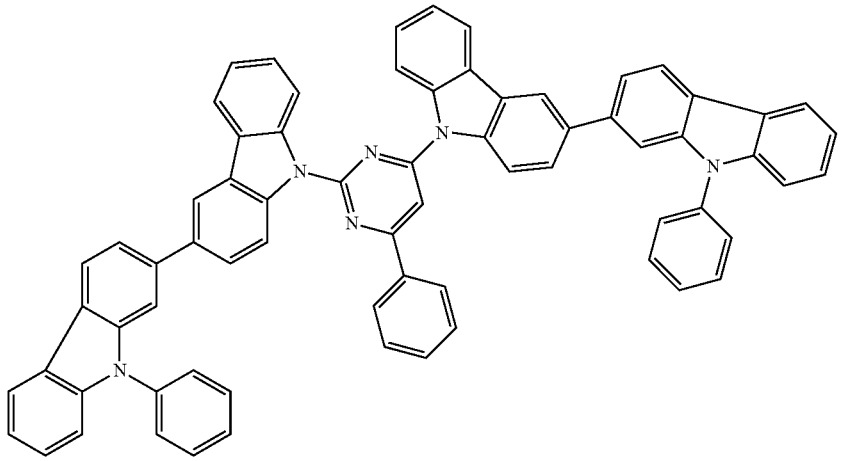

-continued
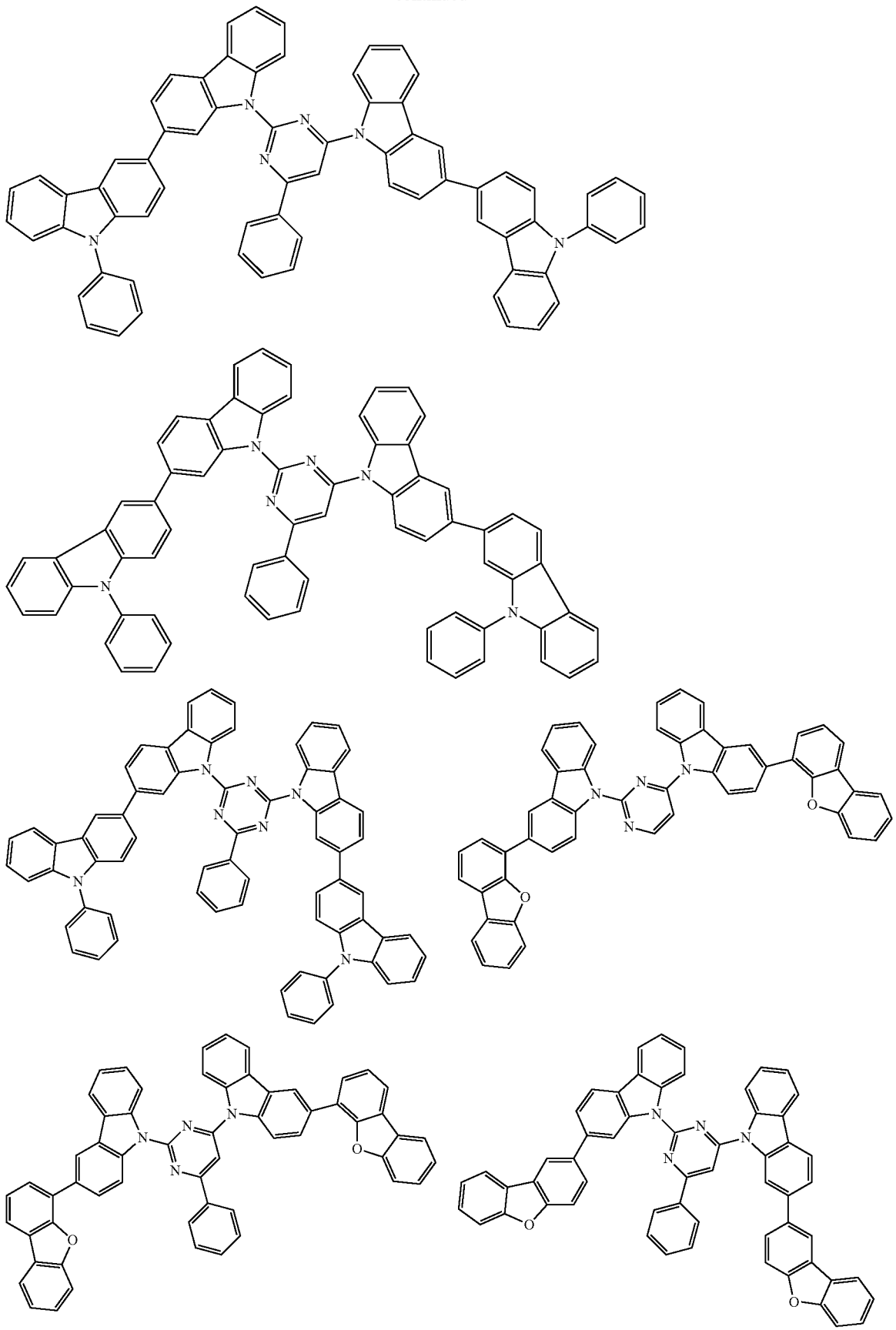

27
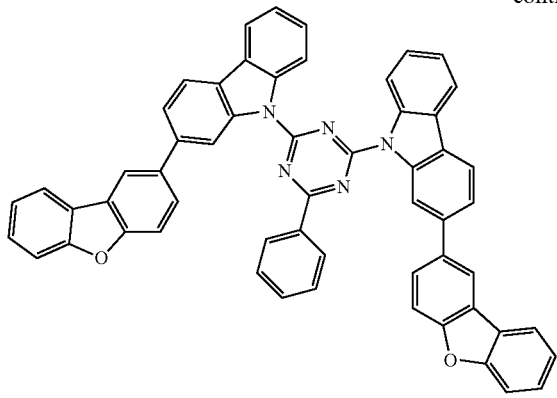
28
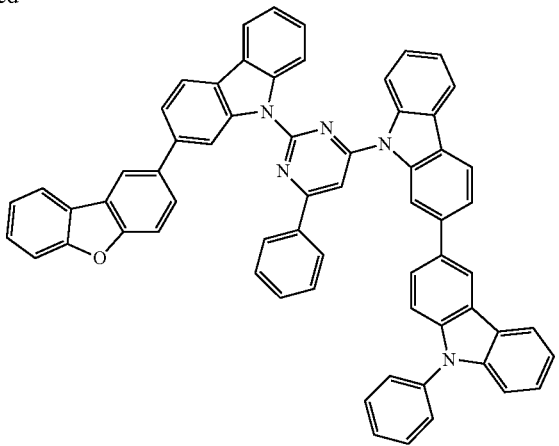
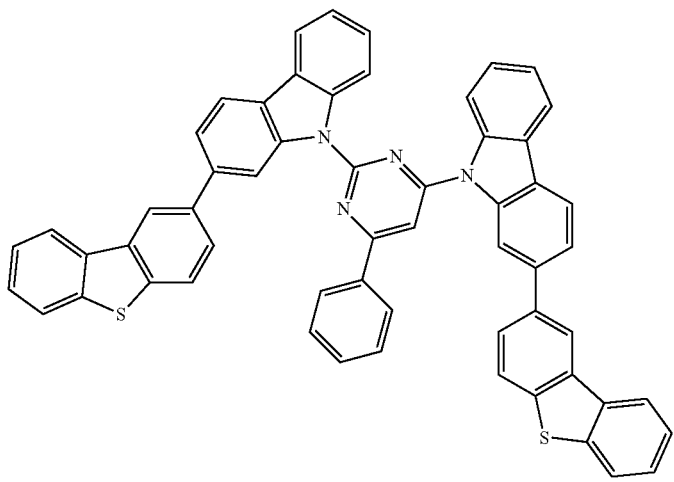
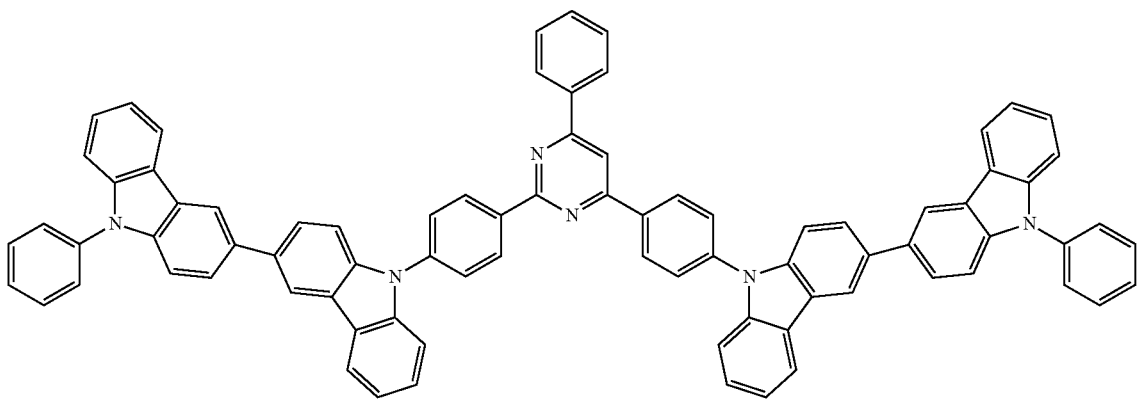

-continued
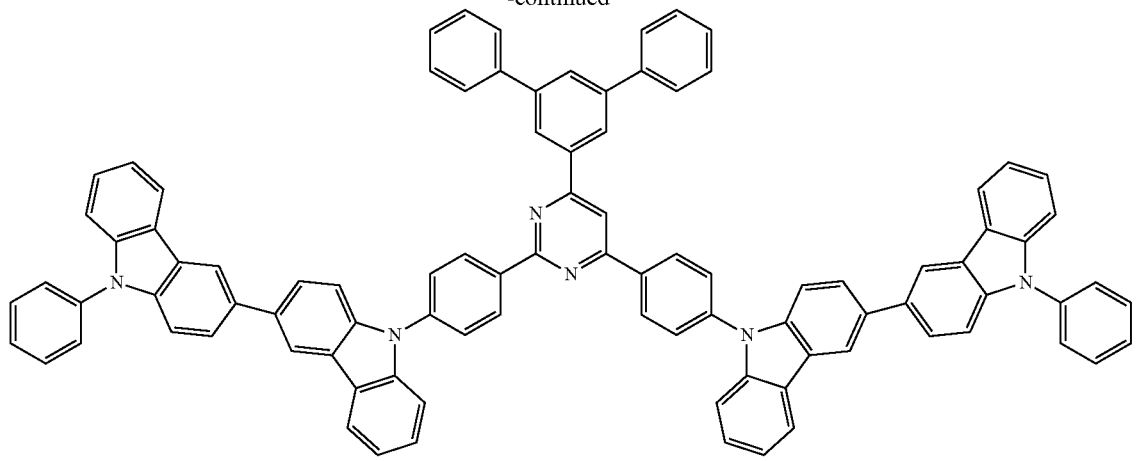
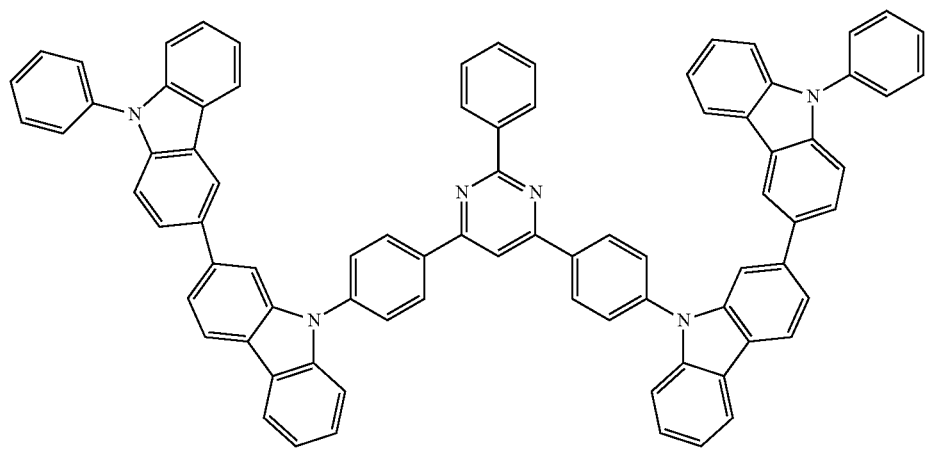
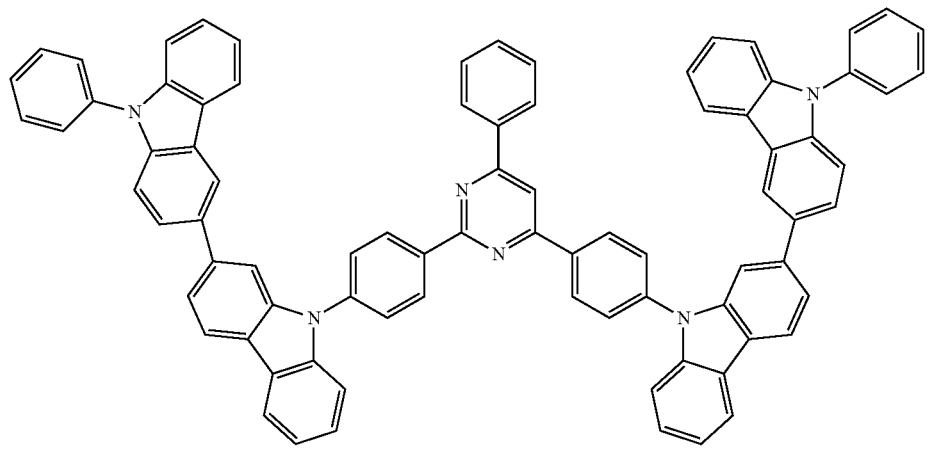

-continued
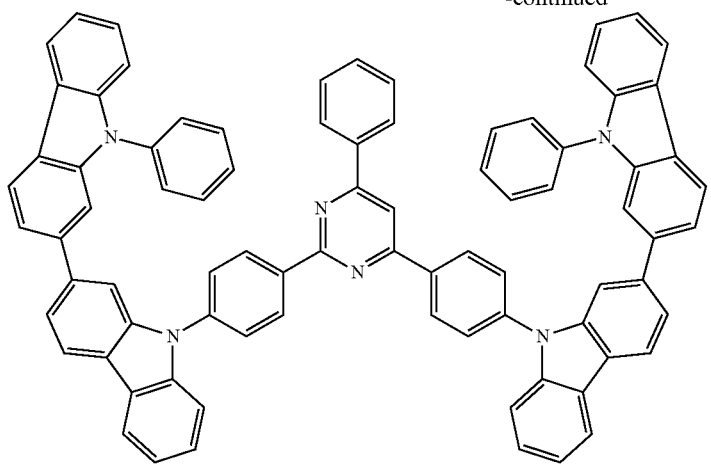
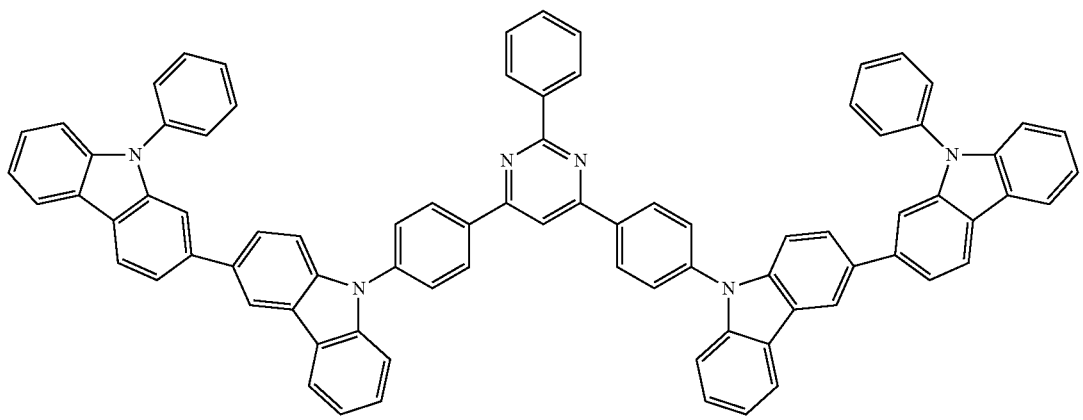
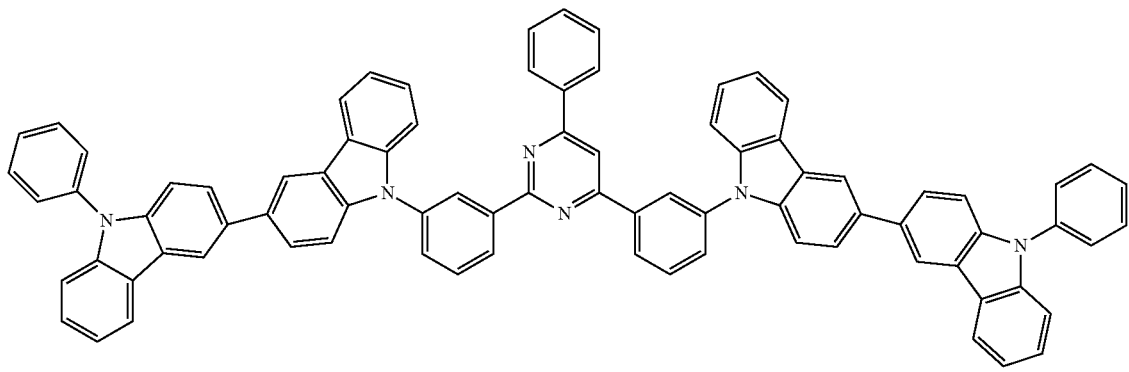

-continued
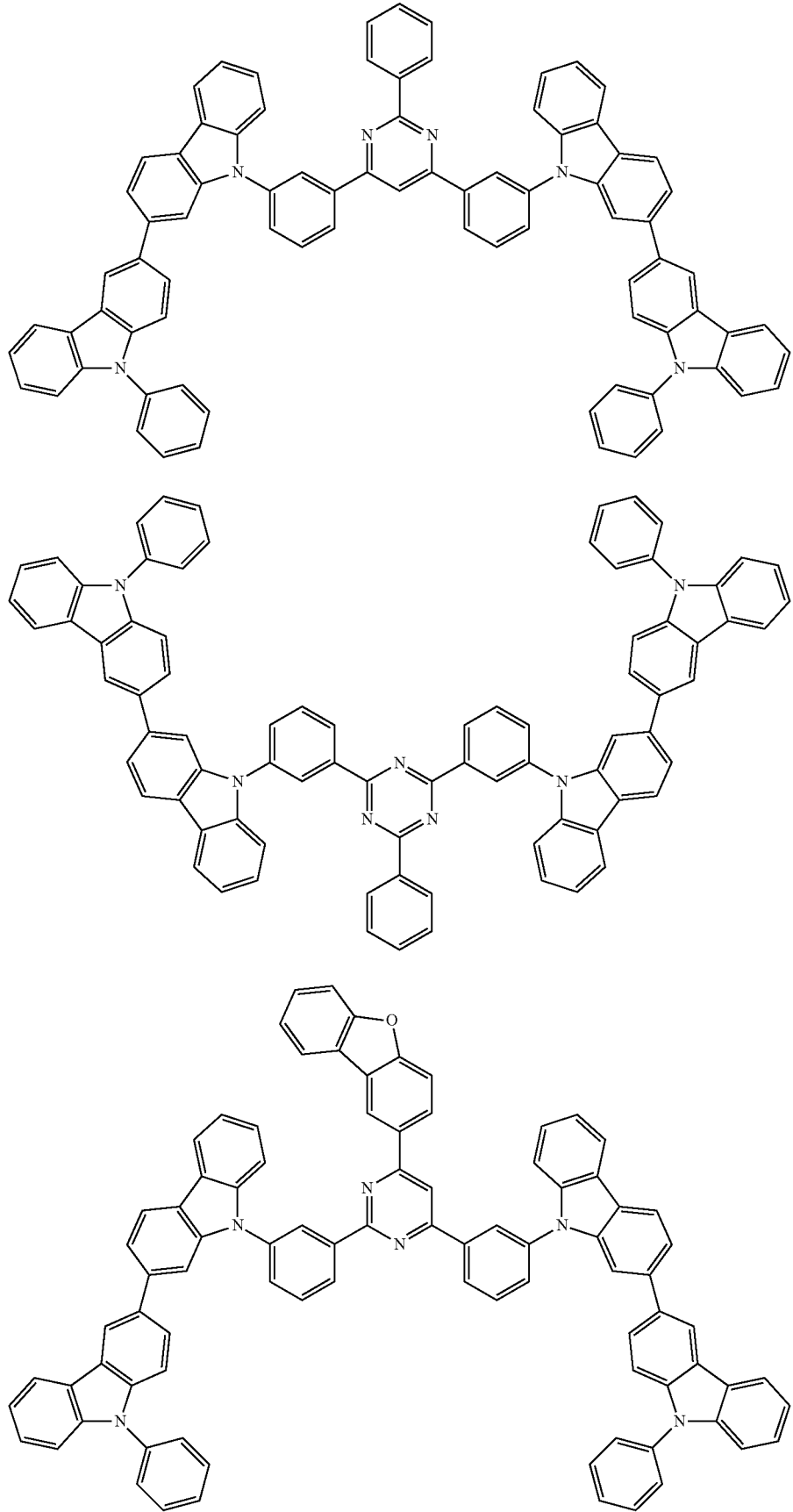

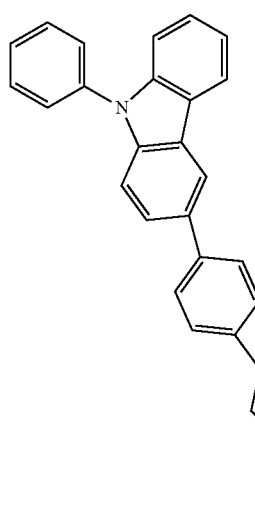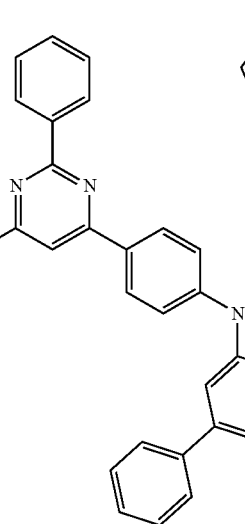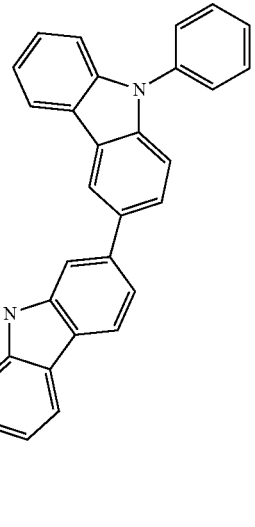
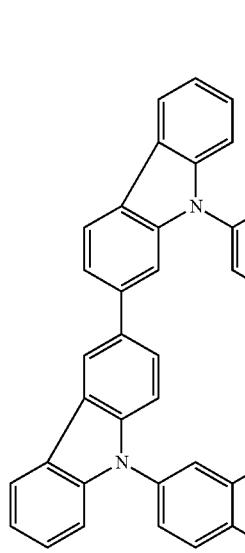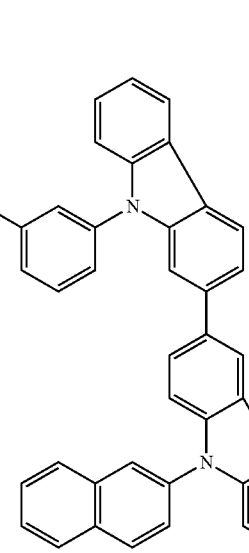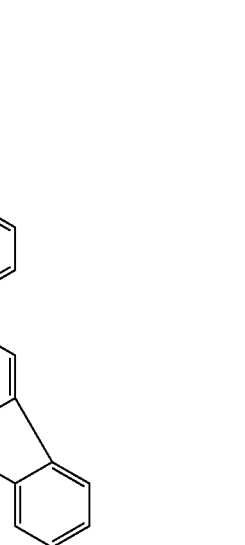
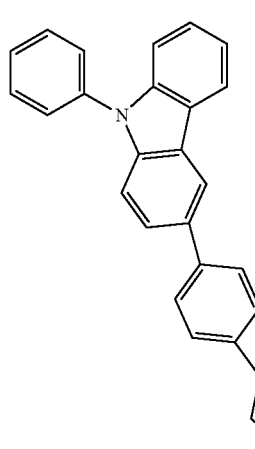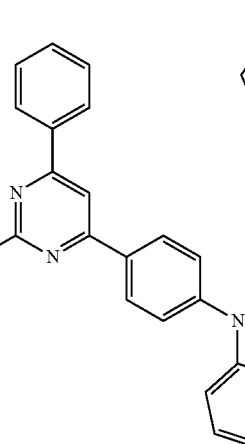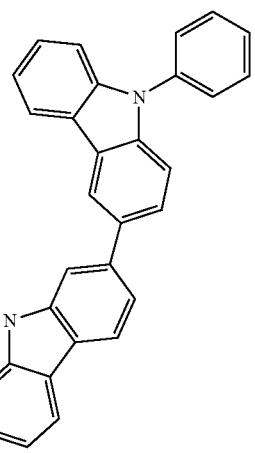

-continued
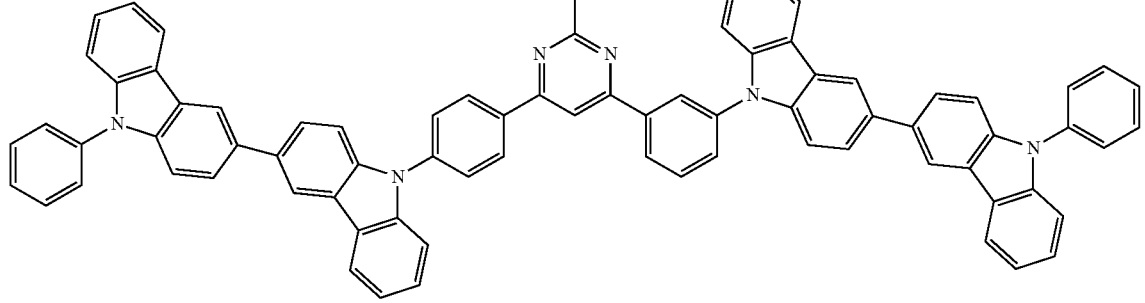
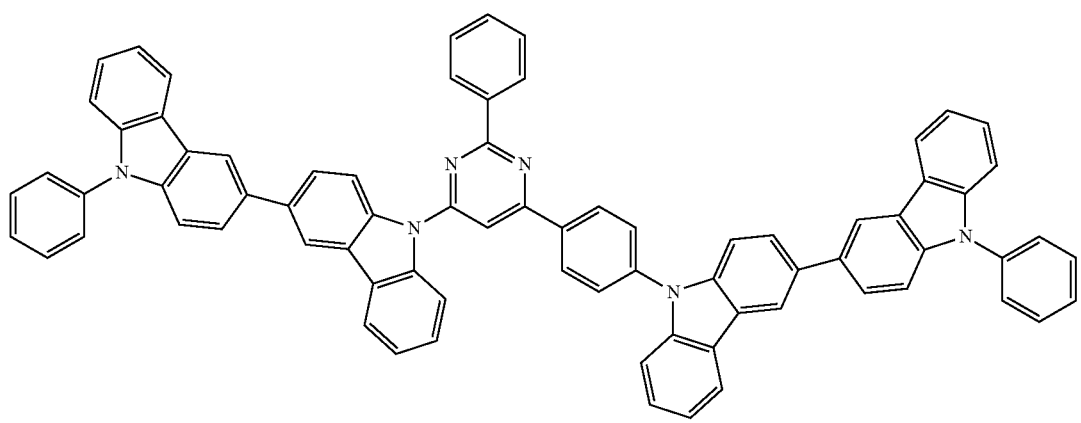
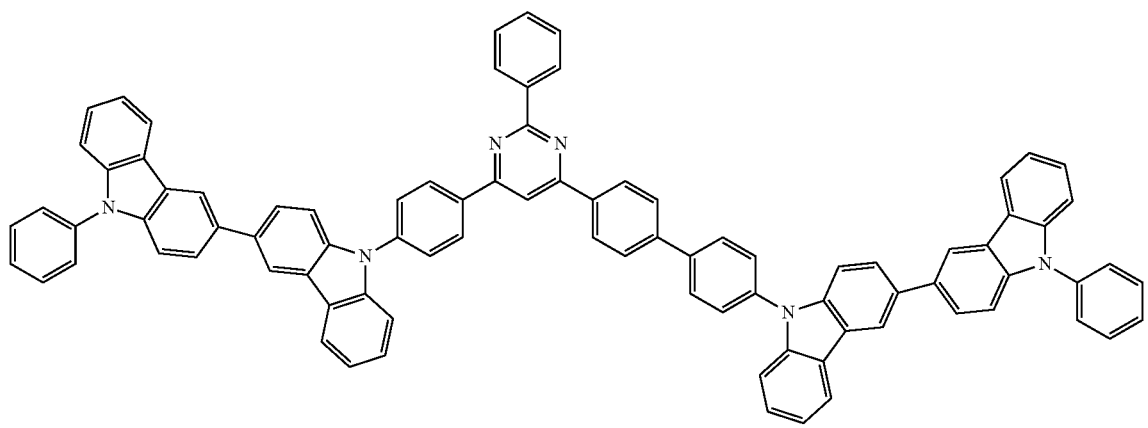
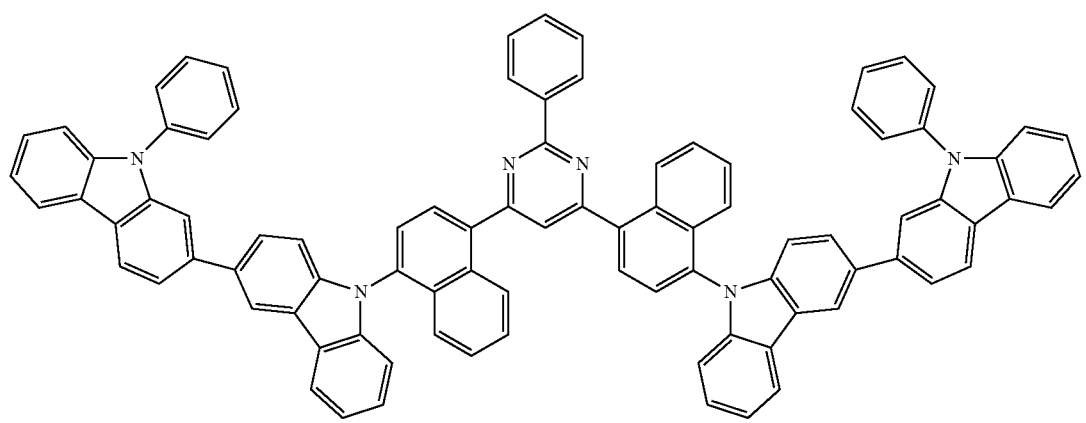

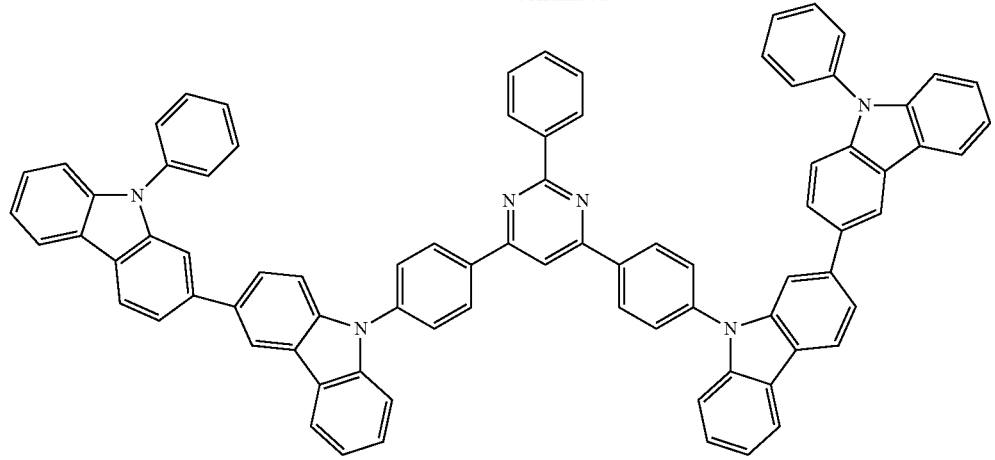
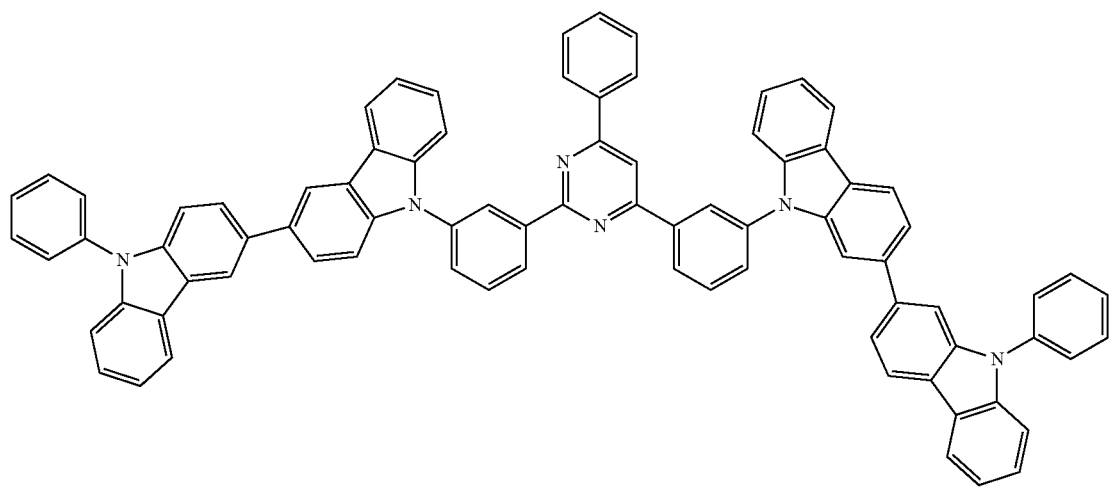
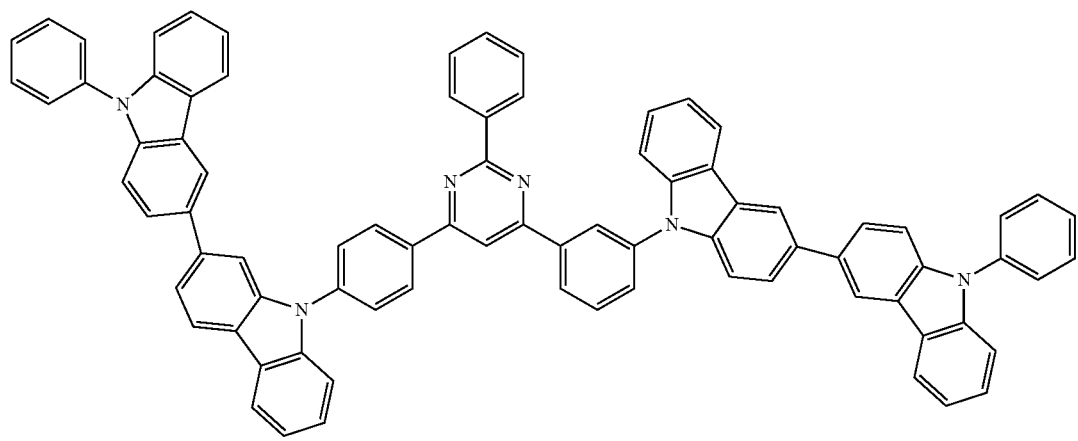

-continued
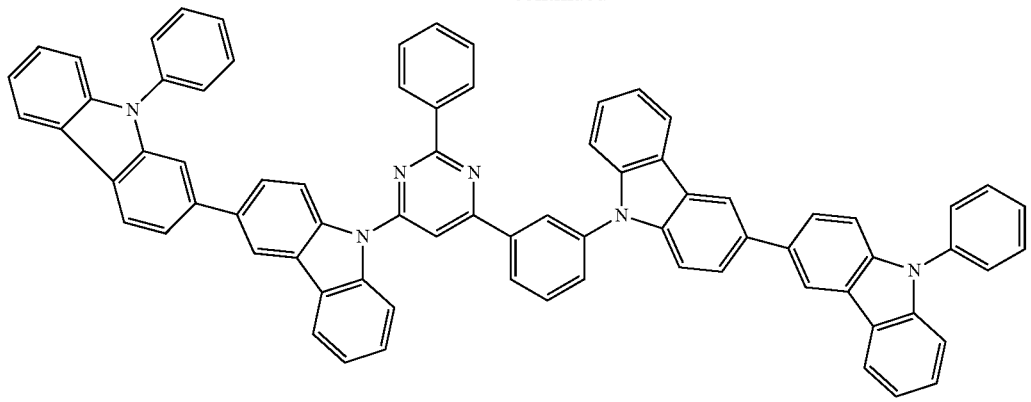
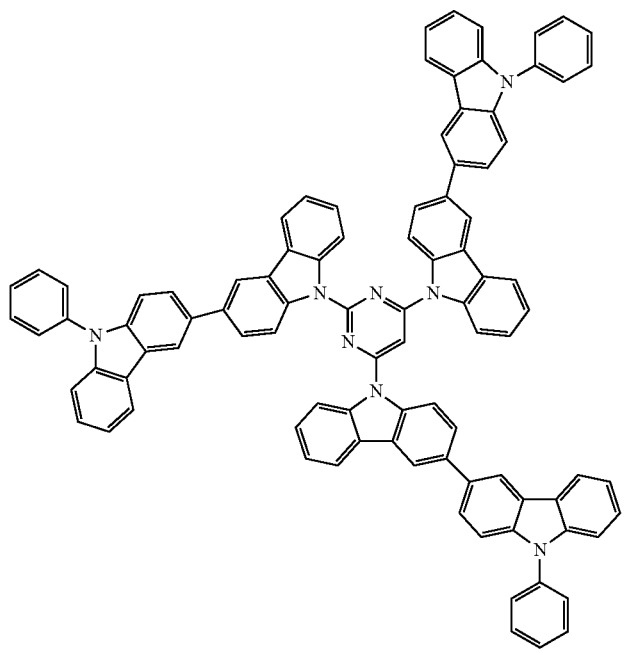
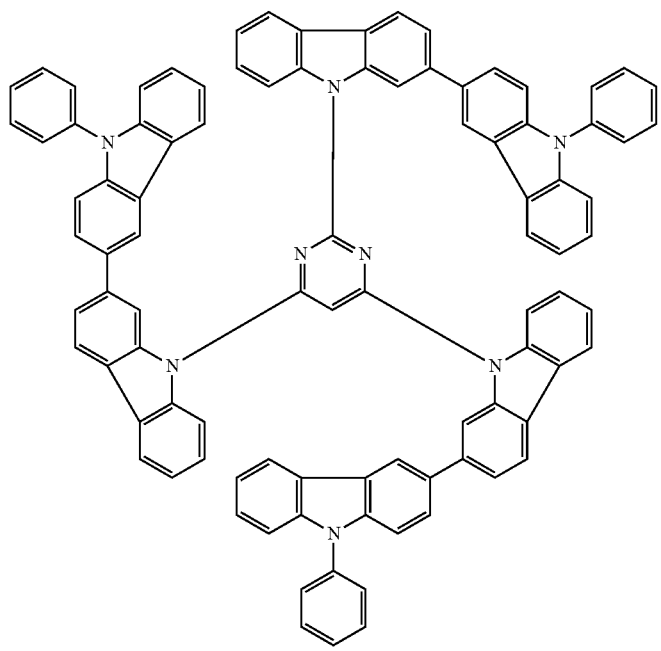

-continued
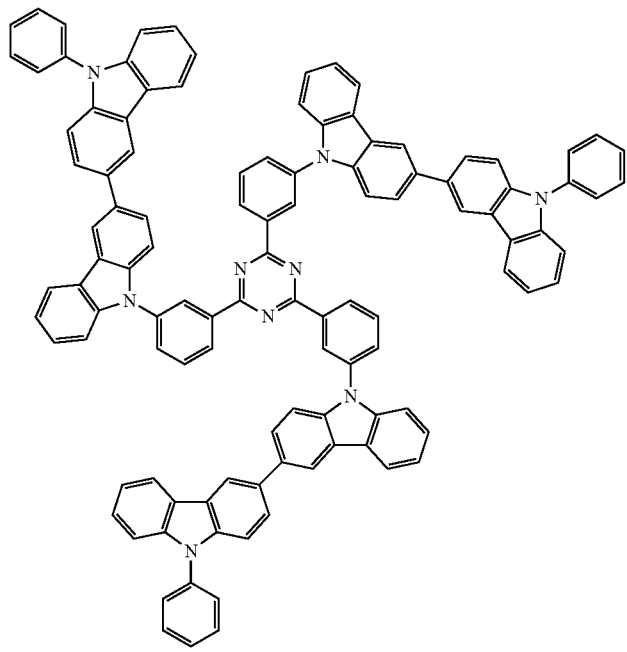
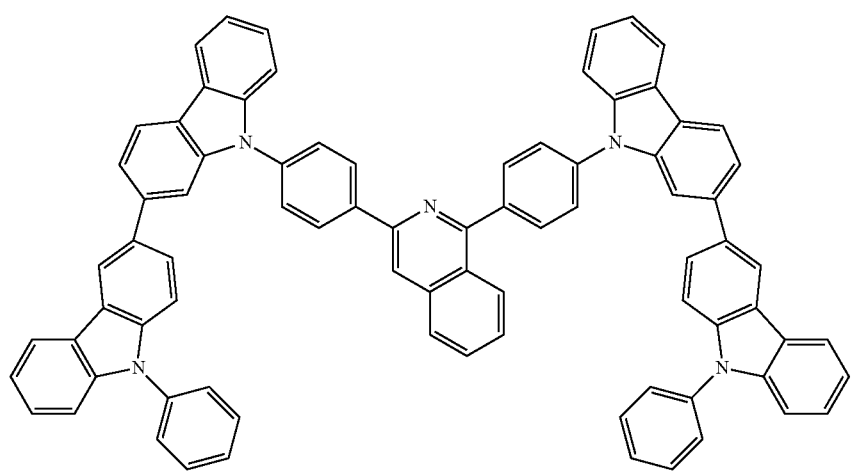
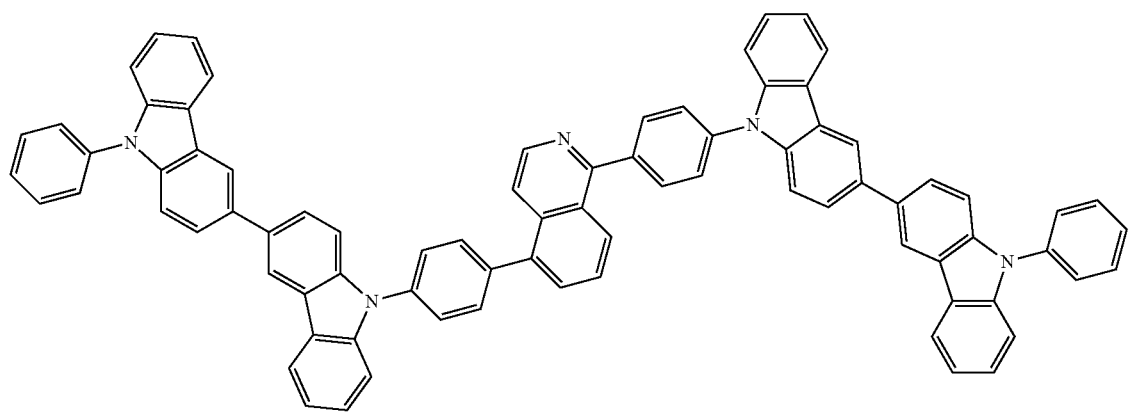

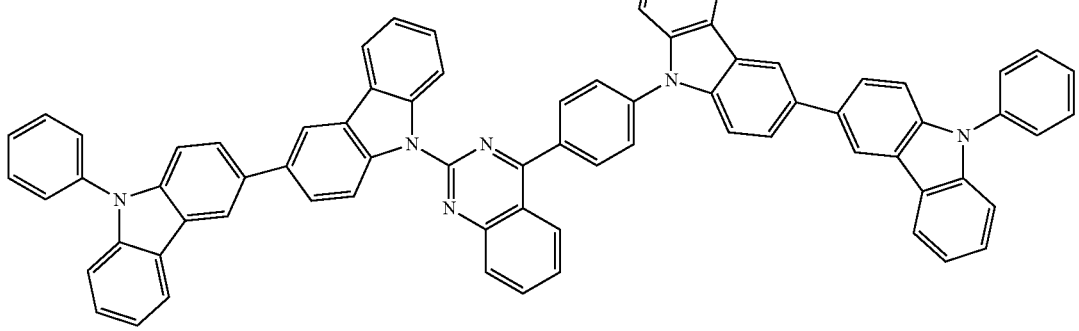
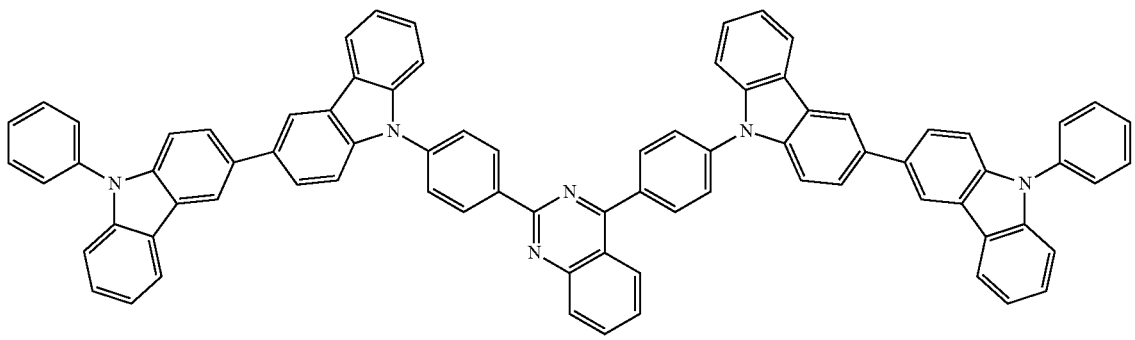
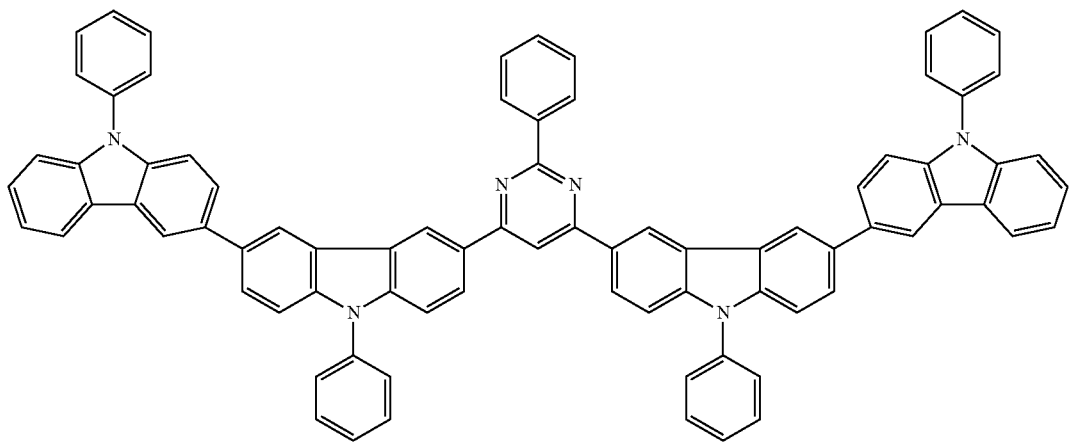
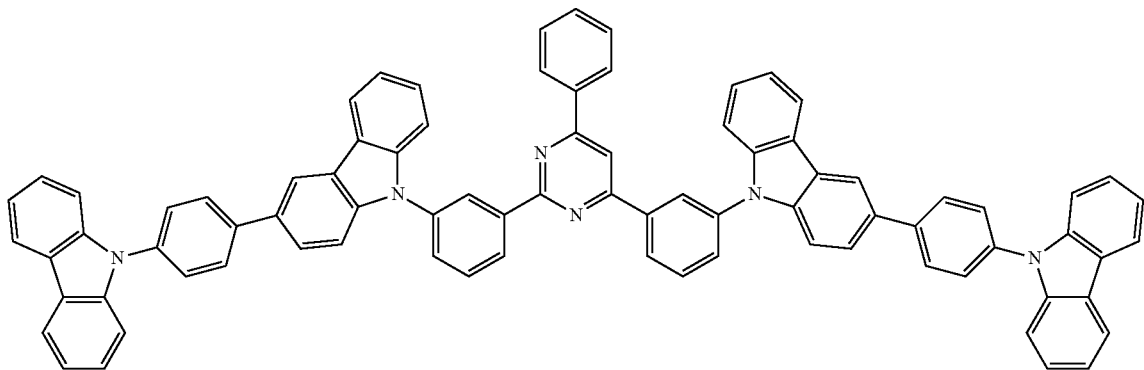

-continued
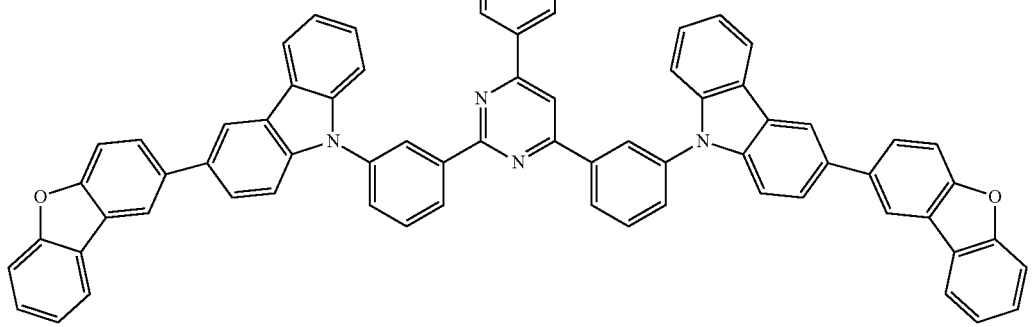
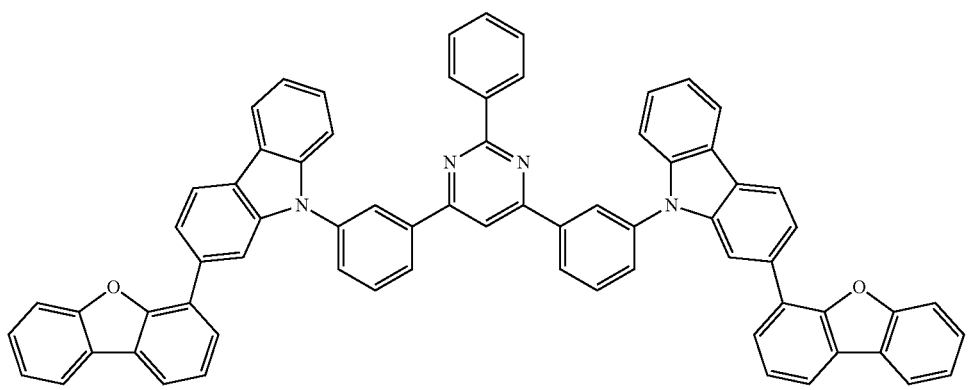
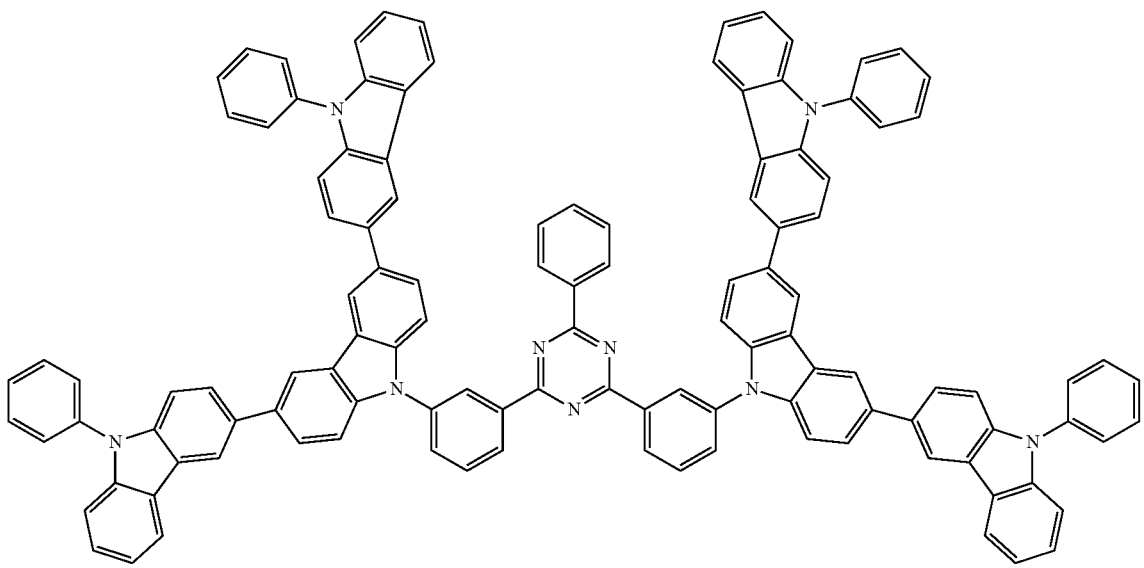

-continued
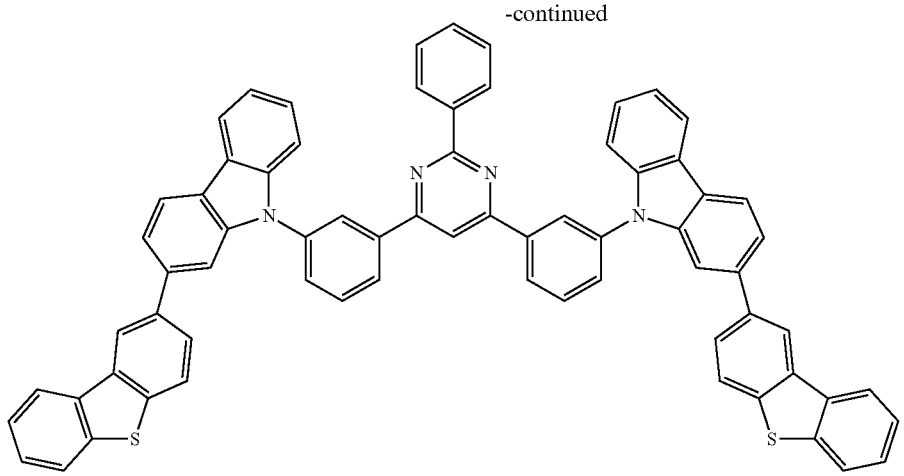
The emitting layer may contain the following exemplified compounds in addition to the above host material.
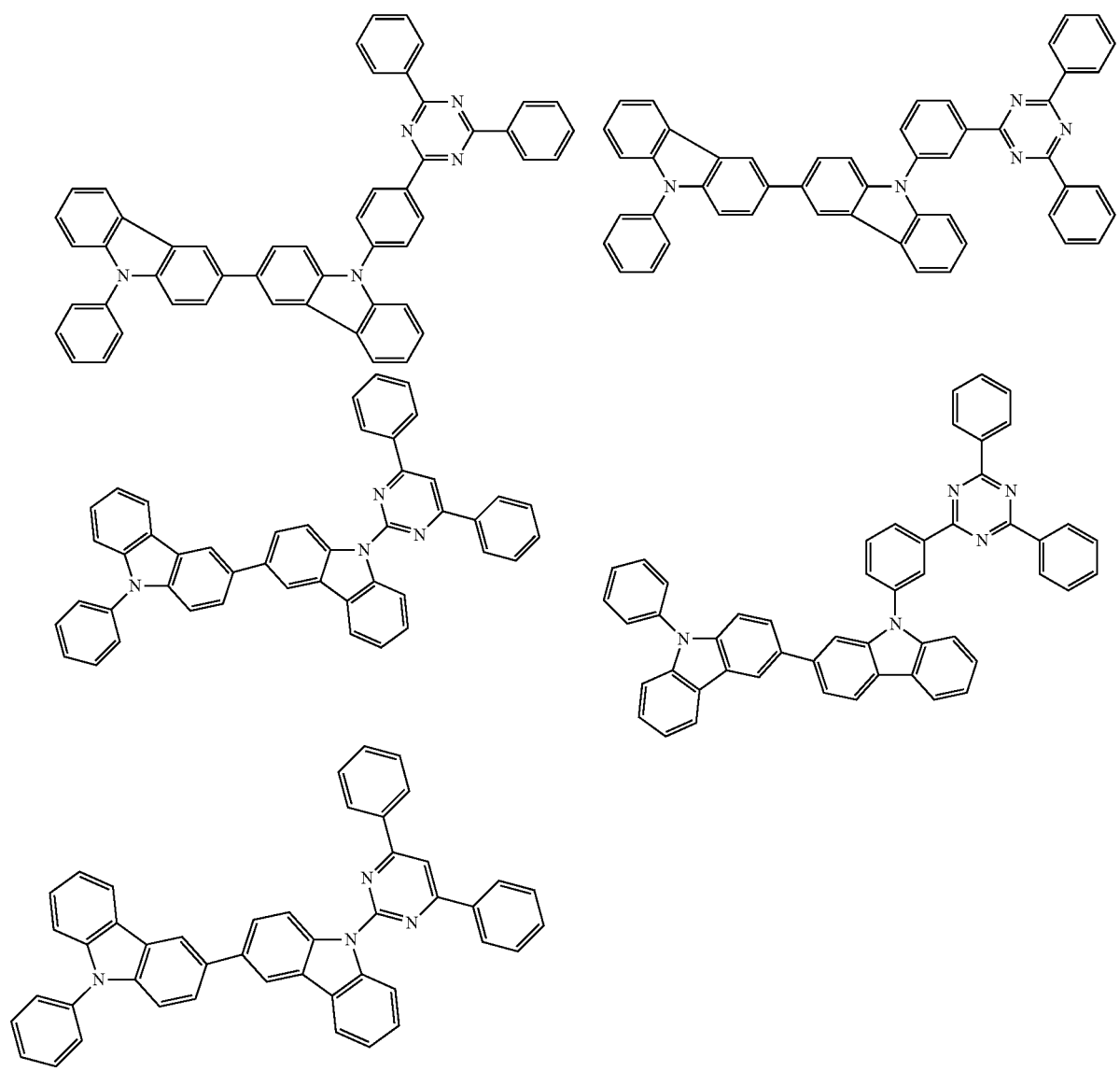

-continued
51
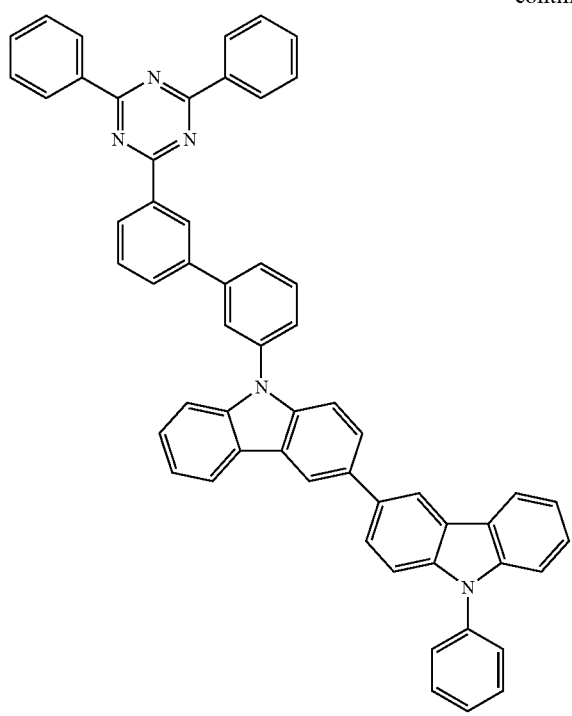
52
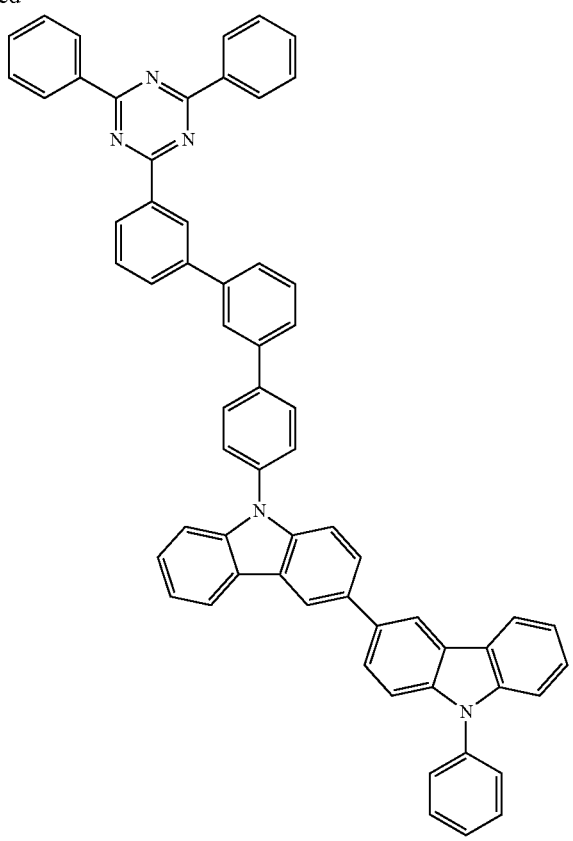
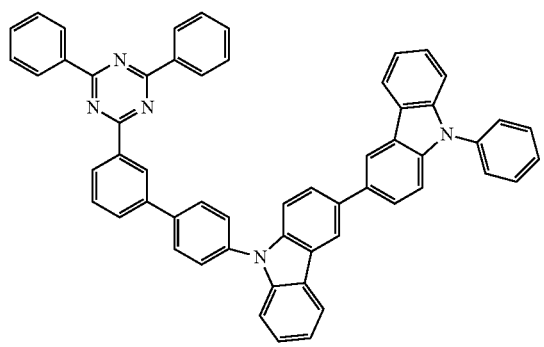
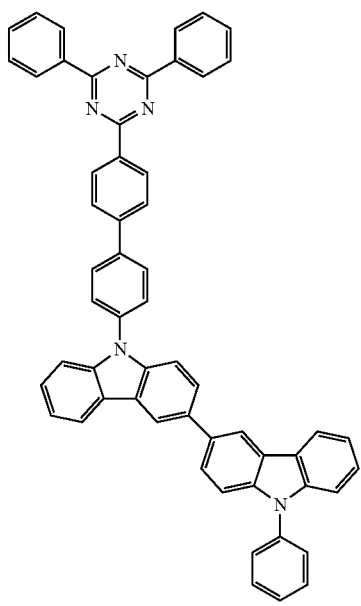

-continued
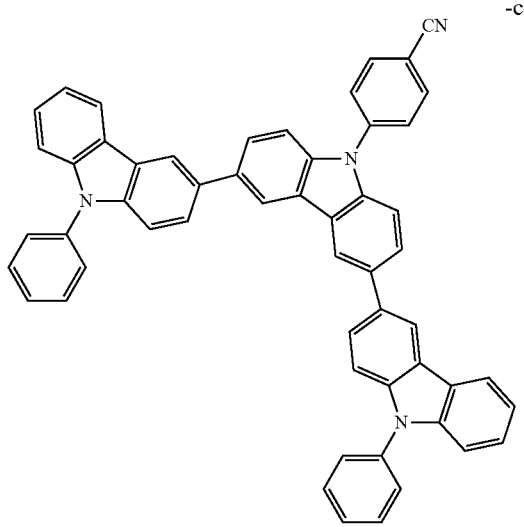
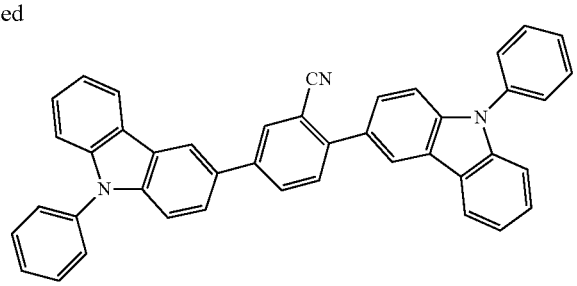
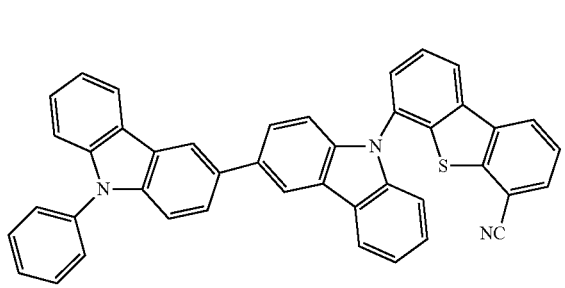
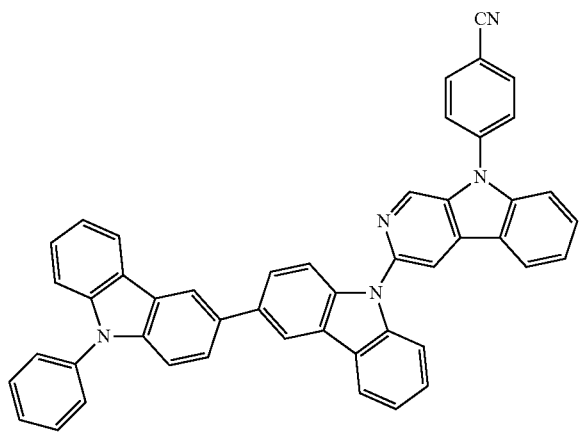
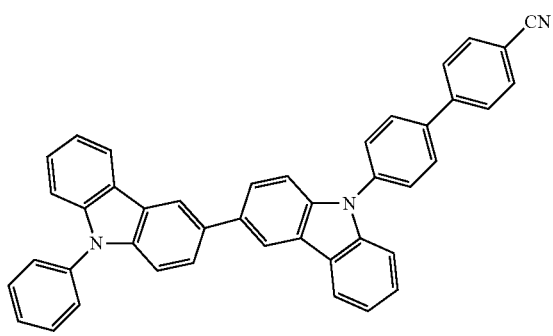
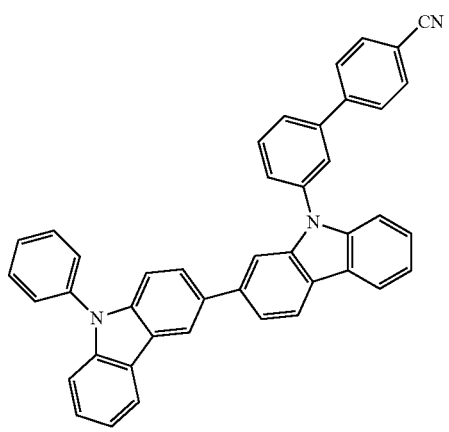

-continued
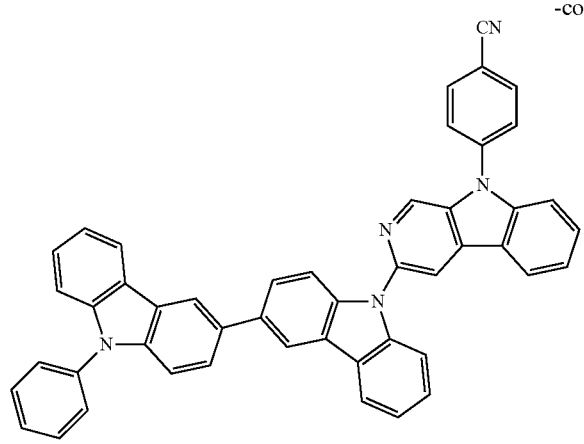
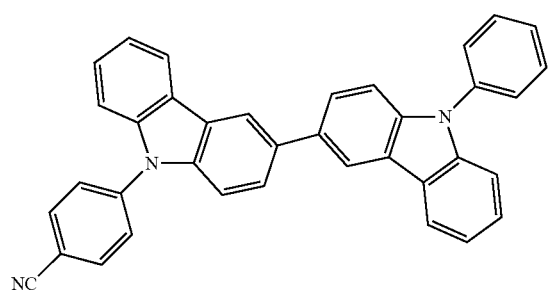
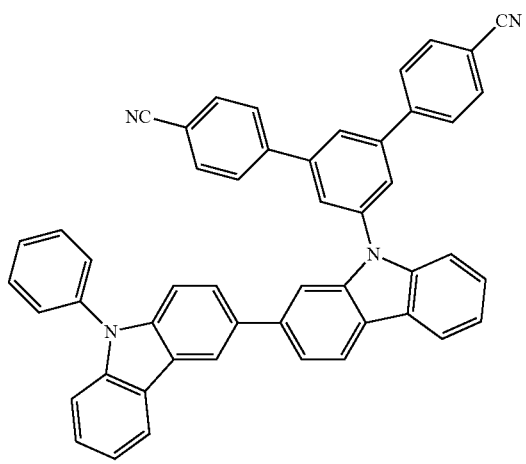
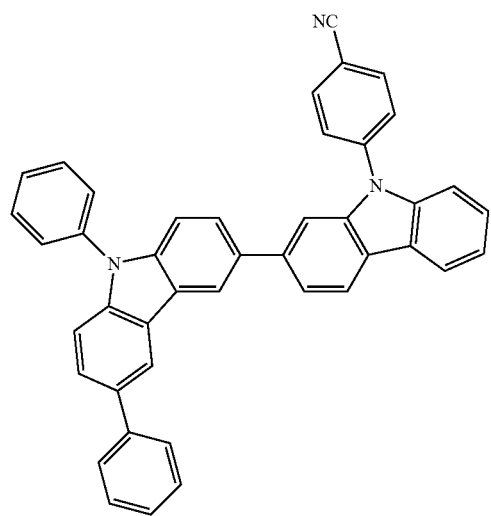
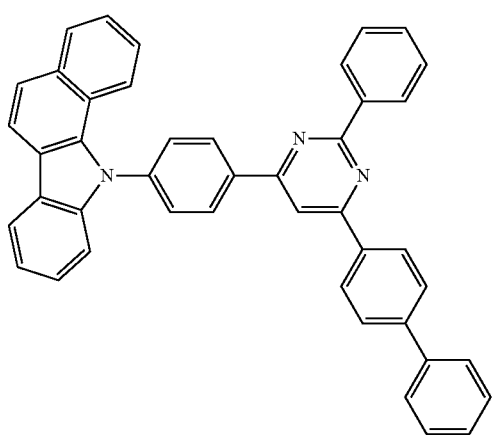

-continued
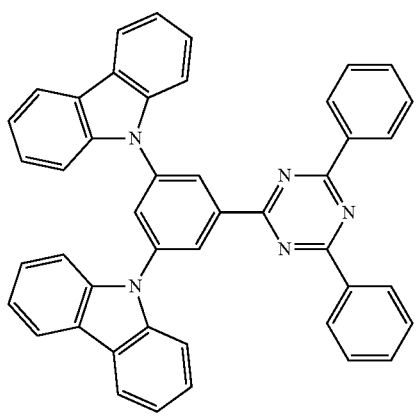
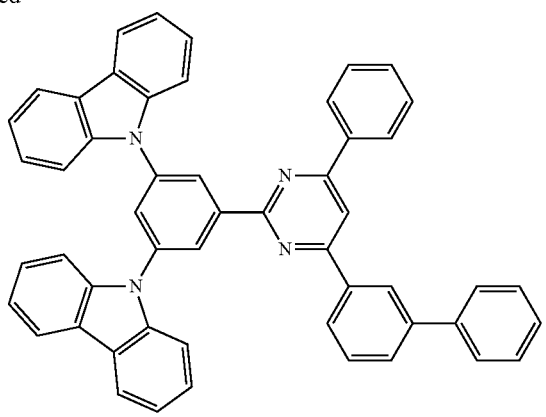
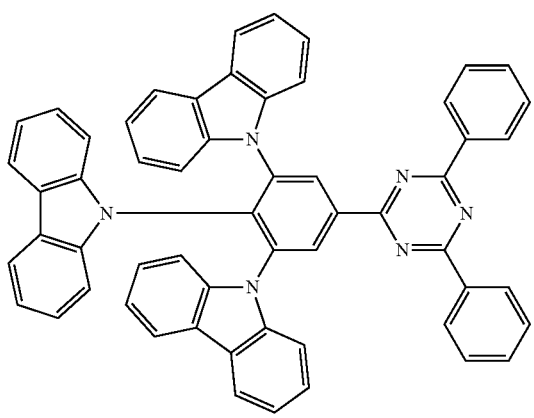
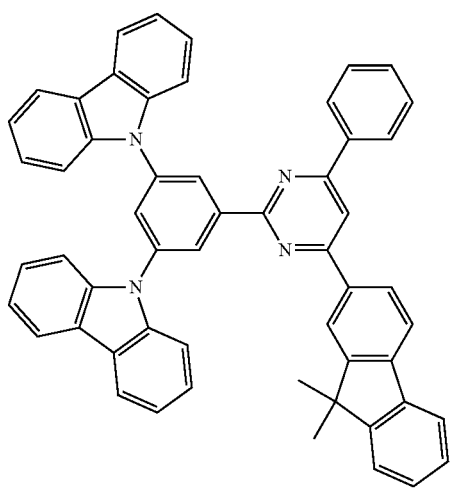
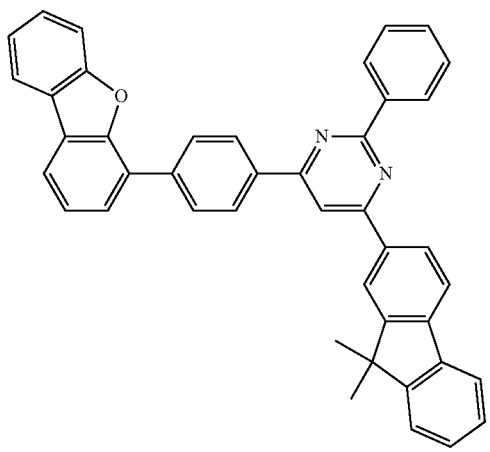
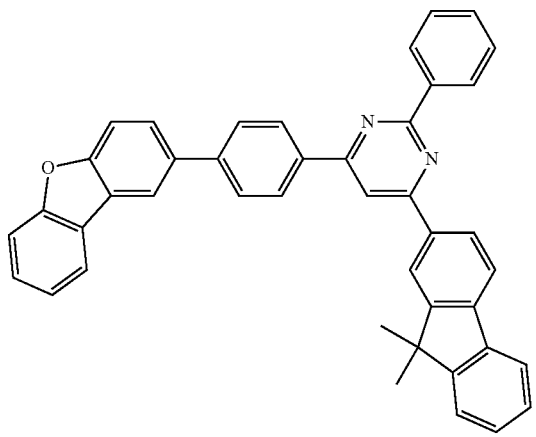

59
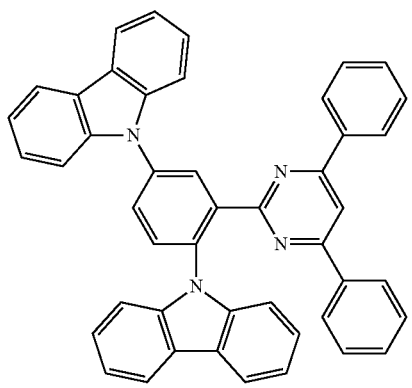
60
-continued
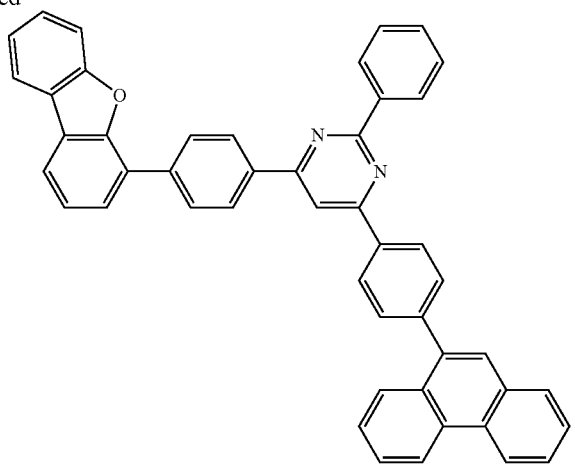
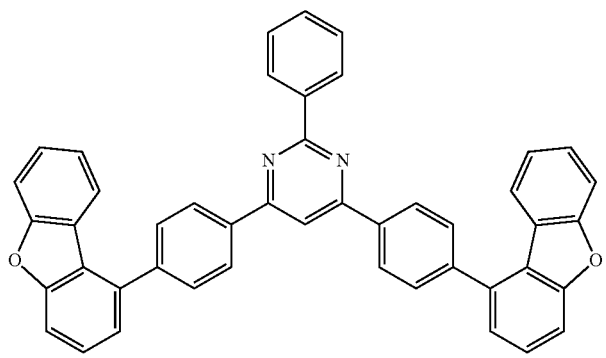
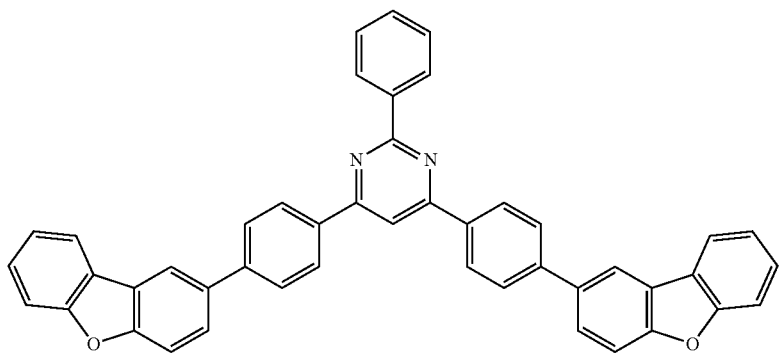
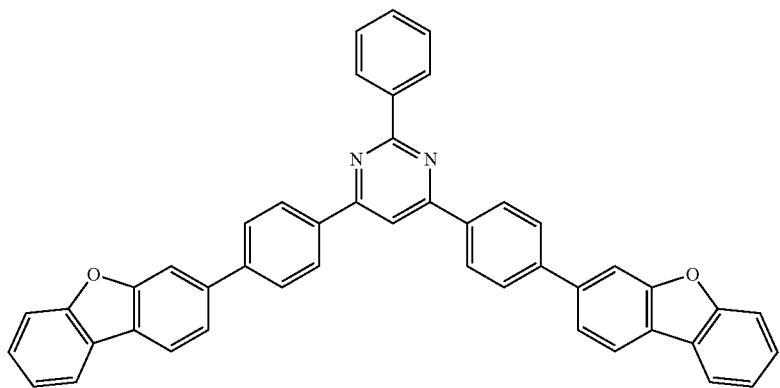

-continued
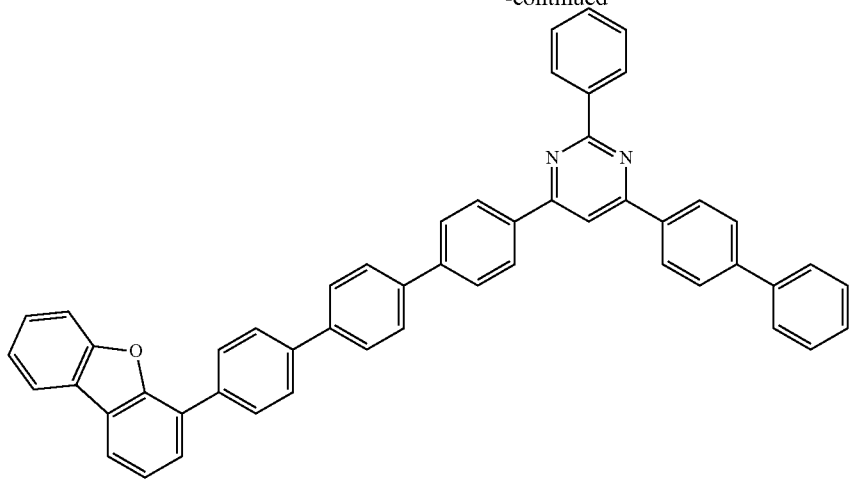
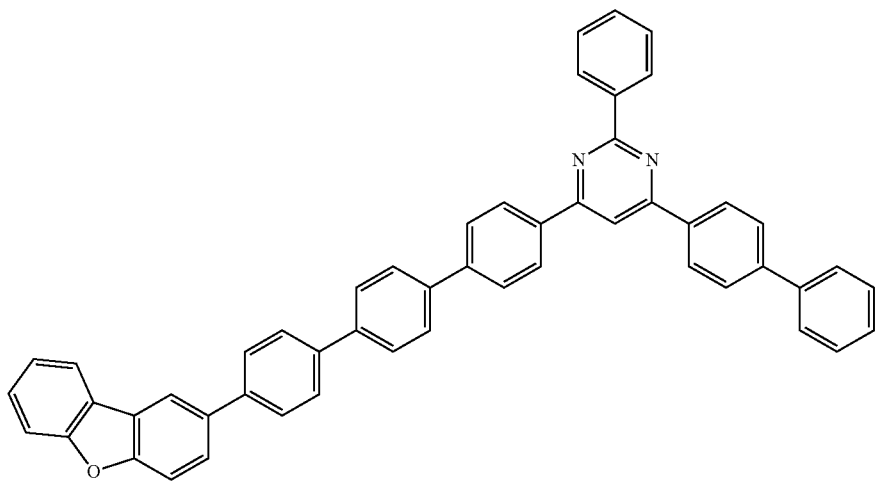
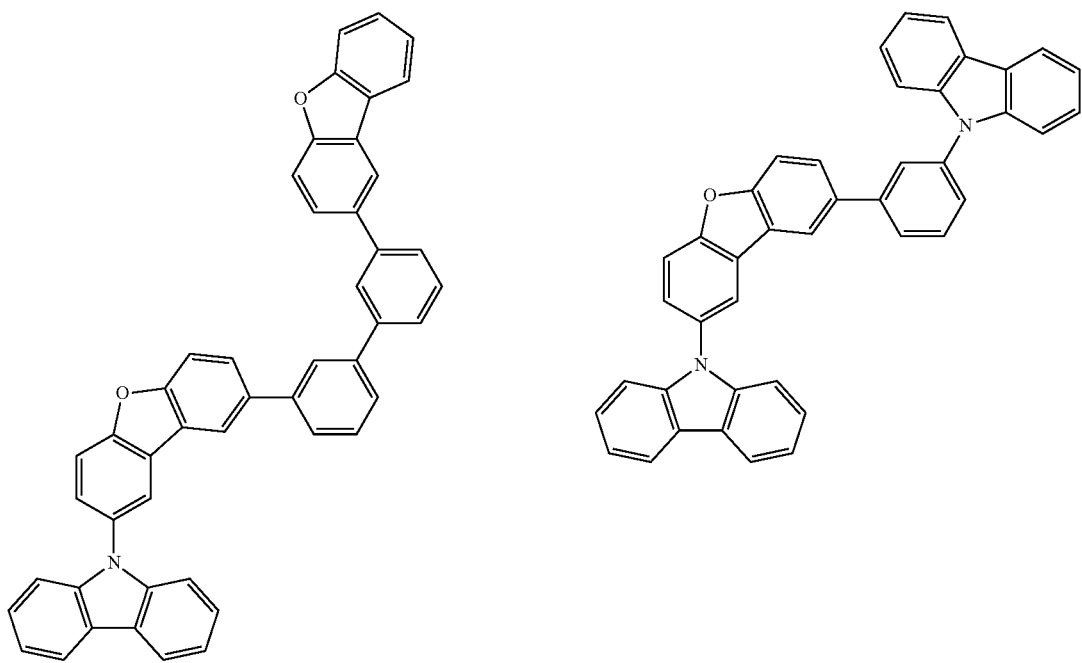

-continued
63
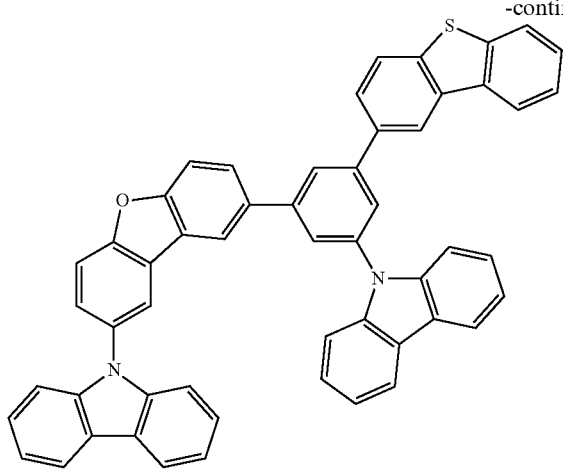
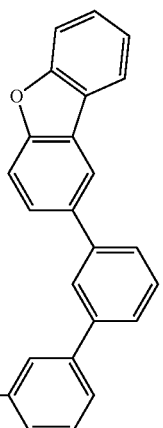
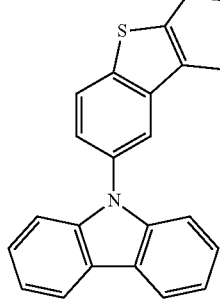
64
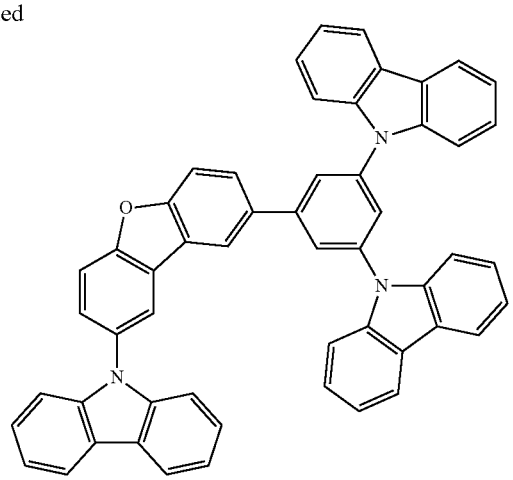
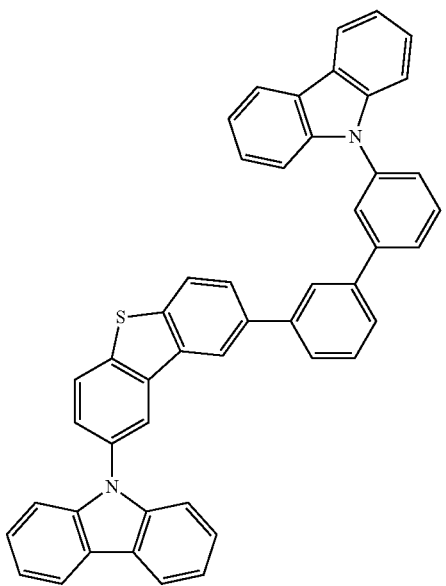
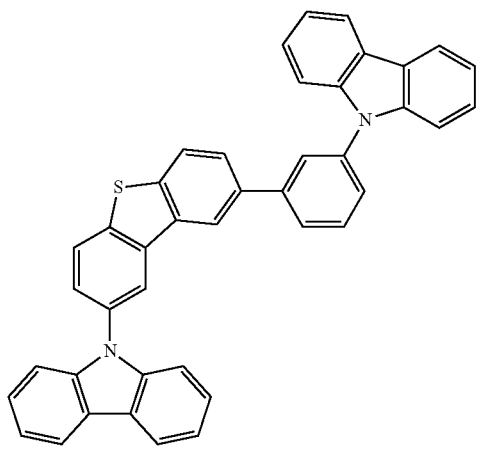
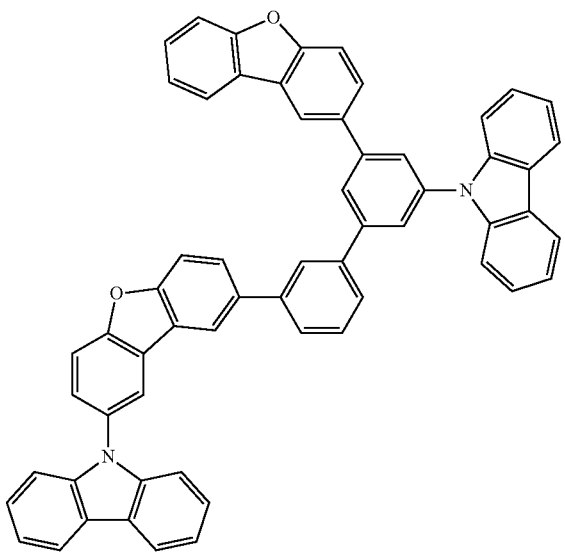

-continued
65
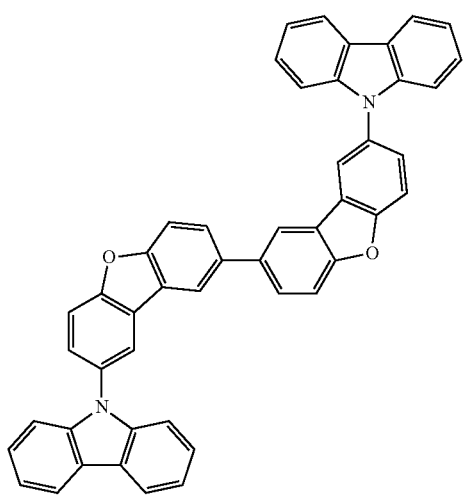
66
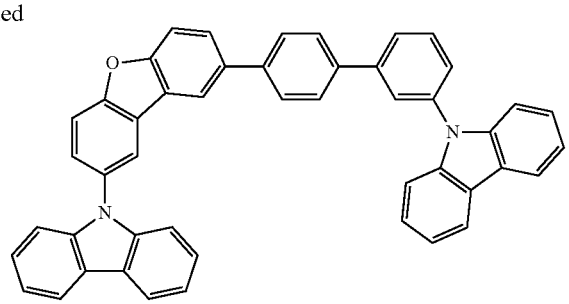
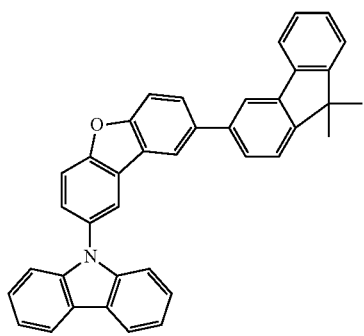
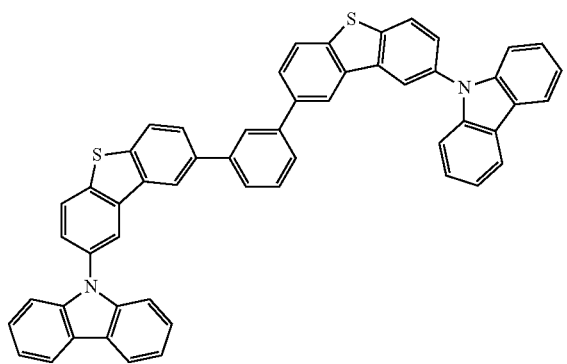
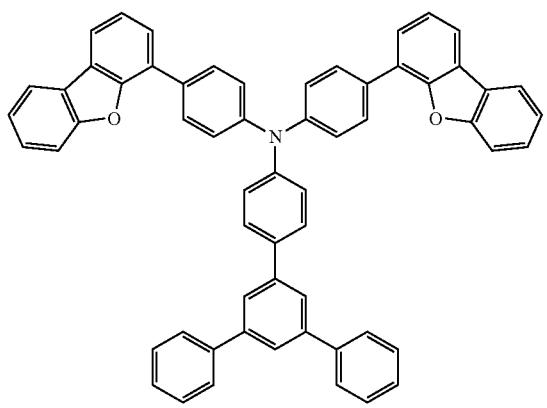
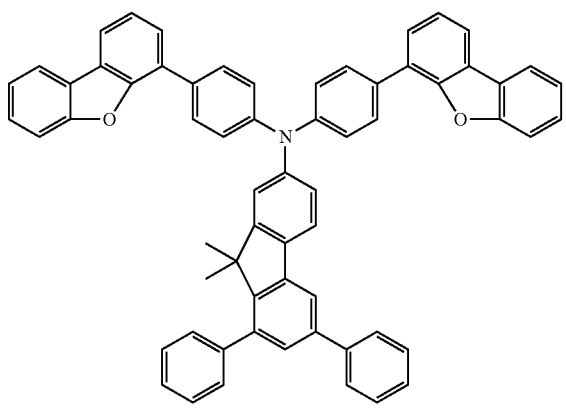

67
-continued
68
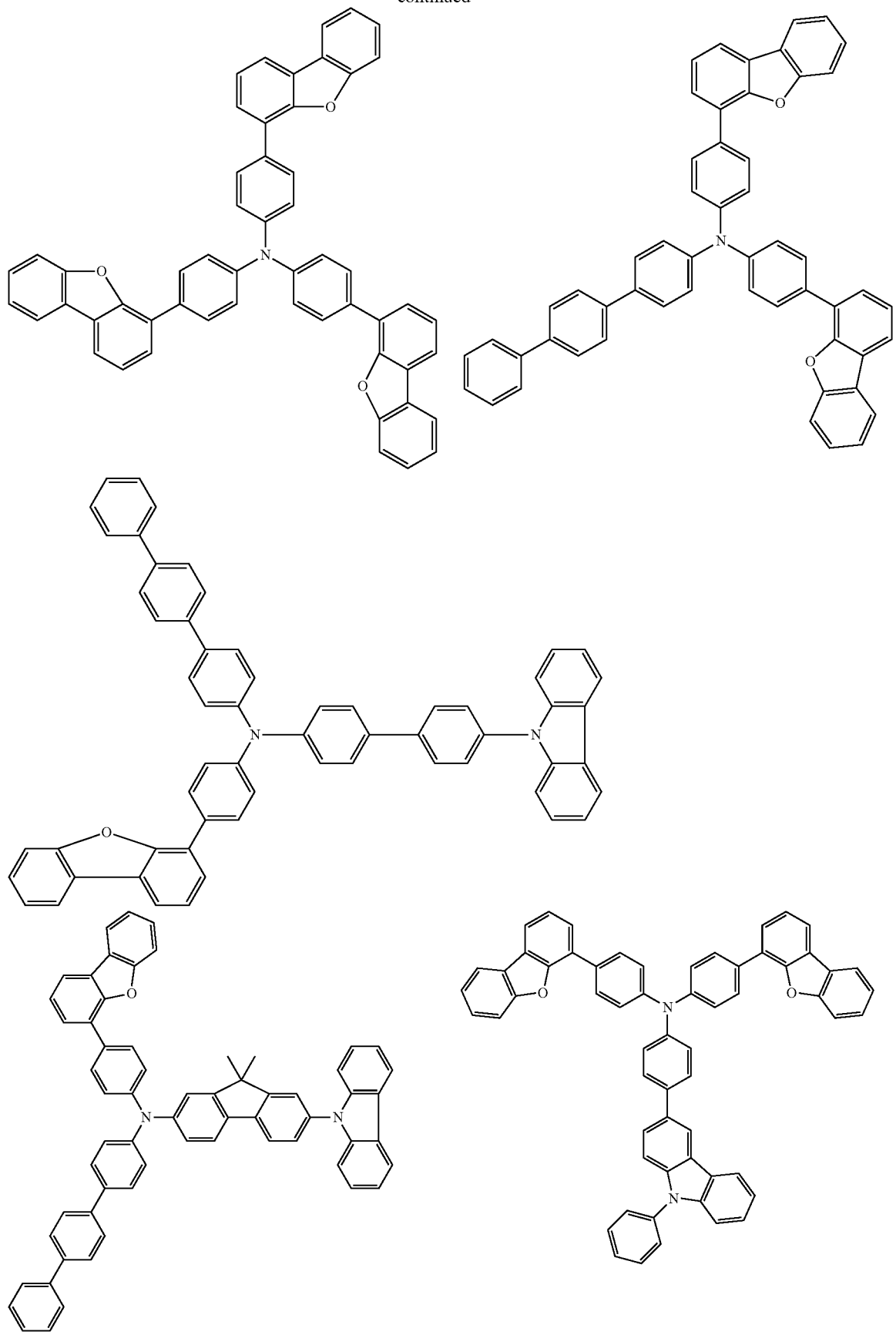

-continued
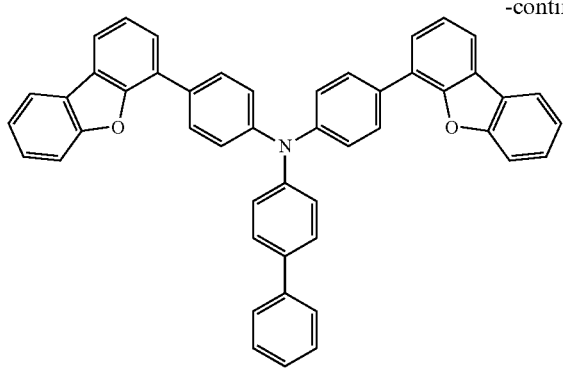
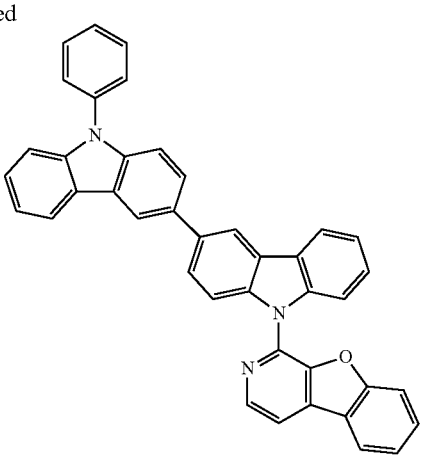
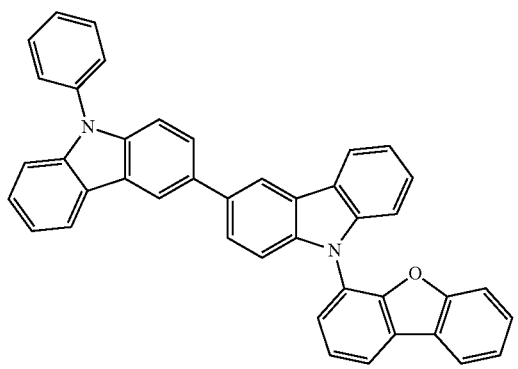
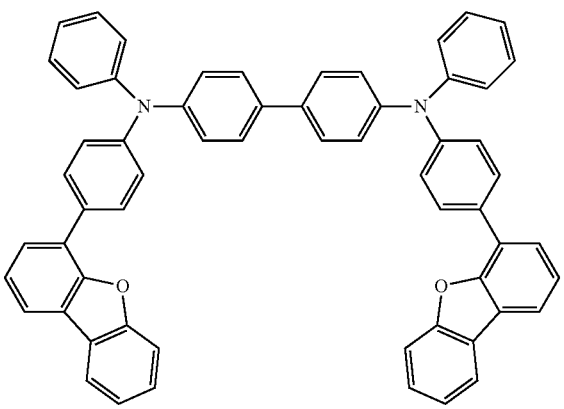
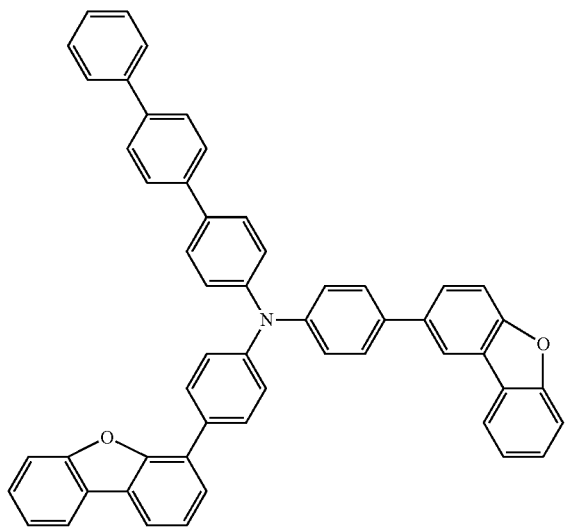
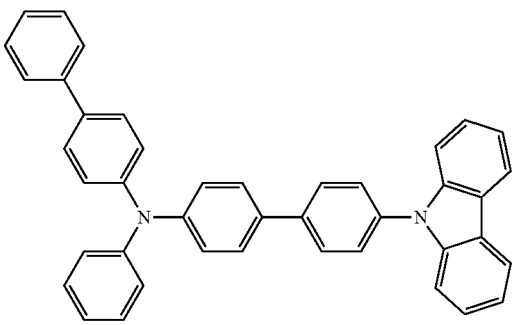

-continued
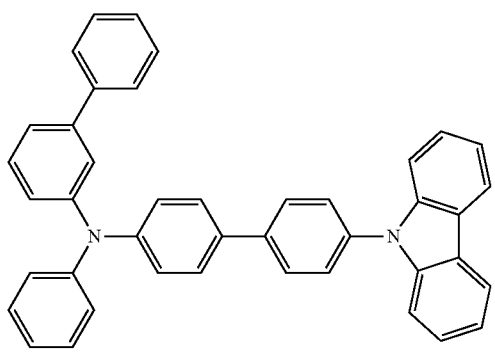
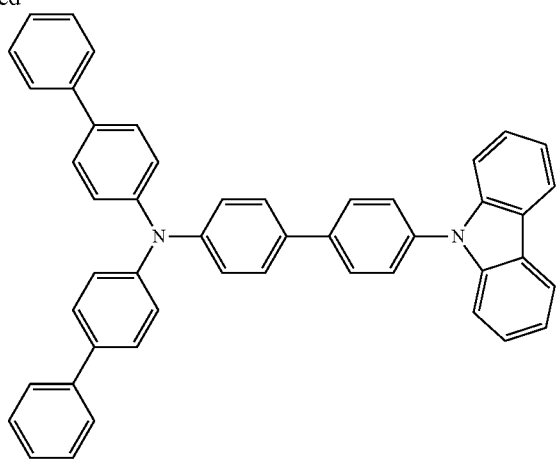
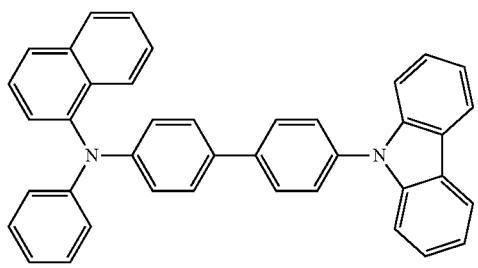
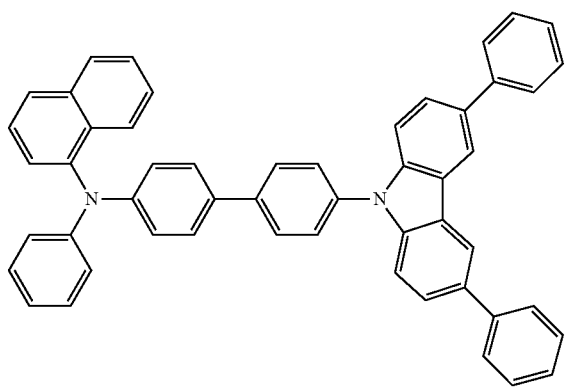
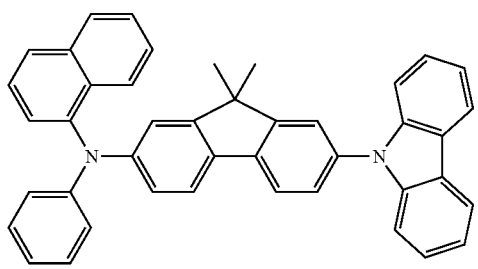
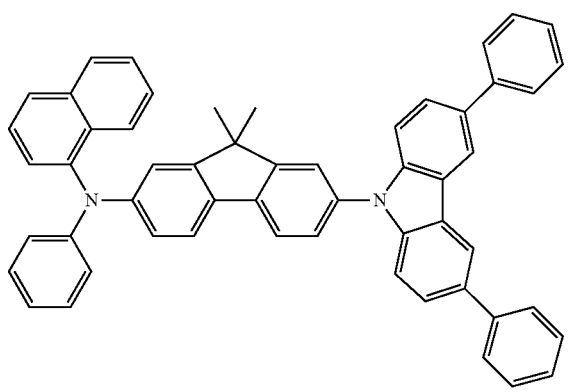
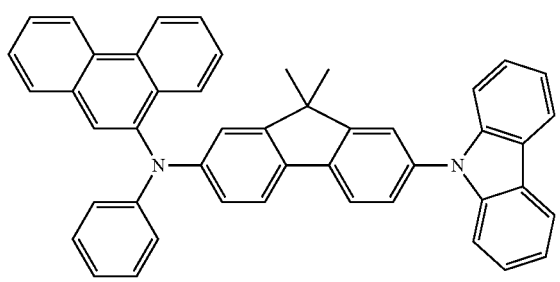
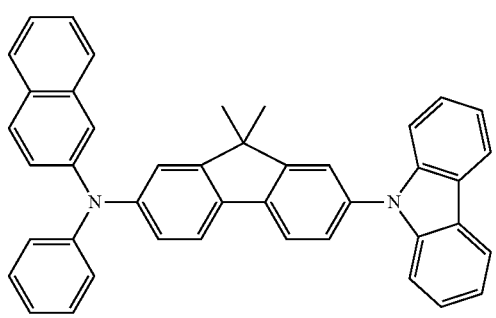

-continued
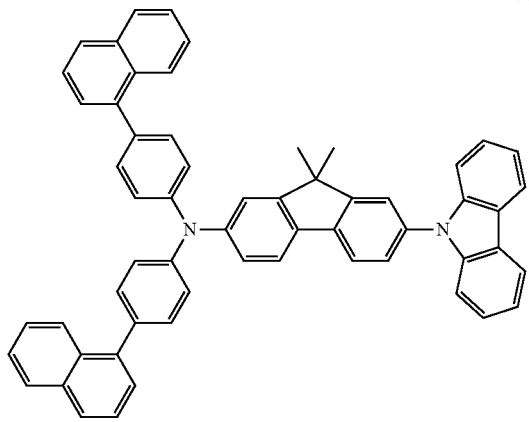
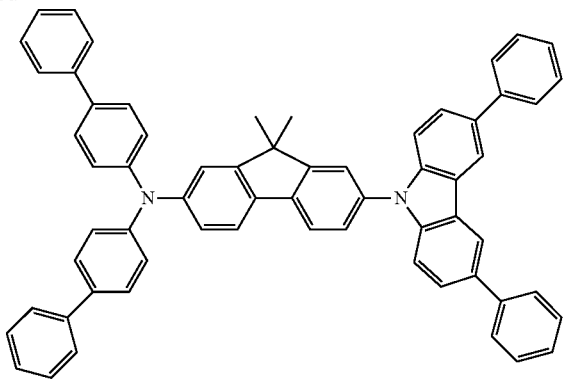
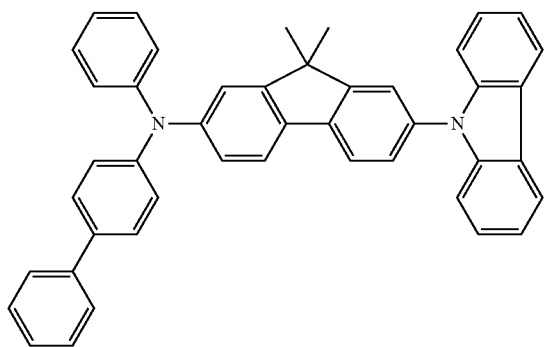
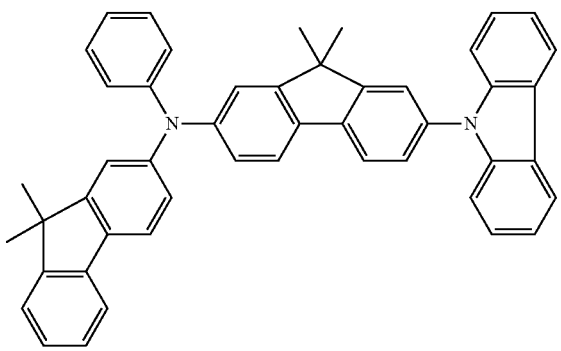
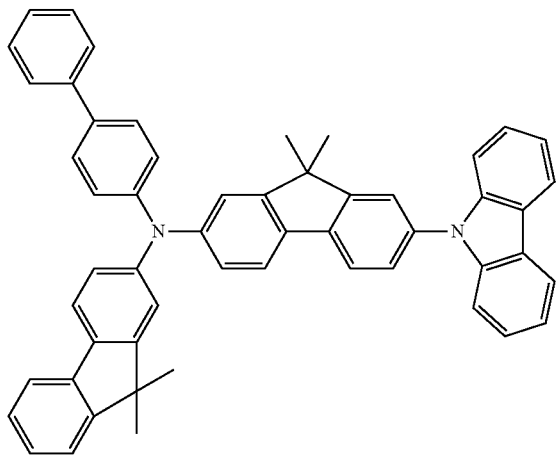
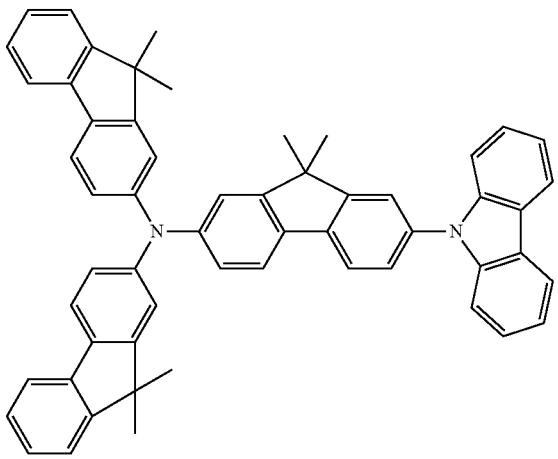
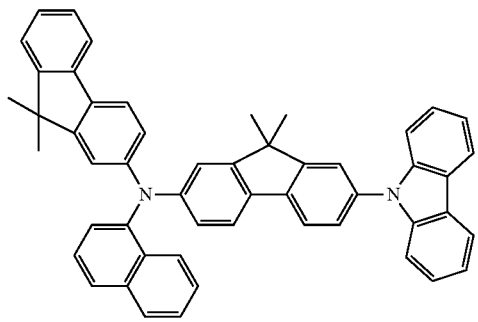
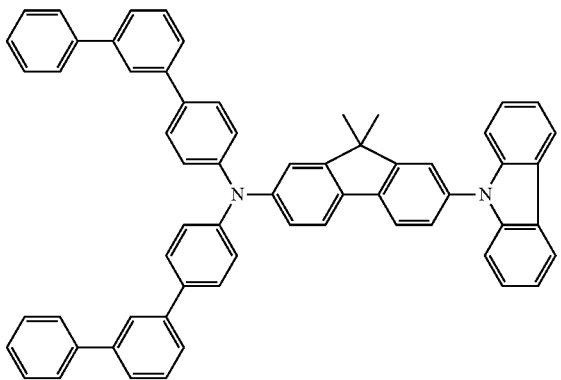

-continued
| 75 | 76 |
|---|---|
| 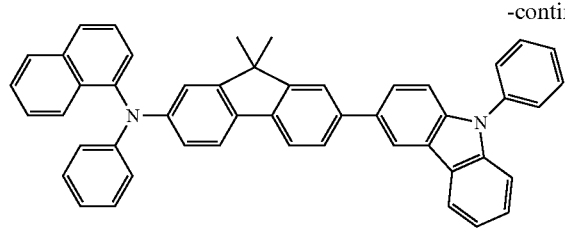 | 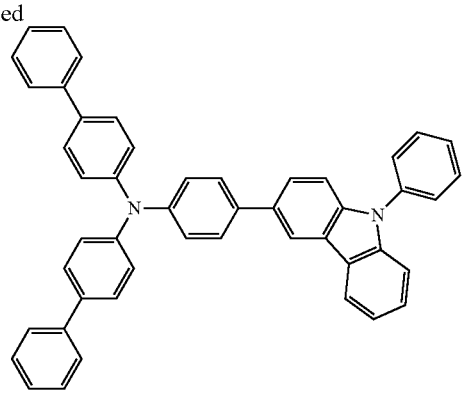 |
| 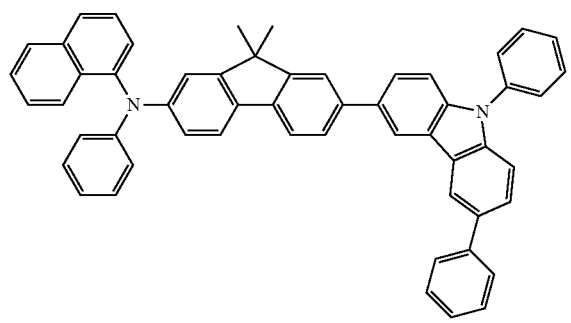 | 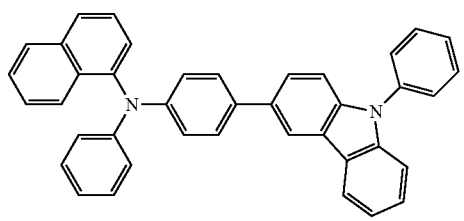 |
| 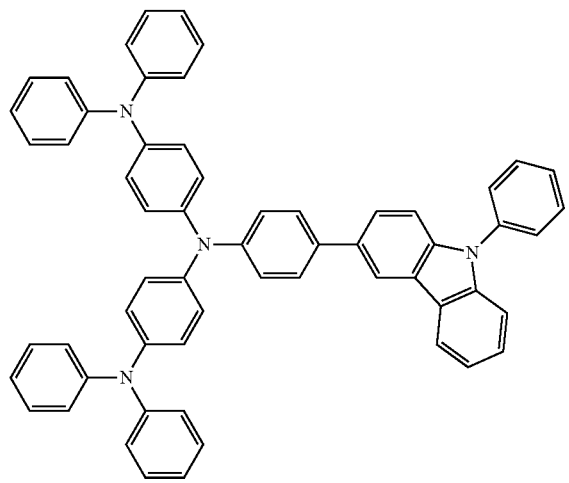 | 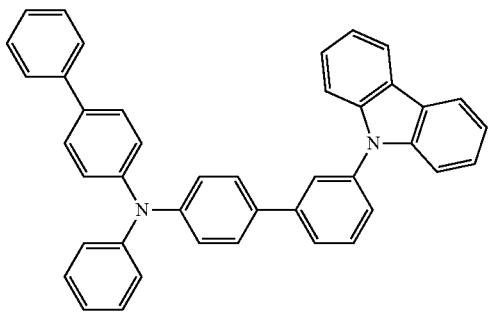 |
| 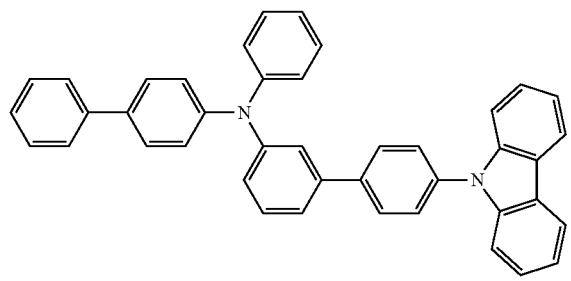 | 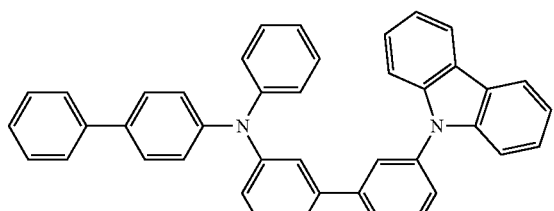 |

-continued
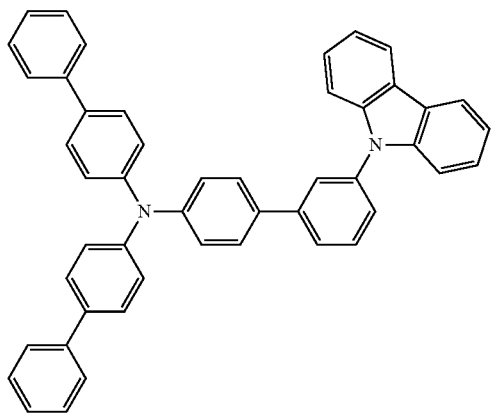
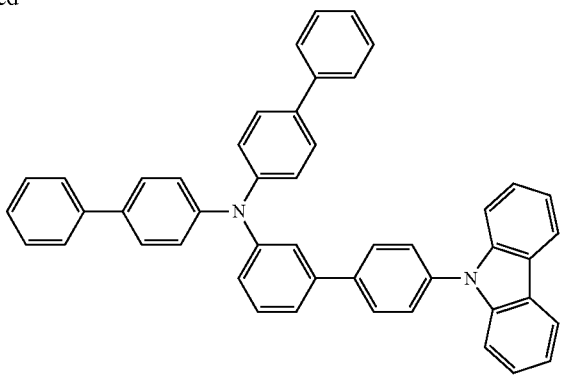
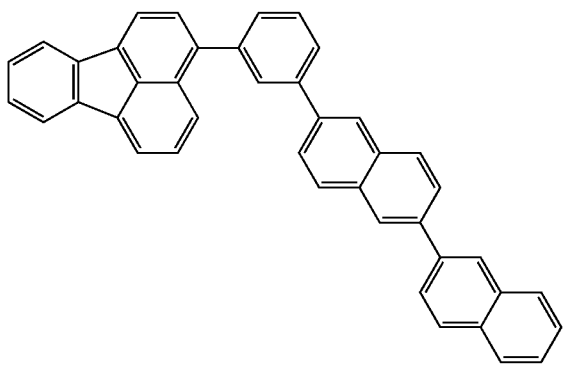
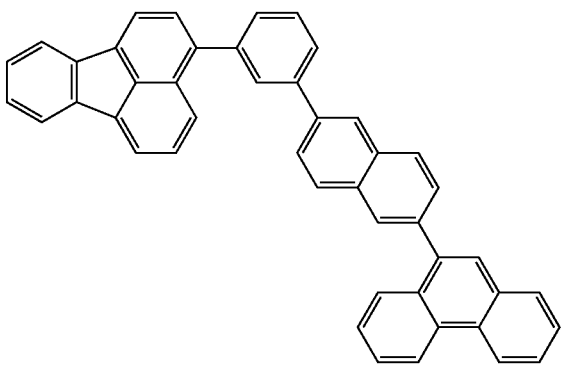
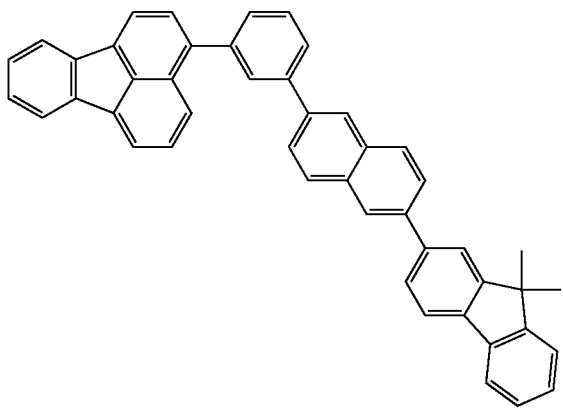
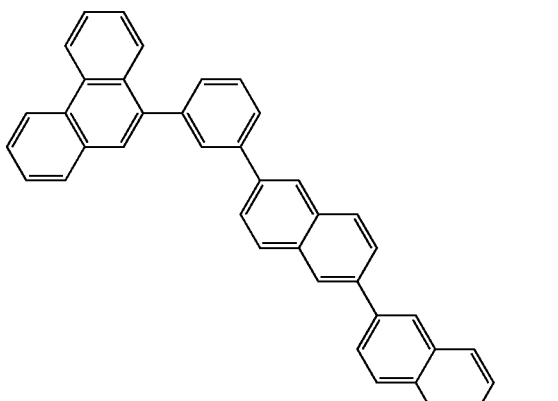
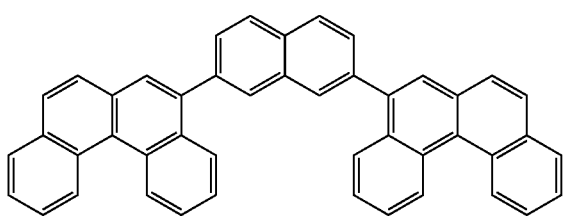
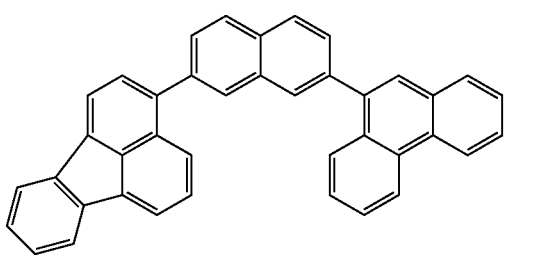
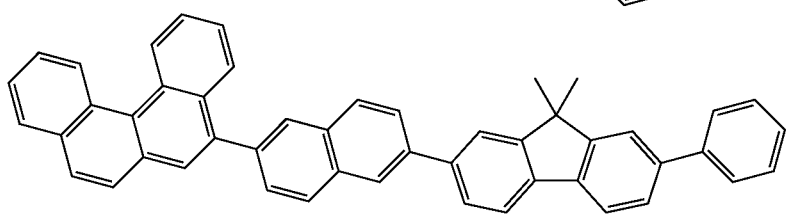

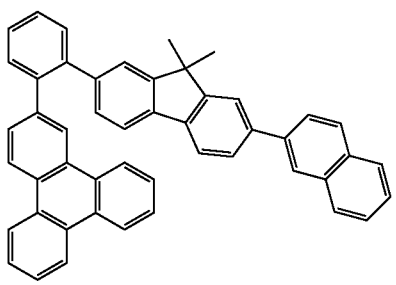
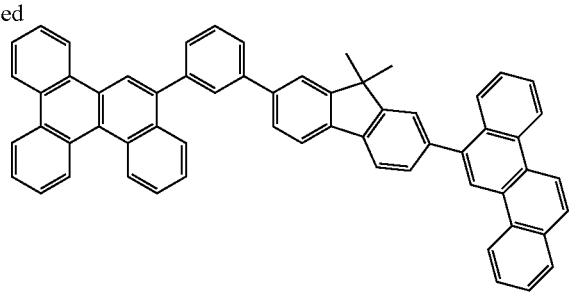
Further, examples of the host material of the emitting layer are shown below.
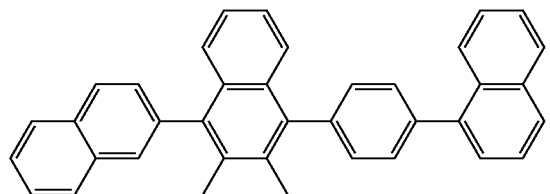
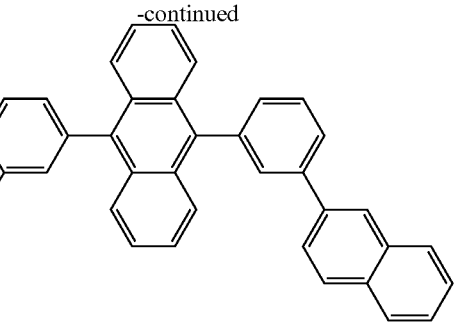
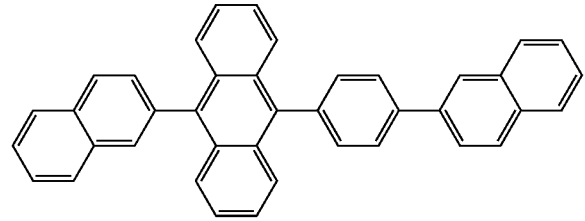
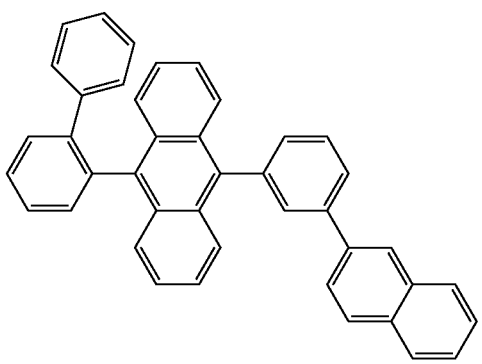
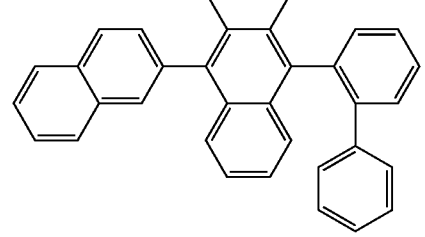
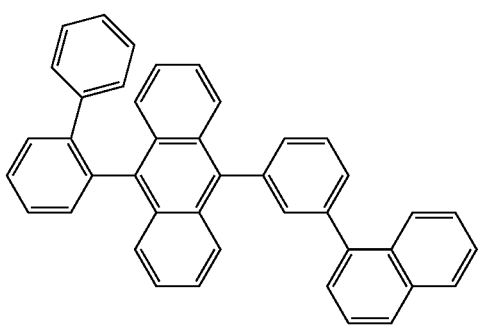
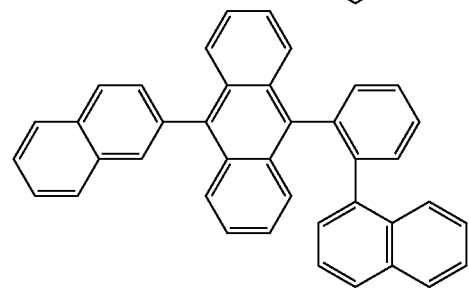
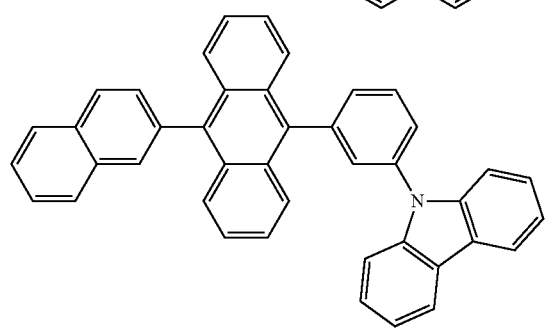
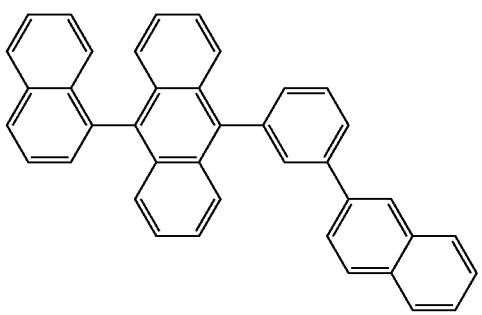

-continued
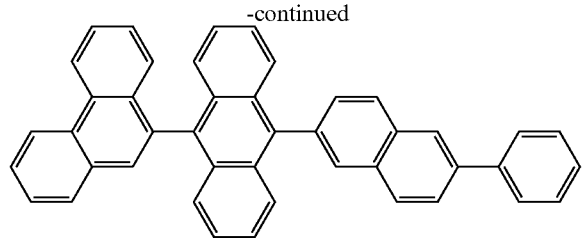
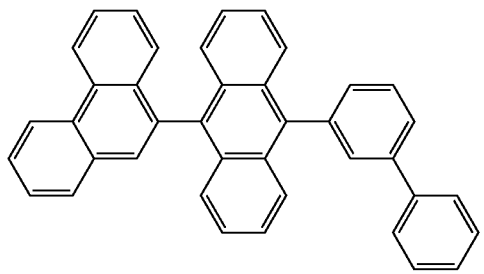
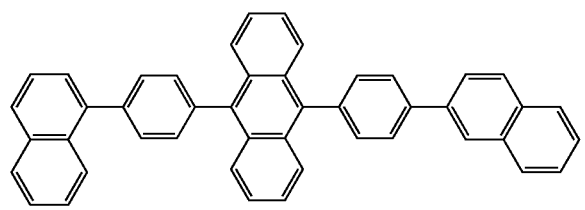
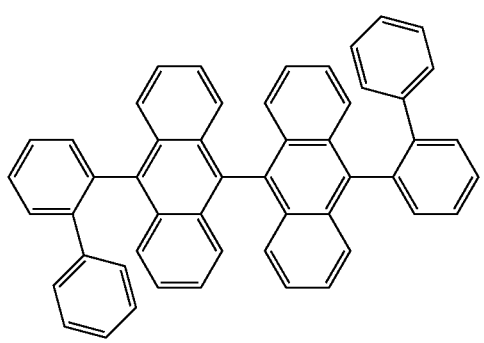
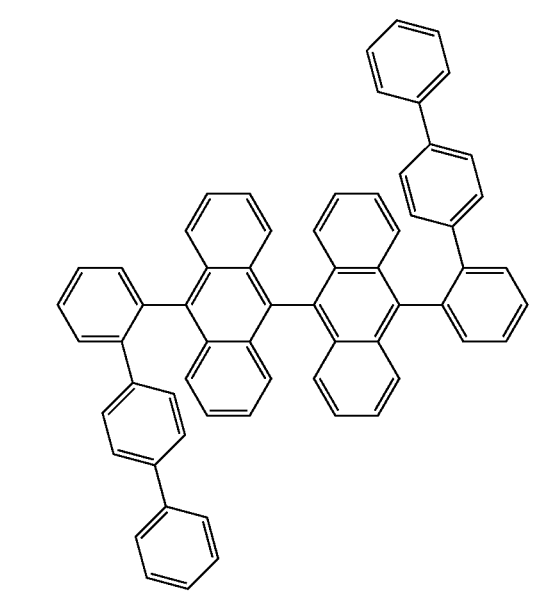
-continued
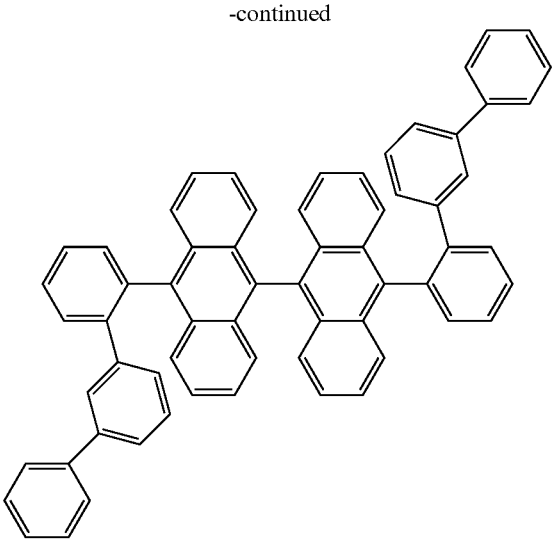
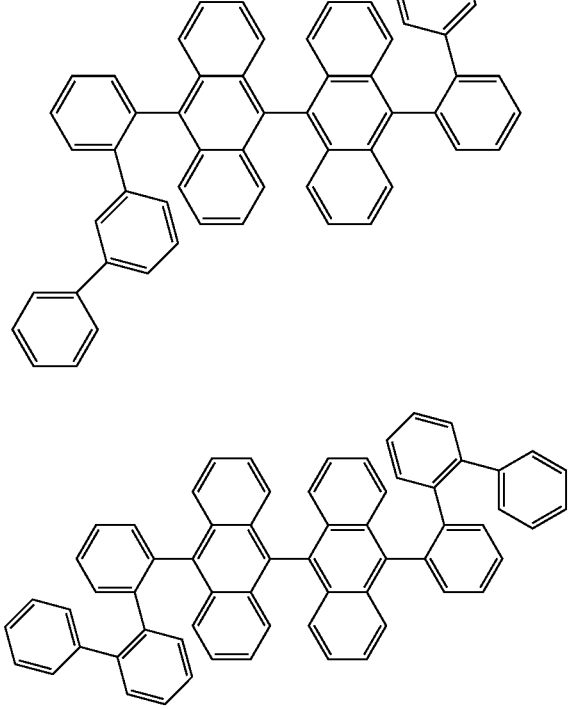
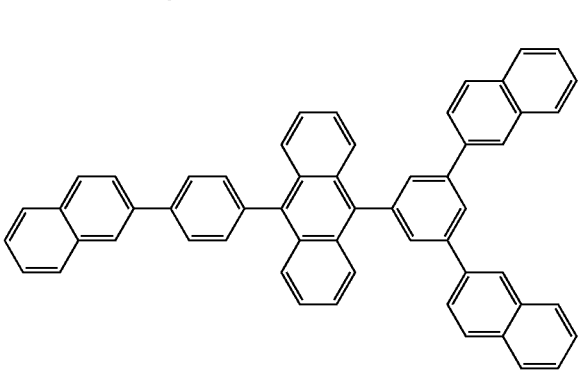
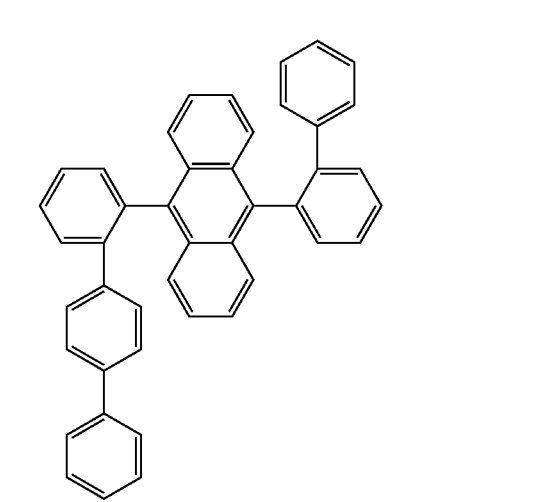

-continued
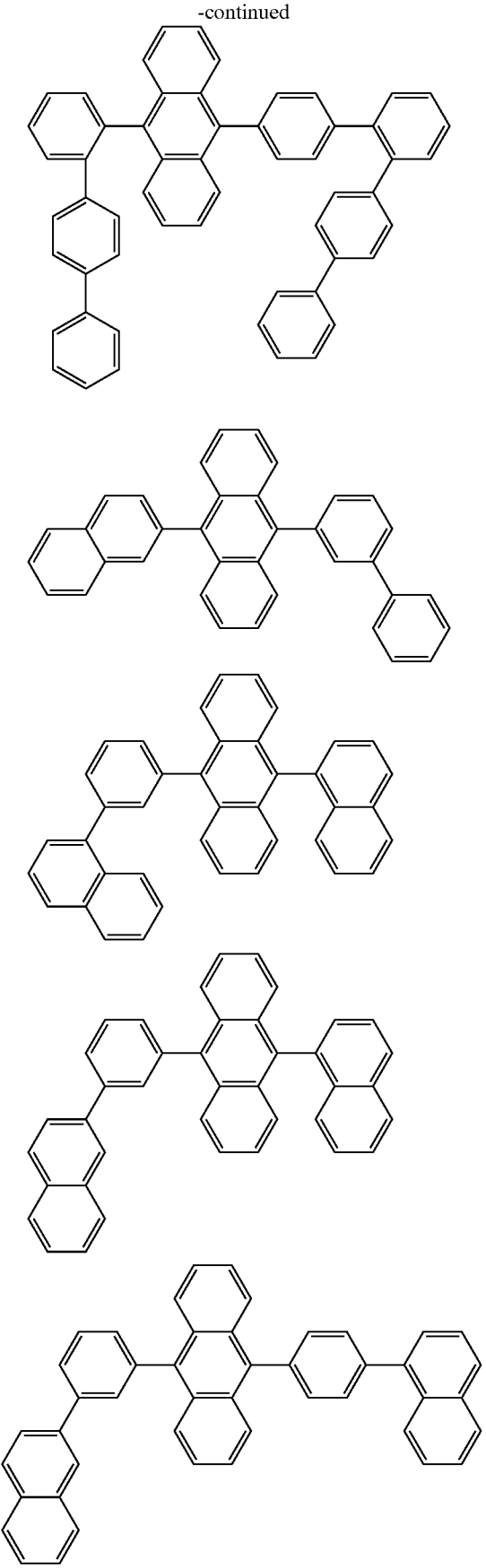
-continued
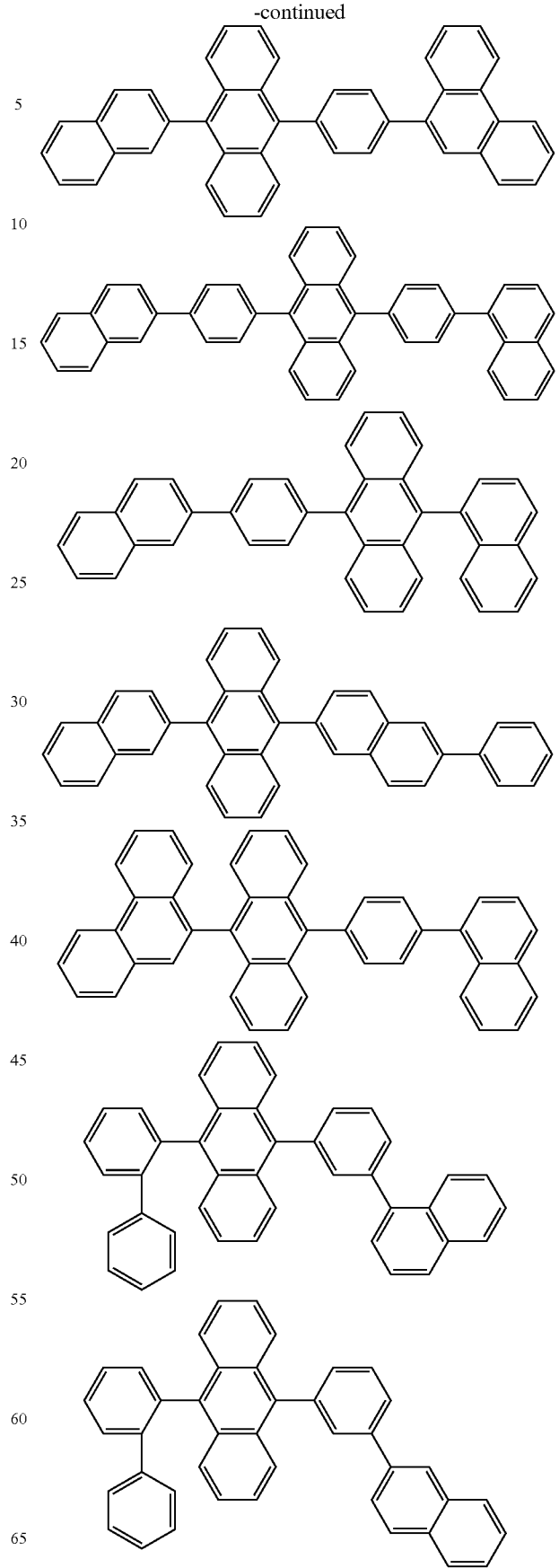

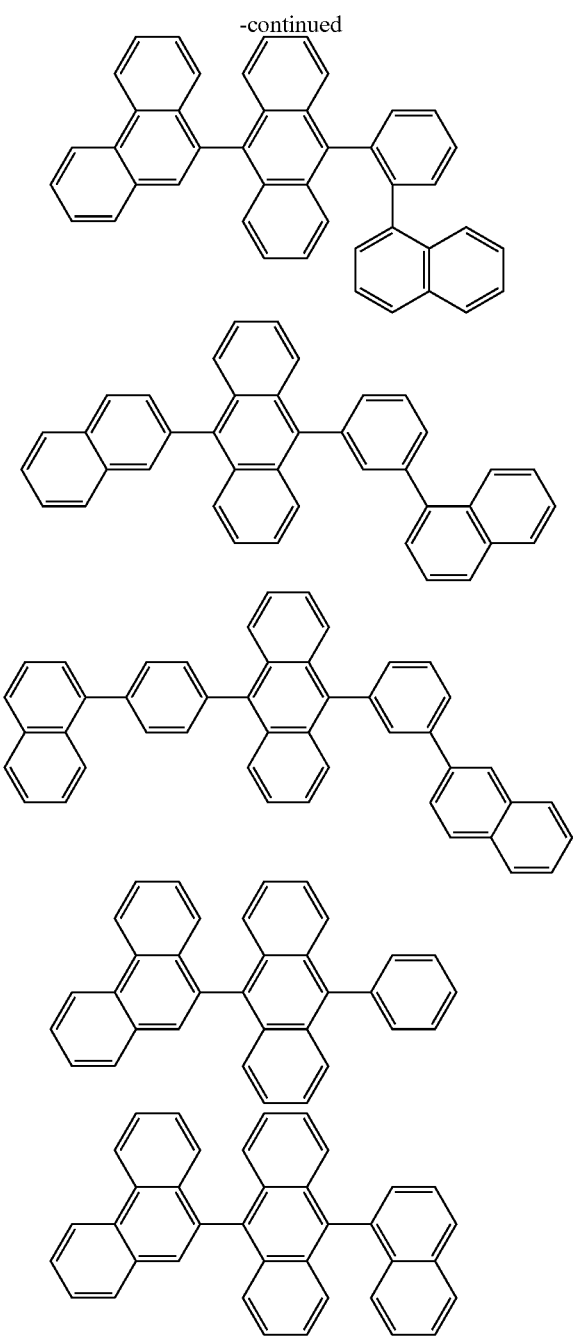
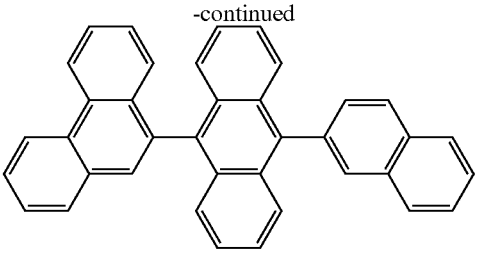
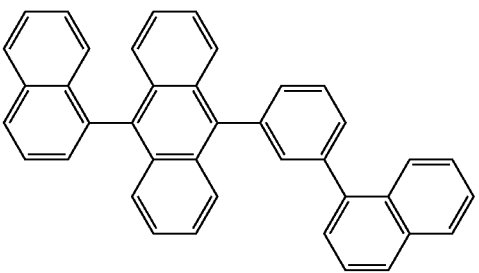

The compounds exemplified above are not used only as a host material or a co-host material of the emitting layer, and may be appropriately contained in other organic layers constituting the organic electroluminescence device.

(Guest (Dopant) Material of Emitting Layer)

The emitting layer is a layer that comprises a substance that has excellent luminous property, and various materials can be used therefor. As the substance having high luminous property, a fluorescent compound that emits fluorescent light or a phosphorescent compound that emits phosphorescent light can be used. A fluorescent compound is a compound that can emit light from the singlet excited state, and a phosphorescent compound is a compound that can emit light from the triplet excited state.

As the blue-emitting fluorescent material (guest or dopant) that can be used in the emitting layer, pyrene derivatives, styrylamine derivatives, chrysene derivatives, fluoranthene derivatives, fluorene derivatives, diamine derivatives, triarylamine derivatives or the like can be used. As the green-emitting fluorescent material that can be used in the emitting layer, aromatic amine derivatives or the like can be used. As the red-emitting fluorescent material that can be used in the emitting layer, tetracene derivatives, diamine derivatives or the like can be used.

As the fluorescent dopant material, the following can be exemplified.

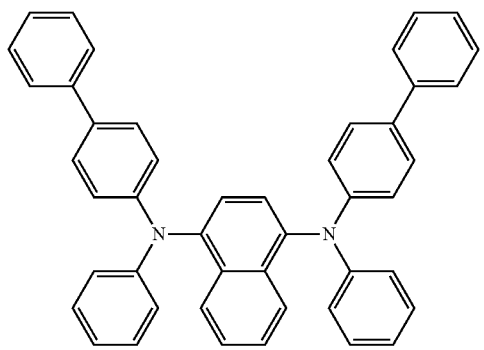
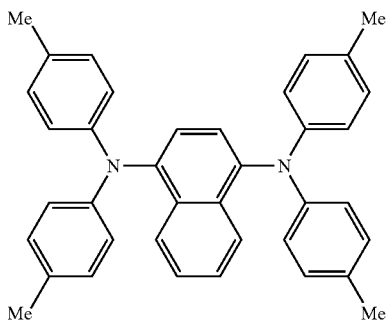

87
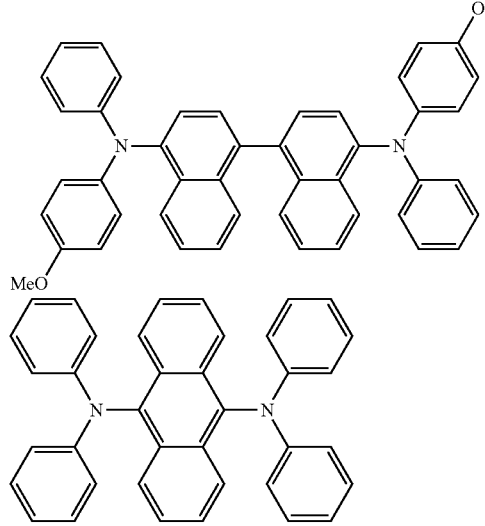
88
-continued
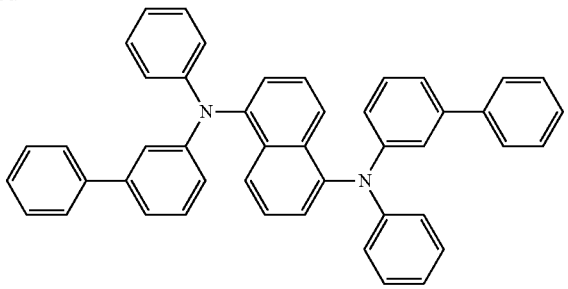
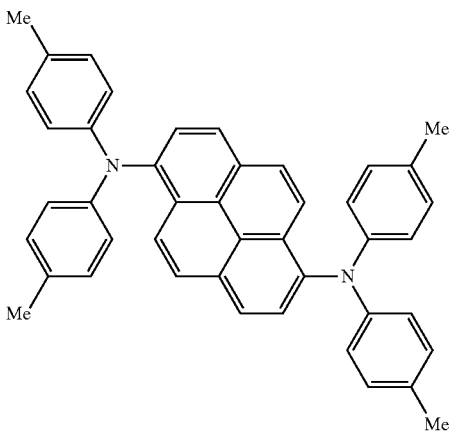
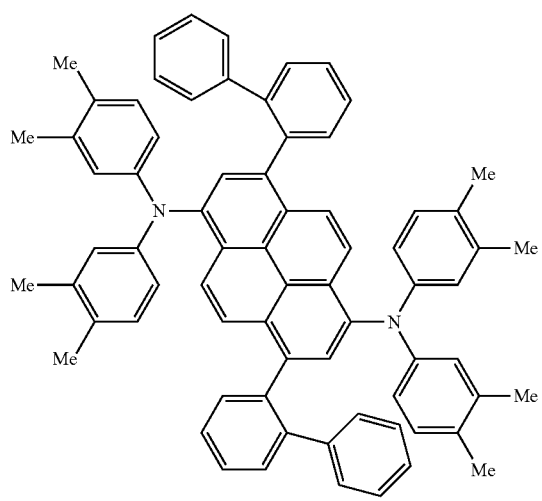
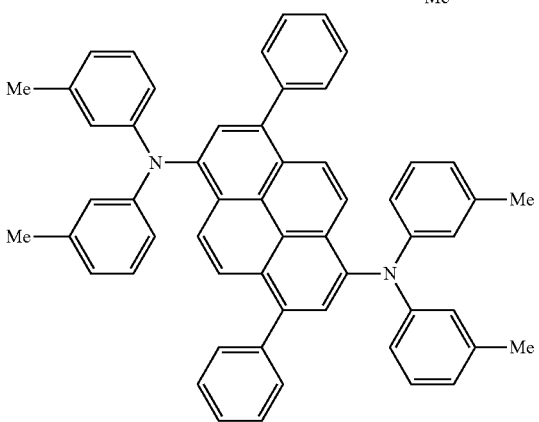
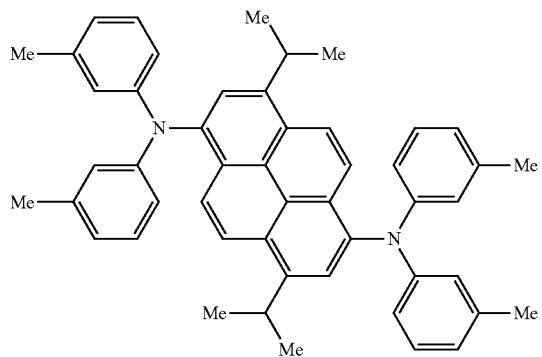
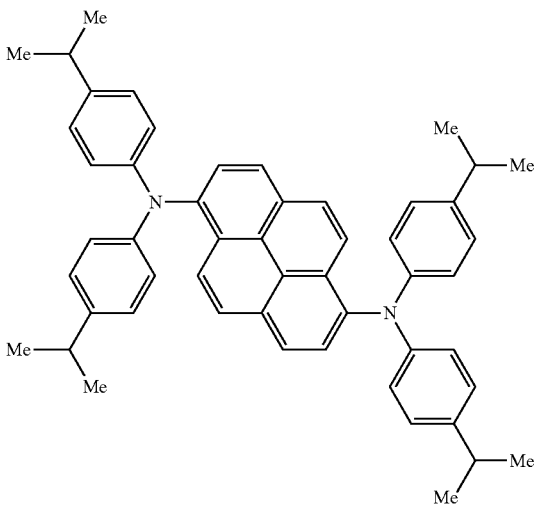

-continued
| 89 | 90 |
|---|---|
| 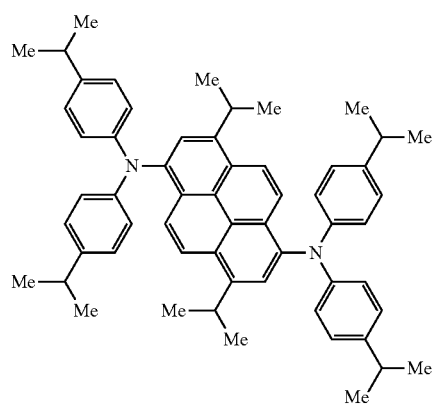 | 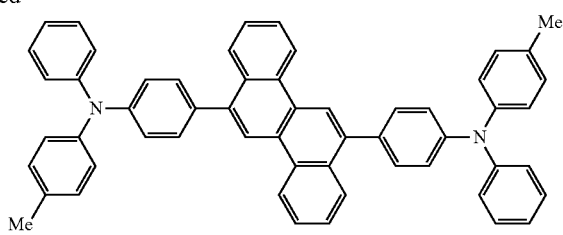 |
| 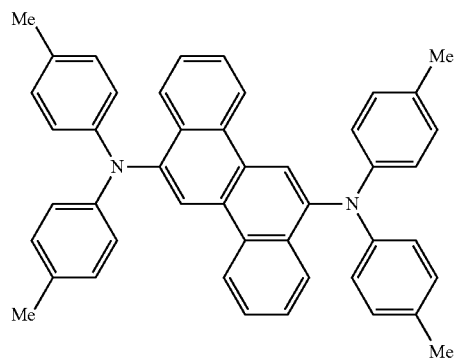 | 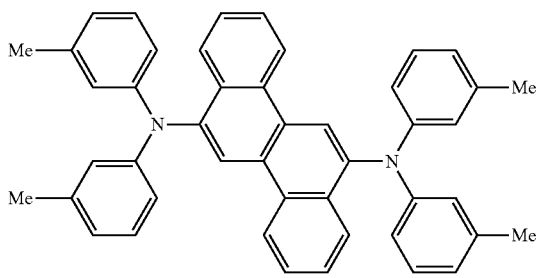 |
| 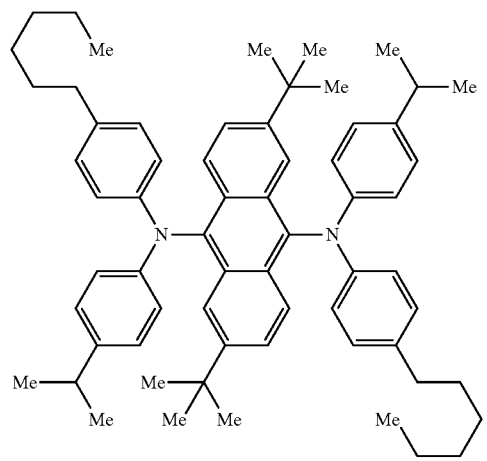 | 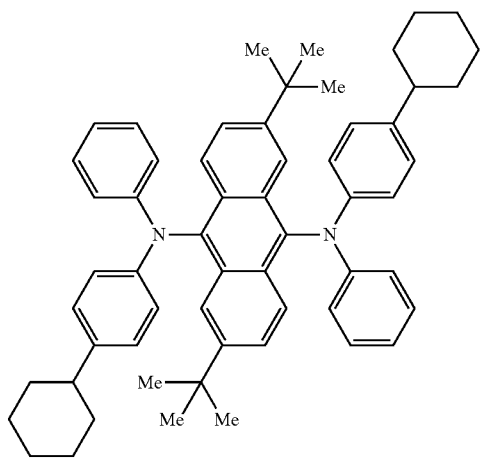 |
| 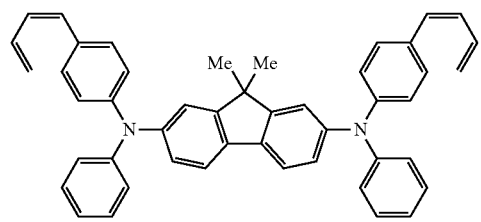 | 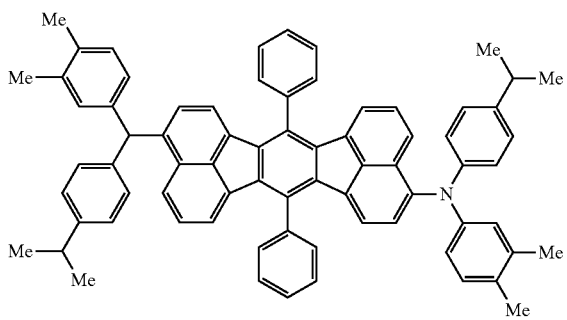 |

91
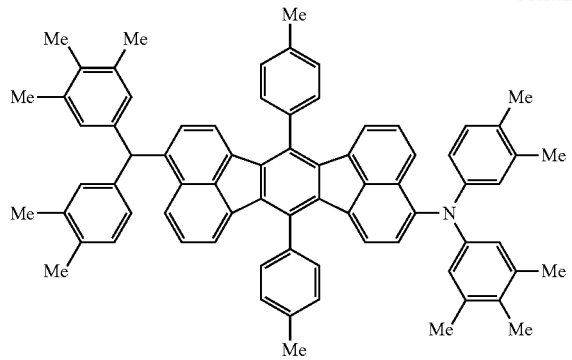
92
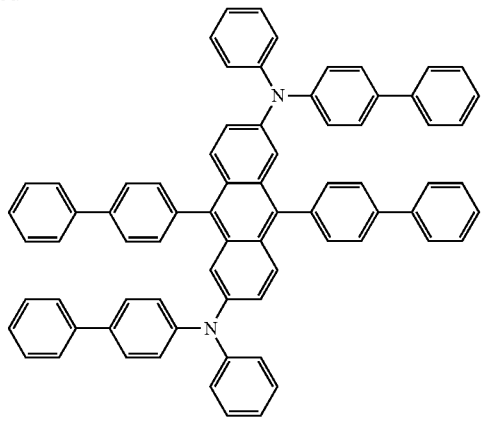
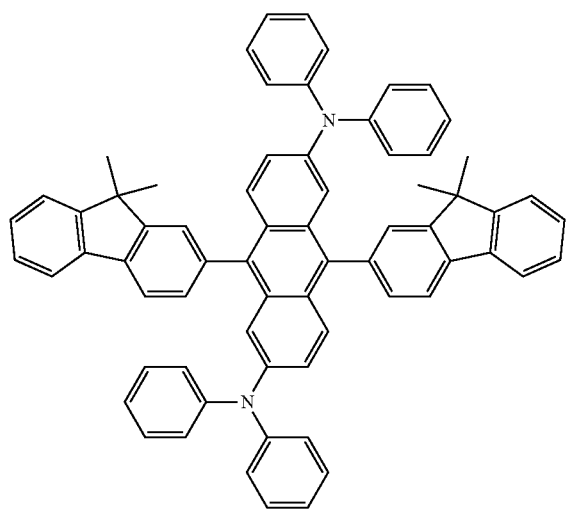
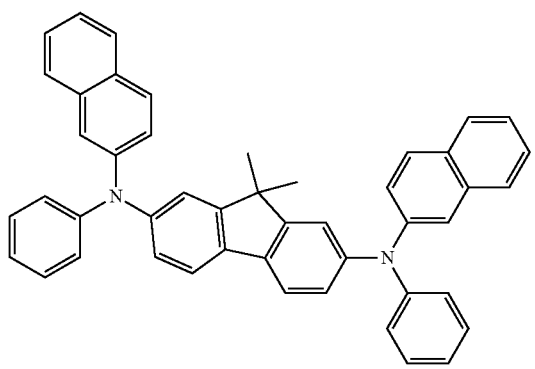
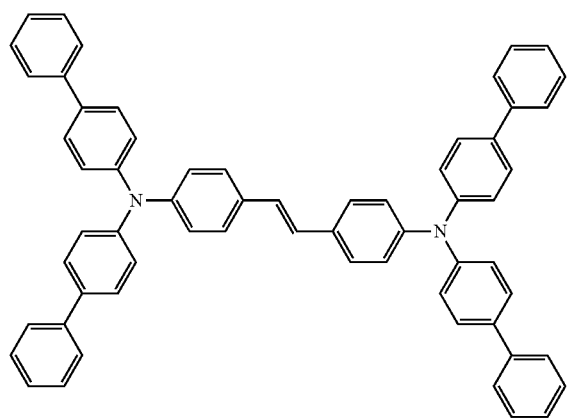
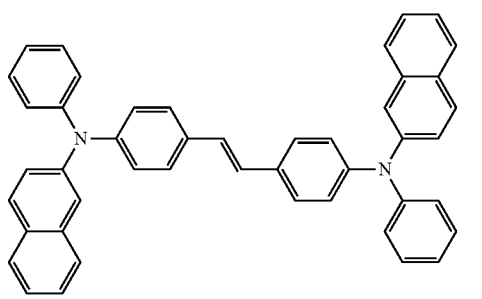

-continued
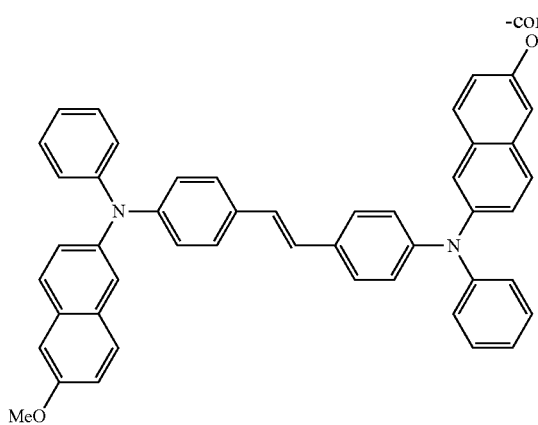
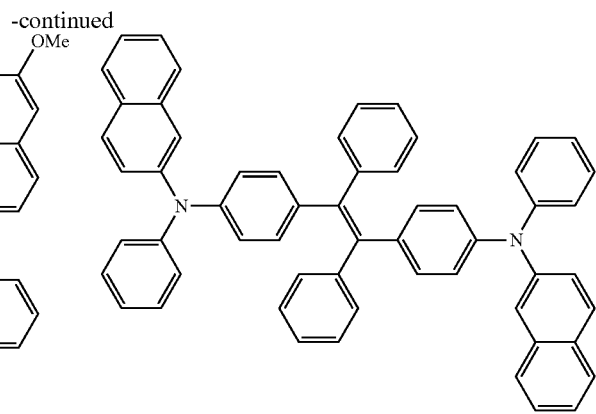
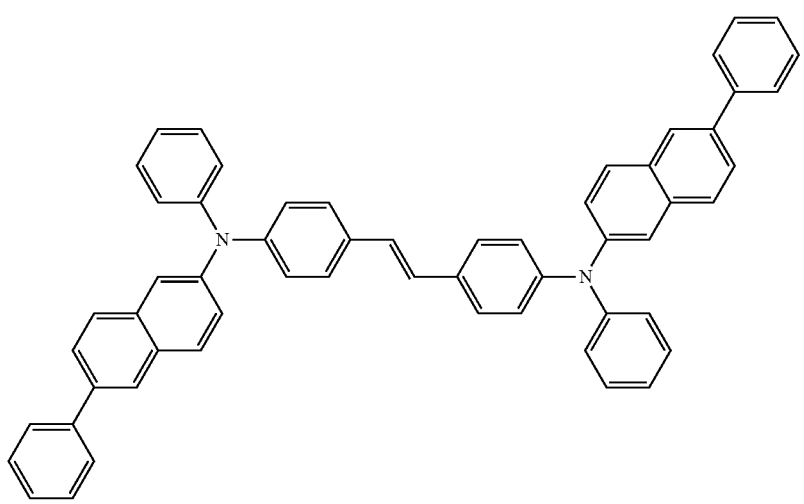
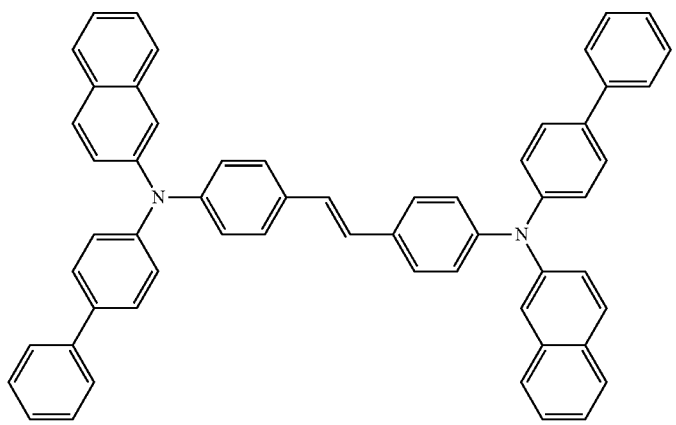
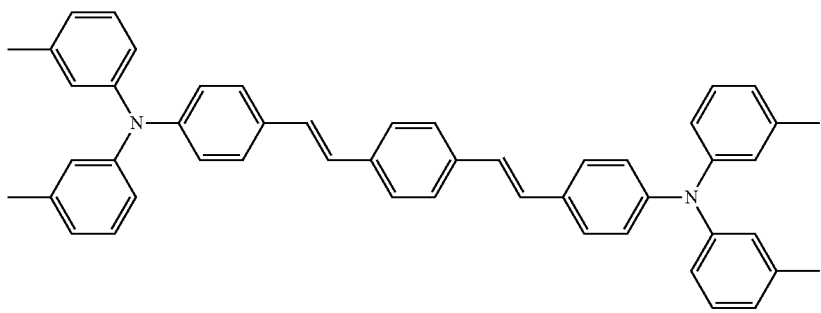

-continued
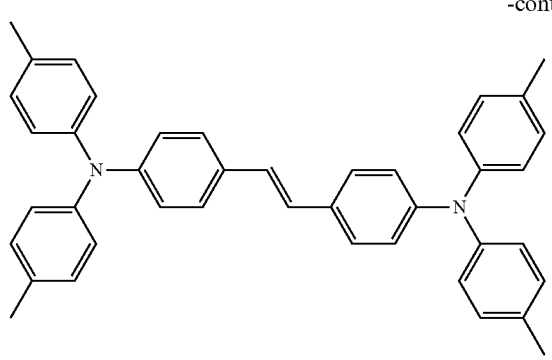
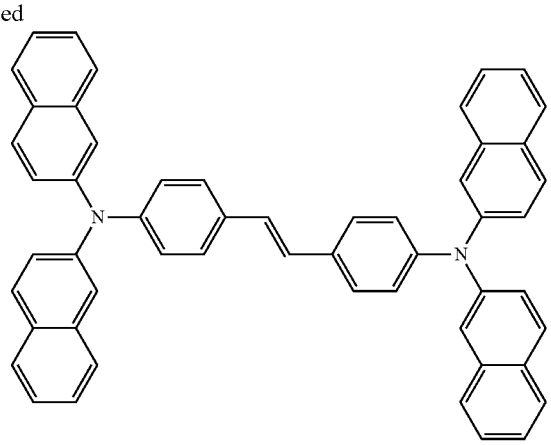
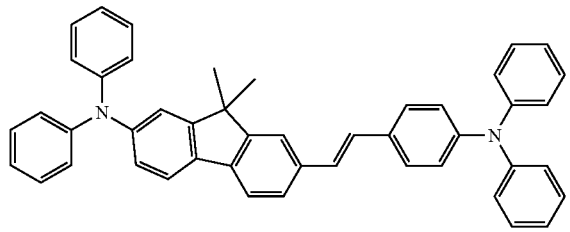
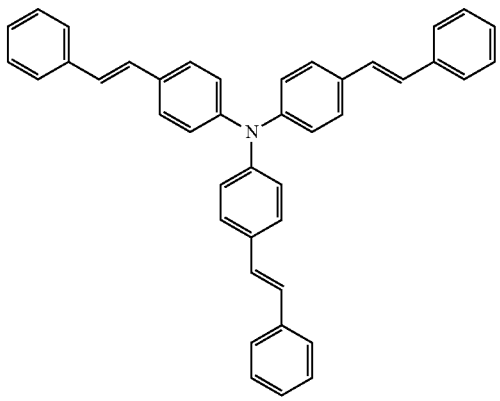
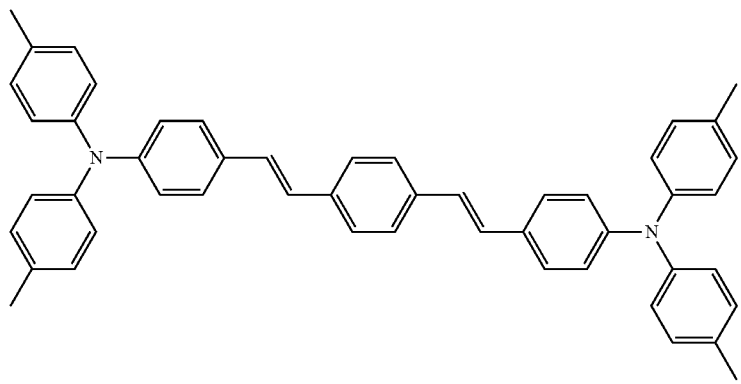
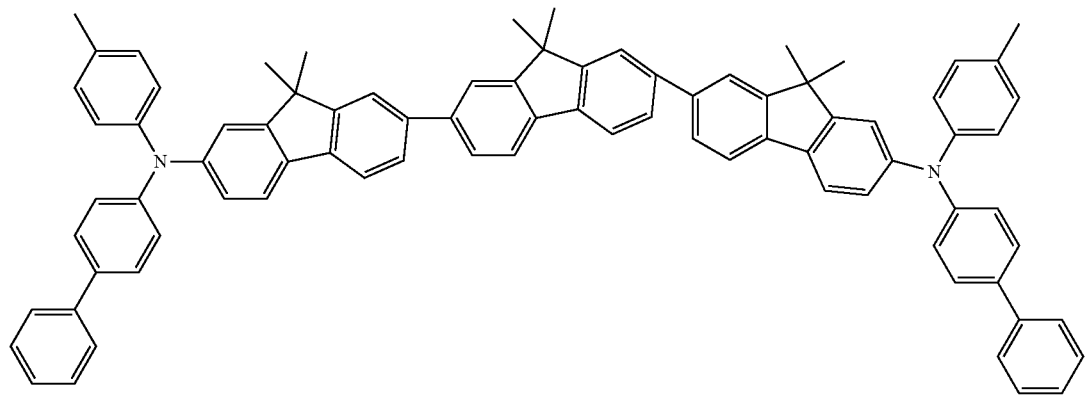

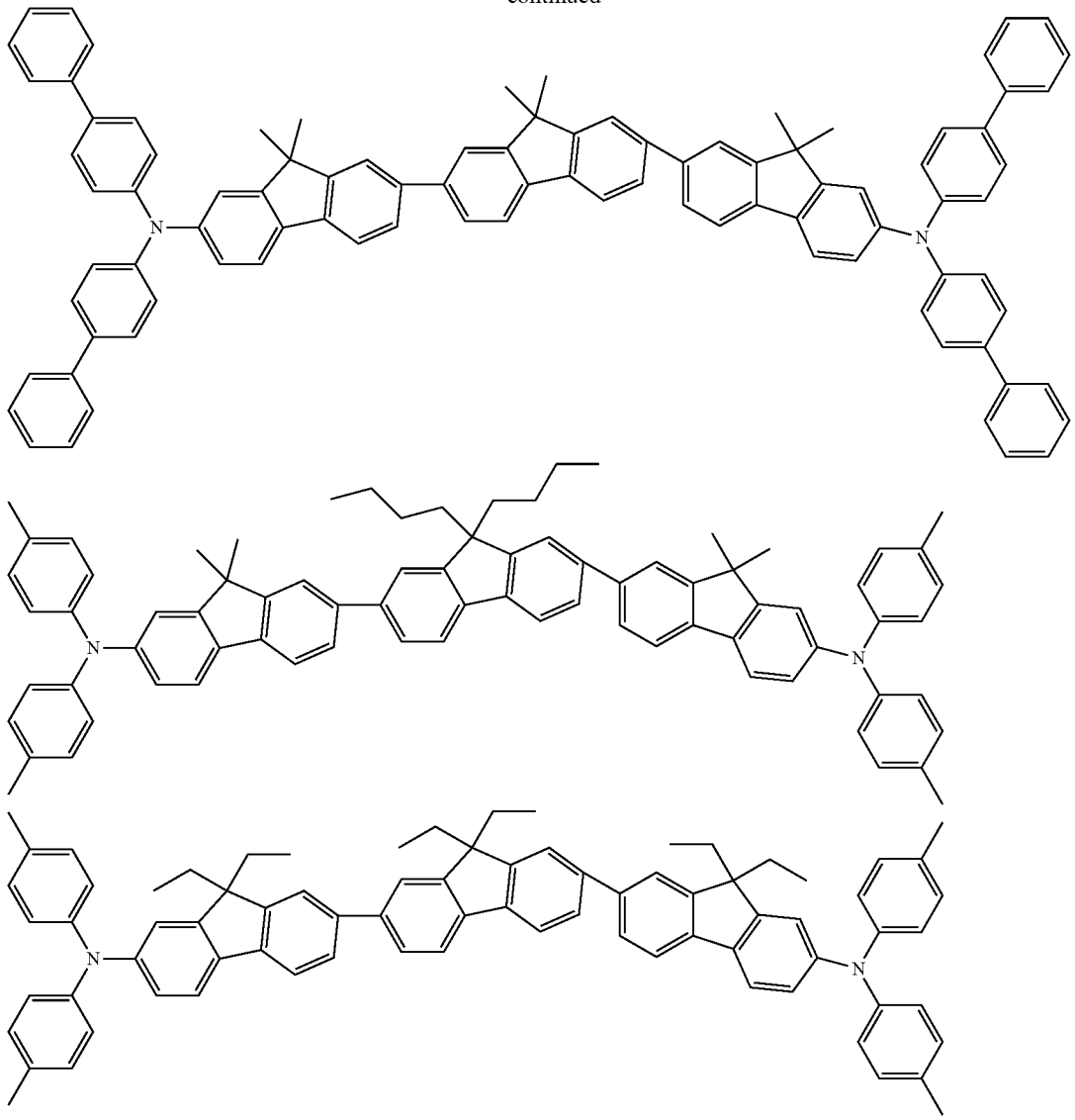

As the phosphorescent emitting material (guest or dopant) that can be used in the emitting layer, in respect of high phosphorescent quantum yield and capability of further improving the external quantum efficiency of the emitting device, a compound containing iridium (Ir), osmium (Os), ruthenium (Ru) or platinum (Pt) is preferable. Metal complexes such as iridium complexes, osmium complexes, ruthenium complexes and platinum complexes are further preferable. Among these, iridium complexes and platinum complexes are more preferable. Ortho-metalated complexes of a metal atom selected from iridium, osmium and platinum are most preferable.

(Electron-Transporting Layer)

The electron-transporting layer is a layer that comprises a substance having high electron-transporting property. In the electron-transporting layer, the following can be used: 1) metal complexes such as aluminum complexes, beryllium complexes and zinc complexes; 2) heteroaromatic compounds such as imidazole derivatives, benzoimidazole derivatives, azine derivatives, carbazole derivatives and phenanthroline derivatives; and 3) polymer compounds.

(Electron-Injecting Layer)

The electron-injecting layer is a layer that comprises a substance having high electron-injecting property. In the electron-injecting layer, alkali metals, alkaline earth metals or compounds thereof such as lithium (Li), lithium fluoride (LiF), cesium fluoride (CsF), calcium fluoride ($CaF_2$) and lithium oxide (LiOx) can be used.

(Cathode)

In the cathode, it is preferable to use metals, alloys or electric conductive compounds having a small work function (specifically, 3.8 eV or less), and mixtures thereof. As specific examples of the cathode material, elements belonging to the group 1 or group 2 of the periodic table (i.e. alkali metals such as lithium (Li) and cesium (Cs) and alkaline earth metals such as magnesium (Mg)), alloys containing these (e.g. MgAg, AlLi), and rare earth metals and alloys containing these can be given.

The organic EL device of the invention can be driven at a low driving voltage. Preferably, a device that can be driven at a voltage of 7.0 V or less measured by a method mentioned in the Examples can be obtained.

The ink composition of the invention comprises the polymer represented by the above formula (1) and an organic semiconductor material.

As the organic semiconductor material, a material for an organic EL material, a material for an organic field effect transistor, a material for an organic thin film solar battery or the like can be given.

The ink composition of the invention normally contains a solvent. As the solvent, methyl ethyl ketone, ethanol, acetone, aliphatic hydrocarbon, glycol ether, higher alcohol or the like can be given.

When the emitting layer of the organic El device is produced by using the above-mentioned ink composition, for example, normally, the composition comprises a solvent, a host material, a dopant material and a polymer. The polymer used in the invention has thickening property and heat resistance, and does not adversely affect EL properties. The polymer can function as a thickening agent.

By using the ink composition of the invention, one layer of an organic semiconductor device can be produced by a wet method such as an ink jet method, a spin coating method and a gravure printing method. An ink jet method and a spin coating method are preferable. If the layer is produced by a wet method (printing method or coating method), highly efficient and energy saving production can be realized.

Due to the presence of the above-mentioned polymer, the thickening property of the ink is improved. Further, it is preferred that the polymer mentioned above have a Tg of 150° C. or higher. If the polymer has such a high Tg, the formed film has a high Tg.

EXAMPLES

Preparation Example 1 (Synthesis of 2,6-dimethylphenol (xylenol))

After firing 10 g of iron oxide at 450° C. for 3 hours, the iron oxide as fired, 50 g of phenol, 200 g of methanol and 100 g of water were placed in an autoclave and reacted at 360° C. for 15 minutes. After completion of the reaction, the product was collected by filtration, and 100 g of decane was added thereto. The organic phase was separated and dried with sodium sulfate, and then, subjected to distillation (131-135° C./100 mmHg) to obtain 49.5 g of 2,6-xylenol.

The measurement result of 400 MHz NMR indicated δ 2.2 ppm —$CH_3$, δ 4.6 ppm —OH and δ 6.7-6.9 Ar—H, and it was found that the compound obtained was the above-captioned substance.

Preparation Example 2 (Polymerization of 2,6-dimethylphenol)

In a 500 mL-flask equipped with a stirrer, a thermometer and an oxygen introduction tube, 12.0 g of 2,6-xylenol obtained in Preparation Example 1, 60 mL of toluene, 0.1 g of cuprous chloride and 10 mL of pyridine were placed and stirred at 30° C. for 120 minutes while introducing oxygen. After completion of the reaction, the reaction solution was poured into 1 L of methanol solution containing 5 g of hydrochloric acid to precipitate a polymer. The polymer was dissolved in toluene, again poured into 1 L of methanol solution containing 5 g of hydrochloric acid to precipitate a polymer. The polymer was dissolved in 500 mL of methylene chloride, and 120 mL of methanol was added thereto. Subsequently, the solution was heated at 60° C. and left at rest. After cooling, the polymer separated was subjected to reprecipitation with methanol to obtain 5.4 g of 2,6-dimethyl-1,4-phenylene ether (P1). As a result of GPC measurement, it was found that the Mw of this polymer in terms of polystyrene was 94000, and Mw/Mn=2.33.

Preparation Example 3 (Terminal Modification of poly2,6-dimethyl-1,4-phenylene ether)

3.0 g of poly2,6-dimethyl-1,4-phenylene ether obtained in Preparation Example 2 was dissolved in 30 mL of methylene chloride, and 1.0 g of triethylamine and 1.0 g of benzoyl chloride were added thereto, followed by stirring at room temperature for 1 hour. Deposited salt was separated by filtration, a polymer was precipitated with methanol, and then washed with methanol. 2.9 g of poly2,6-dimethyl-1,4-phenylene ether (PX1) modified in the terminal was obtained.

It was found that a benzoyl group was introduced because new peaks were observed at δ 8.1 ppm, 7.7 ppm and 7.5 ppm, and no peak was observed at 4 to 5 ppm in the 400 MHz NMR measurement result.

Preparation Example 4 (Synthesis of 2,6-dimethoxyphenol)

A flask was charged with 32 g of 1,2,3-trimethoxybenzene (product manufactured by Tokyo Chemical Industry Co., Ltd.), 100 mL of chloroform and 44 g of iodide trimethylsilane, and stirred at room temperature for 48 hours. After the reaction, diethyl ether was added thereto, and the resultant solution was washed with water three times, followed by drying with magnesium sulfate, and diethyl ether was distilled to obtain a solid. The solid was subjected to recrystallization by using acetone to obtain 28 g of 2,6-dimethoxyphenol. The measurement result of 400 MHz NMR indicated δ 3.6 ppm —$OCH_3$, δ 6.1 ppm —OH, δ 6.4-6.9 Ar—H, and it was found that the compound obtained was the above-captioned substance.

Preparation Example 5 (Polymerization of 2,6-dimethoxyphenol)

In a 300 mL-flask equipped with a stirrer, a thermometer and an oxygen introduction tube, 5.0 g of 2,6-dimethoxyphenol obtained in Preparation Example 4, 30 mL of toluene, 0.1 g of cuprous chloride and 50 mL of pyridine were placed and stirred at 30° C. for 6 hours while introducing oxygen. After completion of the reaction, the reaction solution was poured into 1 L of methanol solution containing 5 g of hydrochloric acid to precipitate a polymer. The polymer was dissolved in toluene, and again poured into 1 L of methanol solution containing 5 g of hydrochloric acid to precipitate the polymer. The polymer was dissolved in 300 mL of methylene chloride, and 60 mL of methanol was added thereto. Then, the solution was heated at 60° C. and left at rest. After cooling, the polymer separated was subjected to reprecipitation with methanol to obtain 3.1 g of poly2,6-dimethoxy-1,4-phenylene ether (P2). As a result of GPC measurement, it was found that the Mw of this polymer in terms of polystyrene was 22000, and Mw/Mn=2.82.

Preparation Example 6 (Terminal Modification of poly2,6-dimethoxy-1,4-phenylene ether)

3.0 g of poly2,6-dimethoxy-1,4-phenylene ether obtained in Preparation Example 5 was dissolved in 30 mL of methylene chloride, 1.0 g of triethylamine and 1.0 g of benzoylchloride were added thereto and the mixture was stirred at room temperature for 1 hour. Deposited salt was separated by filtration, a polymer was precipitated with methanol and washed with methanol. 2.2 g of poly2,6-dimethoxy-1,4-phenylene ether (PX2) modified in the terminal was obtained.

It was found that a benzoyl group was introduced because new peaks were observed at δ 8.1 ppm, 7.7 ppm and 7.5 ppm, and no peak was observed at 4 to 5 ppm in the 400 MHz NMR measurement result.

Preparation Example 7 (Synthesis of 2,6-diphenylphenol)

200 mL of cyclohexane was heated at 150° C. and stirred, and 5.0 g of potassium hydroxide was added thereto to carry out a reaction for 3 hours. After removal of KOH, 10 g of alumina containing 0.5% of platinum was added to the reaction solution and stirred with heat at 330° C. for 8 hours. After cooling, low-boiling point substances were removed by heating under reduced pressure, and recrystallization from toluene was carried out to obtain 11.5 g of 2,6-diphenylphenol (melting point: 103° C.).

The measurement result of 400 MHz NMR indicated δ 5.4 ppm —OH and δ 7.1-7.5 Ar—H, and it was found that the compound obtained was the above-captioned substance.

Preparation Example 8 (Polymerization of 2,6-diphenylphenol)

In a 300 mL-flask equipped with a stirrer, a thermometer and an oxygen introduction tube, 5.0 g of 2,6-diphenylphenol obtained in Preparation Example 7 (product manufactured by Tokyo Chemical Industry Co., Ltd.), 30 mL of toluene, 0.1 g of cuprous chloride and 50 mL of pyridine were placed and stirred at 30° C. for 6 hours while introducing oxygen. After completion of the reaction, the reaction solution was poured into 1 L of methanol solution containing 5 g of hydrochloric acid to precipitate a polymer. The polymer was dissolved in toluene and again poured into 1 L of methanol solution containing 5 g of hydrochloric acid to precipitate the polymer. The polymer was dissolved in 300 mL of methylene chloride, 60 mL of methanol was added thereto, and then, the solution was heated at 60° C. and left at rest. The polymer separated was subjected to reprecipitation with methanol to obtain 3.3 g of poly2,6-diphenyl-1,4-phenylene ether (P3). As a result of GPC measurement, it was found that the Mw of this polymer in terms of polystyrene was 34000, and Mw/Mn=2.11.

Preparation Example 9 (Terminal Modification of poly2,6-diphenyl-1,4-phenylene ether)

3.0 g of poly2,6-diphenyl-1,4-phenylene ether obtained in Preparation Example 8 was dissolved in 30 mL of methylene chloride, 1.0 g of triethylamine and 1.0 g of benzoyl chloride were added thereto, and the mixture was stirred at room temperature for one hour. Deposited salt was separated by filtration, the polymer was precipitated with methanol, and then washed with methanol. 2.2 g of poly2,6-diphenyl-1,4-phenylene ether (PX3) modified in the terminal was obtained. It was found that a benzoyl group was introduced because new peaks were observed at δ 8.1 ppm, 7.7 ppm and 7.5 ppm, and no peak was observed at 4 to 5 ppm in the 400 MHz NMR measurement result.

Example 1

(Cleaning of Substrate)

A glass substrate of 25 mm by 25 mm by 1.1 mm thick with an ITO transparent electrode (manufactured by GEOMATEC Co., Ltd.) was subjected to ultrasonic cleaning with isopropyl alcohol for 5 minutes, and then subjected to UV-ozone cleaning for 5 minutes.

(Forming of Underlayer)

As a hole-transporting layer, CLEVIOUS AI4083 (product name) (poly(3,4-ethylenedioxythiophene)-poly(styrenesulfonate)) manufactured by HERAEUS and is represented below was formed into a film in a thickness of 30 nm on the ITO substrate by the spin coating method. After the film formation, unnecessary portion was removed with acetone, followed by firing on a hot plate at 200° C. for 10 minutes to prepare an underlayer.

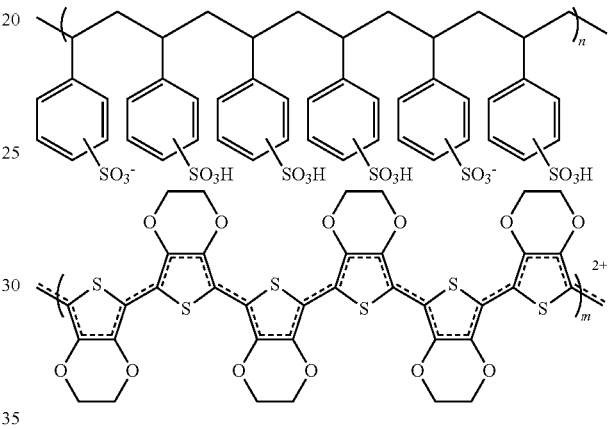

(Formation of Emitting Layer)

By the use of the below-mentioned Compound H-1 as a host material, the below-mentioned Compound D-1 as a dopant material, and Polymer PX1 obtained in Preparation Example 3, a 1.4 wt % toluene solution was prepared such that the weight ratio of Compound H-1:Compound D-1: Polymer PX1 became 70:20:10. The toluene solution was applied on the above-mentioned substrate with the underlayer to form a film in a thickness of 50 nm by the spin coating method. After the application, unnecessary portion was removed with toluene, and heated and dried on a hot plate at 150° C. to prepare a multi-layered substrate on which an emitting layer was formed. All the procedures for forming the emitting layer were carried out in a glove box under an atmosphere of nitrogen.

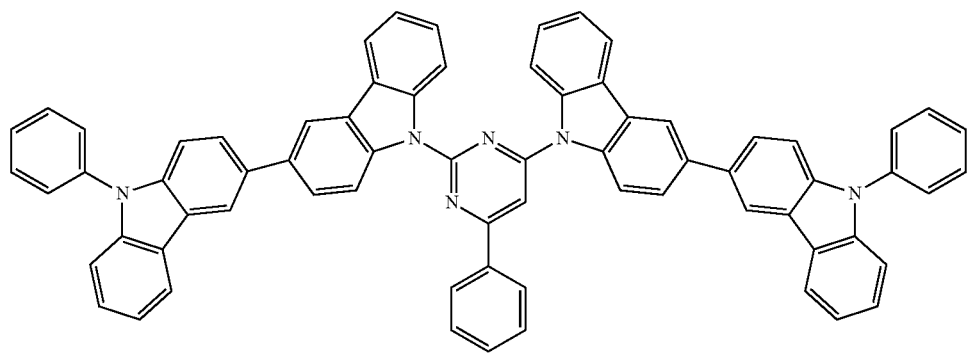

H-1

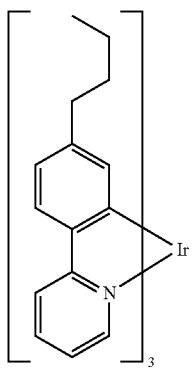

(Deposition and Sealing)

The multi-layered substrate was transferred into a deposition chamber, and the below-mentioned Compound ET-1 was deposited thereon in a thickness of 50 nm as an electron-transporting layer. Further, lithium fluoride and aluminum were sequentially deposited thereon in a thickness of 1 nm and 80 nm, respectively. After completion of all the deposition steps, sealing with a counter bored glass was conducted in a glove box under an atmosphere of nitrogen to fabricate an organic EL device.

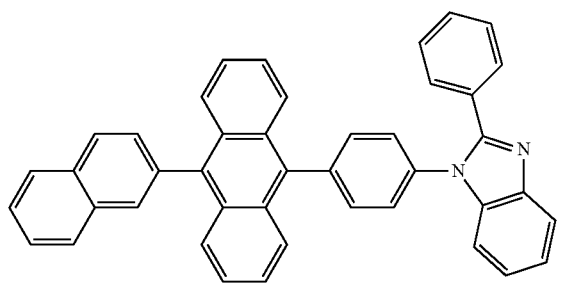

ET-1

(Evaluation of Device)

The resultant organic EL device was driven with a direct current in a voltage of 0 to 10 volt (in a unit of 0.1 volt) to emit light, the emission luminance was measured with a luminance meter, and a voltage at which light emission could be observed at 100 cd/m$^2$ was determined.

Further, a time when luminance decreased from the initial luminance of 1000 cd/m$^2$ to 500 cd/m$^2$ under constant current driving (luminance half time) was measured. Table 1 shows the results.

Example 2

A device was fabricated and evaluated in the same manner as in Example 1 except that PX2 obtained in Preparation Example 6 was used as the polymer for fabrication of the device. Table 1 shows the results.

Example 3

A device was fabricated and evaluated in the same manner as in Example 1 except that PX3 obtained in Preparation Example 9 was used as the polymer for fabrication of the device. Table 1 shows the results.

Comparative Example 1

A device was fabricated and evaluated in the same manner as in Example 1 except that P1 obtained in Preparation Example 2 was used as the polymer for fabrication of the device. Table 1 shows the results.

TABLE 1

|  | Voltage at emission | Luminance half time |
| --- | --- | --- |
| Example 1 | 5.4 V | 120 hrs |
| Example 2 | 6.2 V | 98 hrs |
| Example 3 | 5.8 V | 101 hrs |
| Comparative Example 1 | 5.8 V | 1 hr |

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The Japanese application specification claiming priority under the Paris Convention are incorporated herein by reference in its entirety.

The invention claimed is:

1. An organic electroluminescence device comprising:
an anode and a cathode; and
at least one organic thin film layer between the anode and the cathode,
wherein one of the organic thin film layer(s) comprises a polymer represented by the following formula (2):

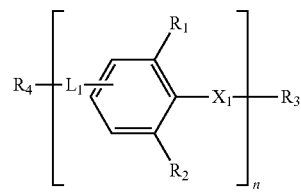

wherein in the formula (2),
R$_1$ and R$_2$ are independently a hydrogen atom, an alkyl group including 1 to 8 carbon atoms, a cycloalkyl group including 5 to 6 carbon atoms, an alkoxy group including 1 to 8 carbon atoms, an aryl group including 6 to 10 ring carbon atoms, an aryloxy group including 6 to 10 ring carbon atoms, a fluorine atom, a chlorine atom, an alkoxyalkyl group including 2 to 16 carbon atoms, a substituted or unsubstituted amino group or a substituted or unsubstituted mercapto group;

$R_1$ and $R_2$ may independently be bonded to another atom to form a ring or may be bonded to each other to form a ring;

$X_1$ is —O— or —S—;

$R_3$ is an alkyl group including 1 to 8 carbon atoms, a substituted or unsubstituted alkoxy group including 1 to 8 carbon atoms, a substituted or unsubstituted alkyl carbonyl group including 1 to 8 carbon atoms, a substituted or unsubstituted aryl group including 6 to 10 carbon atoms, a substituted or unsubstituted aryloxy group including 6 to 10 carbon atoms, a substituted or unsubstituted arylcarbonyl group including 6 to 10 carbon atoms or a substituted or unsubstituted aralkyl group including 7 to 20 carbon atoms;

$R_4$ is a hydrogen atom, an alkyl group including 1 to 8 carbon atoms, a substituted or unsubstituted alkoxy group including 1 to 8 carbon atoms, a substituted or unsubstituted alkyl carbonyl group including 1 to 8 carbon atoms, a substituted or unsubstituted aryl group including 6 to 10 carbon atoms, a substituted or unsubstituted aryloxy group including 6 to 10 carbon atoms, a substituted or unsubstituted arylcarbonyl group including 6 to 10 carbon atoms or a substituted or unsubstituted aralkyl group including 7 to 20 carbon atoms;

n is an integer of 10 to 3000;

$L_1$ is a single bond or a group represented by the following formula (2') or the following formula (3');

$$-L_{11}-L_{12}-L_{13}- \quad (2')$$

wherein in the formula (2'), $L_{11}$ is an alkylene group including 1 to 8 carbon atoms; $L_{12}$ is a single bond, —O— or —S— and $L_{13}$ is a single bond or an alkylene group including 1 to 8 carbon atoms; and $L_{11}$ is bonded to $R_4$;

$$-L_{14}-L_{15}-B-L_{16}- \quad (3')$$

wherein in the formula (3'), $L_{14}$ is a single bond or an alkylene group including 1 to 8 carbon atoms; $L_{15}$ is a single bond, —O— or —S—, B is a substituted or unsubstituted aromatic hydrocarbon ring or a substituted or unsubstituted aromatic heterocyclic ring; $L_{16}$ is a single bond, —O— or —S—, and $L_{14}$ is bonded to $R_4$.

2. The organic electroluminescence device according to claim 1, wherein $R_4$ is an alkyl group including 1 to 8 carbon atoms, a substituted or unsubstituted alkoxy group including 1 to 8 carbon atoms, a substituted or unsubstituted alkyl carbonyl group including 1 to 8 carbon atoms, a substituted or unsubstituted aryl group including 6 to 10 carbon atoms, a substituted or unsubstituted aryloxy group including 6 to 10 carbon atoms, a substituted or unsubstituted arylcarbonyl group including 6 to 10 carbon atoms or a substituted or unsubstituted aralkyl group including 7 to 20 carbon atoms.

3. The organic electroluminescence device according to claim 1, wherein $R_3$ and $R_4$ are independently a substituted or unsubstituted aryl group including 6 to 10 carbon atoms or a substituted or unsubstituted arylcarbonyl group including 6 to 10 carbon atoms.

4. The organic electroluminescence device according to claim 1, wherein $R_1$ and $R_2$ are independently a hydrogen atom, an alkyl group including 1 to 8 carbon atoms, a cycloalkyl group including 5 to 6 carbon atoms, an alkoxy group including 1 to 8 carbon atoms, an aryl group including 6 to 10 ring carbon atoms, an aryloxy group including 6 to 10 ring carbon atoms or an alkoxyalkyl group including 2 to 16 carbon atoms.

5. The organic electroluminescence device according to claim 1, wherein $R_1$ and $R_2$ are independently an alkyl group including 1 to 8 carbon atoms, an alkoxy group including 1 to 8 carbon atoms or an aryl group including 6 to 10 ring carbon atoms.

6. The organic electroluminescence device according to claim 1, wherein $X_1$ is —O—.

7. The organic electroluminescence device according to claim 1, wherein $L_1$ is a single bond.

8. The organic electroluminescence device according to claim 1, wherein a polymer represented by the formula (2) is a polymer represented by the following formula (3):

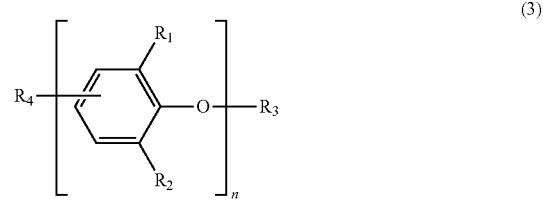

wherein in the formula (3), $R_1$ to $R_4$ and n are as defined for $R_1$ to $R_4$ and n in the formula (2).

9. The organic electroluminescence device according to claim 1, wherein the polymer represented by the formula (2) is a polymer represented by the following formula (4):

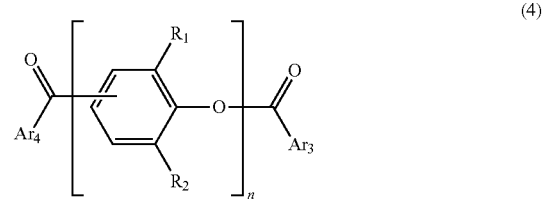

wherein in the formula (4), $R_1$, $R_2$ and n are as defined for $R_1$, $R_2$ and n in the formula (2); and $Ar_3$ and $Ar_4$ are independently an aryl group including 6 to 10 ring carbon atoms.

10. The organic electroluminescence device according to claim 1, wherein the layer comprising the polymer represented by the formula (2) is an emitting layer.

11. The organic electroluminescence device according to claim 1, wherein the layer comprising the polymer represented by the formula (2) comprises said polymer in an amount of 1 to 80 wt %.

12. An ink composition comprising the polymer represented by the following formula (2) and an organic semiconductor material;

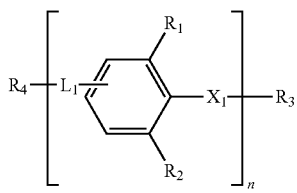
(2)

wherein in the formula (2), $R_1$ and $R_2$ are independently a hydrogen atom, an alkyl group including 1 to 8 carbon atoms, a cycloalkyl group including 5 to 6 carbon atoms, an alkoxy group including 1 to 8 carbon atoms, an aryl group including 6 to 10 ring carbon atoms, an aryloxy group including 6 to 10 ring carbon atoms, a fluorine atom, a chlorine atom, an alkoxyalkyl group including 2 to 16 carbon atoms, a substituted or unsubstituted amino group or a substituted or unsubstituted mercapto group;

$R_1$ and $R_2$ may independently be bonded to another atom to form a ring or may be bonded to each other to form a ring;

$X_1$ is —O— or —S—;

$R_3$ is an alkyl group including 1 to 8 carbon atoms, a substituted or unsubstituted alkoxy group including 1 to 8 carbon atoms, a substituted or unsubstituted alkyl carbonyl group including 1 to 8 carbon atoms, a substituted or unsubstituted aryl group including 6 to 10 carbon atoms, a substituted or unsubstituted aryloxy group including 6 to 10 carbon atoms, a substituted or unsubstituted arylcarbonyl group including 6 to 10 carbon atoms or a substituted or unsubstituted aralkyl group including 7 to 20 carbon atoms;

$R_4$ is a hydrogen atom, an alkyl group including 1 to 8 carbon atoms, a substituted or unsubstituted alkoxy group including 1 to 8 carbon atoms, a substituted or unsubstituted alkyl carbonyl group including 1 to 8 carbon atoms, a substituted or unsubstituted aryl group including 6 to 10 carbon atoms, a substituted or unsubstituted aryloxy group including 6 to 10 carbon atoms, a substituted or unsubstituted arylcarbonyl group including 6 to 10 carbon atoms or a substituted or unsubstituted aralkyl group including 7 to 20 carbon atoms;

n is an integer of 10 to 3000;

$L_1$ is a single bond or a group represented by the following formula (2') or the following formula (3');

$$-L_{11}-L_{12}-L_{13}- \quad (2')$$

wherein in the formula (2'), $L_{11}$ is an alkylene group including 1 to 8 carbon atoms; $L_{12}$ is a single bond, —O— or —S— and $L_{13}$ is a single bond or an alkylene group including 1 to 8 carbon atoms; and $L_{11}$ is bonded to $R_4$;

$$-L_{14}-L_{15}-B-L_{16}- \quad (3')$$

wherein in the formula (3'), $L_{14}$ is a single bond or an alkylene group including 1 to 8 carbon atoms; $L_{15}$ is a single bond, —O— or —S—, B is a substituted or unsubstituted aromatic hydrocarbon ring or a substituted or unsubstituted aromatic heterocyclic ring; $L_{16}$ is a single bond, —O— or —S—, and $L_{14}$ is bonded to $R_4$.

13. The ink composition according to claim 12, wherein the organic semiconductor material is a material for an organic electroluminescence device.

14. The ink composition according to claim 12 that further comprises a solvent.

15. A method for producing an organic semiconductor device, wherein at least one layer of an organic semiconductor device is produced by a wet method by using the ink composition according to claim 12.

16. A display apparatus that is provided with the organic electroluminescence device according to claim 1.

17. The organic electroluminescence device according to claim 1, wherein B is a substituted or unsubstituted aromatic hydrocarbon ring containing 6 to 20 ring carbon atoms or a substituted or unsubstituted aromatic heterocyclic ring containing 5 to 20 ring atoms with 1 to 3 ring atoms selected from a nitrogen atom, an oxygen atom and a sulfur atom.

18. The ink composition according to claim 12, wherein B is a substituted or unsubstituted aromatic hydrocarbon ring containing 6 to 20 ring carbon atoms or a substituted or unsubstituted aromatic heterocyclic ring containing 5 to 20 ring atoms with 1 to 3 ring atoms selected from a nitrogen atom, an oxygen atom and a sulfur atom.

\* \* \* \* \*